United States Patent
Mariyama et al.

(10) Patent No.: US 7,423,298 B2
(45) Date of Patent: Sep. 9, 2008

(54) BIDIRECTIONAL PHOTOTHYRISTOR CHIP, OPTICAL LIGHTING COUPLER, AND SOLID STATE RELAY

(75) Inventors: Mitsuru Mariyama, Katsuragi (JP); Satoshi Nakajima, Katsuragi (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 379 days.

(21) Appl. No.: 11/080,522

(22) Filed: Mar. 16, 2005

(65) Prior Publication Data
US 2006/0027832 A1  Feb. 9, 2006

(30) Foreign Application Priority Data
Mar. 17, 2004  (JP)  ............................. 2004-075900
Feb. 17, 2005  (JP)  ............................. 2005-040675

(51) Int. Cl.
*H01L 29/747*  (2006.01)

(52) U.S. Cl. ............... 257/119; 257/113; 257/E29.211; 257/E29.215; 438/134

(58) Field of Classification Search ..................
257/E29.211–E29.213, E29.215, 119, 113
See application file for complete search history.

(56) References Cited

U.S. PATENT DOCUMENTS 3,832,732 A * 8/1974 Roberts ..................... 257/118
4,244,000 A * 1/1981 Ueda et al. .................. 257/110
4,396,932 A * 8/1983 Alonas et al. ............... 257/110
4,471,372 A * 9/1984 Tihanyi ...................... 257/125
4,586,073 A * 4/1986 Hartman et al. ............ 257/124
6,037,613 A * 3/2000 Mariyama .................. 257/119

FOREIGN PATENT DOCUMENTS

| JP | 63124477 A | * | 5/1988 |
| JP | 05315603 A | * | 11/1993 |
| JP | 8-130324 | | 5/1996 |
| JP | 10-242449 | | 9/1998 |
| JP | 2002-190613 | | 7/2002 |

* cited by examiner

*Primary Examiner*—Jerome Jackson
*Assistant Examiner*—Paul A Budd
(74) *Attorney, Agent, or Firm*—Morrison & Foerster LLP

(57) ABSTRACT

Two operation channels CH1 and CH2 of a bidirectional photothyristor chip 31 are disposed away from each other so as not to intersect with each other. In between a P-gate diffusion region 23 on the left-hand side and a P-gate diffusion region 23' on the right-hand side on an N-type silicon substrate, and in between the CH1 and the CH2, a channel isolation region 29 comprised of an oxygen doped semi-insulating polycrystalline silicon film 35a doped with phosphorus is formed. Consequently, a silicon interface state (Qss) in the vicinity of the channel isolation region 29 on the surface of the N-type silicon substrate increases, so that holes or minority carriers in the N-type silicon substrate are made to disappear in the region. This makes it possible to prevent such commutation failure that when a voltage of the inverted phase is applied to the CH2 side at the point of time when the CH1 is turned off, the CH2 is turned on without incidence of light, and this allows a commutation characteristic to be enhanced.

34 Claims, 31 Drawing Sheets

BIDIRECTIONAL PHOTOTHYRISTOR CHIP, OPTICAL LIGHTING COUPLER, AND SOLID STATE RELAY

BACKGROUND OF THE INVENTION

This nonprovisional application claims priority under 35 U.S.C. §119(a) on Patent Application Nos. 2004-075900 and 2005-040675 filed in Japan on Mar. 17, 2004 and Feb. 17, 2005, respectively, the entire contents of which are hereby incorporated by reference.

The present invention relates to a bidirectional photothyristor chip, a light-triggered coupler with use of the same, and a solid state relay (hereinafter abbreviated to SSR) with use of the light-triggered coupler.

Conventionally, there has been a bidirectional photothyristor with the structure shown in FIG. 35 to FIG. 37. It is to be noted that FIG. 35 is a plane view, FIG. 36 is a cross sectional view taken along an arrow line A-A' of FIG. 35, and FIG. 37 is an equivalent circuit diagram. The bidirectional photothyristor chip 4 is composed of, for example, a CH (channel) 1 photothyristor and a CH2 photothyristor formed on an N-type silicon substrate 1. Such a bidirectional photothyristor chip 4 is widely used for a light-triggered coupler which produces a gate trigger signal through photoirradiation to perform on-off control over the SSR.

It is to be noted that there are shown anode diffusion regions (P type) 5, 5', P-gate diffusion regions (P type) 6, 6', cathode diffusion regions (n type) 7, 7', gate resistances 8, 8', Al electrodes 9, 9' and an Al electrode 10. It is to be noted that an electrode T2 is formed immediately above the Al electrode and is connected to the anode diffusion region 5 and the cathode diffusion region 7 through the Al electrode 9. Similarly, an electrode T1 is formed immediately above the Al electrode 9' and is connected to the anode diffusion region 5' and the cathode diffusion region 7' through the Al electrode 9'. A PNPN section that constitutes a photothyristor 2 of CH1 in FIG. 37 is formed extending from the anode diffusion region 5' on the right-hand side toward the cathode diffusion region 7 on the left-hand side as viewed in the drawing. Moreover, a PNPN section that constitutes a photothyristor 3 of CH2 in FIG. 3 is formed extending from the anode diffusion region 5 on the left-hand side toward the cathode diffusion region 7' on the right-hand side as viewed in the drawing.

FIG. 36 is a cross sectional view of the N-type silicon substrate 1 showing a passivation structure in the bidirectional photothyristor. An $SiO_2$ film 15 is formed over the cathode diffusion region 7 on the left-hand side of the Al interconnection 10 to the anode diffusion region 5' on the right-hand side of the Al interconnection 10 on the N-type silicon substrate 1. Further, an oxygen-doped semi-insulating polycrystalline silicon film 16 is formed on the $SiO_2$ film 15, and further on the oxygen-doped semi-insulating polycrystalline silicon film 16, an SiN film 17 is formed by the chemical vapor deposition method. On the left-hand side, the Al electrode 9 is formed over the SiN film 17 to the P-gate diffusion region 6, and is connected to the electrode T2. On the right-hand side, the Al electrode 9' is formed over the SiN film 17 to the anode diffusion region 5', and is connected to the electrode T1. Further, as shown in FIG. 35, the Al interconnection 10 for separating the left-hand side and the right-hand side of the bidirectional photothyristor as viewed in the drawing is formed on the SiN film 17 over its entire width and is connected to the N-type silicon substrate 1. Thus, both the ends and the center portion of the oxygen-doped polycrystalline silicon film 16 are brought into contact with the Al electrodes 9, 9', 10 to form a potential gradient between the Al electrodes 9, 9' and the Al electrode 10 for alleviating concentration of electric fields on the Si—$SiO_2$ interface. Thus, the field plate structure which advantageously offers high withstand voltages is provided. It is to be noted that reference numeral 18 denotes an N+ layer and reference numeral 19 denotes a depletion layer.

Generally, light-triggered couplers used with an alternating current operates as follows. That is, in FIG. 37, if the potential polarity is more positive on the electrode T1 side than on the electrode T2 side under the condition that alternating voltage higher than the on-state voltage (about 1.5 V) of the device is applied as a bias to between the electrode T1 and the electrodes T2, then an NPN transistor Q2 on the CH1 side is turned on when the bidirectional photothyristor 4 receives a light signal from an LED (Light-Emitting Diode) (unshown). As a result, a base current is extracted from a PNP transistor Q1 on the CH1 side, and the PNP transistor Q1 is turned on. Next, a base current is supplied to the NPN transistor Q2 on the CH1 side by a collector current of the PNP transistor Q1, and the PNPN section on the CH1 side is turned on by positive feedback, as a result of which an on-state current corresponding to the load of an AC circuit flows from the electrode T1 to the electrode T2. In that case, the positive feedback of the PNPN section does not occur on the CH2 side since the bias applying direction is reversed, and only a primary photoelectric current flows. In the next half cycle, if the potential polarity is more positive on the electrode T2 side than on the electrode T1 side, then the PNPN section on the CH2 side is turned on through positive feedback operation in entirely the same way as the above-mentioned case, and only the primary photoelectric current flows on the CH1 side.

Thus, when light is continually received from the LED, the bidirectional photothyristor 4 is turned on. When light is not emitted from the LED, the bidirectional photothyristor 4 is turned off at a holding current value (hereinafter referred to as IH). Thus, the switch function is fulfilled. It is to be noted that the prior art documents regarding the bidirectional photothyristor for use in the light-triggered coupler include, for example, JP H10-242449 A.

However, the conventional bidirectional photothyristor has a following problem. That is, increase in luminous sensitivity to have high sensitivity decreases a commutation characteristic that is noise resistance as well as a dv/dt characteristic which are contradictory to the luminous sensitivity. More particularly, the commutation characteristic and the dv/dt characteristic are in a trade-off relation with the luminous sensitivity, which are the most important design issue in terms of the performance of the bidirectional photothyristor. The dv/dt characteristic herein refers to "critical rate of rise of off-state voltage", and the critical rate of rise of off-state voltage of not lower than 1000 V/µs is required for the bidirectional photothyristor to correctly function as a device.

It is to be noted that in view of equipment in use, high sensitivity leads to control with smaller current to provide advantages that lower power consumption is achieved and that direct driving from a micro computer and the like is available. This high sensitivity is an important characteristic strongly desired by users.

Description is given of the commutation characteristic. With regard to the commutation characteristic in the case of normal operation, as shown in FIG. 38 (vertical cross sectional view showing the entire region including a region along the line A-A' of FIG. 35), if the incidence of light disappears in a half cycle period of the alternating current during which the CH1 is on, then the on-state continues due to the current holding property of the PNPN section during this half cycle period. Then, if a shift to the next half cycle occurs as shown in FIG. 39 (vertical cross sectional view showing the entire region including the anode diffusion region 5 and the cathode diffusion region 7' in FIG. 35), then the CH2 is not turned on unless there is incident light. However, if an inductive load exists in the AC circuit that is subjected to switching, then the phase of the on-state voltage is delayed relatively to the phase of the AC voltage applied to between the electrode T1 and the electrode T2. Therefore, an AC voltage of the inverted phase has already been applied to between the electrode T1 and the electrode T2 at the point of time when the CH1 is turned off. Therefore, a voltage of the inverted phase exhibiting a steep rise is to be applied to the CH2 side at the point of time when the CH1 is turned off.

Because of this reason, holes 11, which remain in the N-type silicon substrate 1 of the bidirectional photothyristor 4, move to the P-gate diffusion region 6' on the side of the photothyristor 3 as indicated by arrow (A) before disappearing to thereby turn on the PNP transistor Q4 on the CH2 side despite no incident light and to promote the positive feedback on the CH2 side, causing malfunction (commutation failure) that the CH2 is turned on.

More particularly, the "commutation characteristic" is the characteristic which expresses a maximum operating current value Icom that can be controlled without causing the commutation failure as described above. There is a trade-off correlation that higher sensitivity decreases the commutation characteristic, and therefore how to increase the commutation characteristic is an issue in pursuit of higher sensitivity.

Meanwhile, in order to prevent the commutation failure, all that is necessary to be done is to suppress the residual holes 11 in the N-type silicon substrate 1 from moving from the side of the photothyristor 2 to the P-gate diffusion region 6' on the side of the photothyristor 3. However, in the conventional bidirectional photothyristor 4 having the structure shown in FIG. 35 to FIG. 37, its passivation structure as described above is the field plate structure in which, as shown in FIG. 36, a potential gradient is formed between the Al electrodes 9, 9' and the Al electrode 10 to alleviate concentration of electric fields on the Si—SiO$_2$ interface so that high withstand voltages are advantageously provided. However, such structure has no direct relation with improvement of the commutation characteristic and therefore fails to suppress the holes 11 which are generated on the side of the photothyristor 2 and remain in the N-type silicon substrate 1 from moving to the P gate diffusion region 6' on the side of the photothyristor 3.

Description is now given of the critical rate of rise of off-state voltage dv/dt characteristic. When a voltage pulse with a steep rise is applied to between the anode diffusion regions 5, 5' and the cathode diffusion regions 7, 7', malfunction that the bidirectional photothyristor 4 is turned on without any light signals occurs. This is because a displacement current flows into the P-gate diffusion regions 6, 6' which are intended to receive a light signal and the displacement current acts as a trigger current. This kind of malfunction tends to occur particularly in the high temperature condition. More particularly, a maximum rate of rise of voltage that does not cause the malfunction is a critical rate of rise of off-state voltage dv/dt. The critical rate of rise of off-state voltage dv/dt characteristic also has a trade-off correlation with the sensitivity that increase in sensitivity decreases the characteristic. More particularly, how to enhance the dv/dt characteristic is also an issue in pursuit of higher sensitivity.

SUMMARY OF THE INVENTION

An object of the present invention is to provide a bidirectional photothyristor chip capable of improving luminous sensitivity as well as a commutation characteristic and a critical rate of rise of off-state voltage dv/dt characteristic which are in a trade-off relation with the luminous sensitivity.

In order to solve the problem, the present invention provides a bidirectional photothyristor chip being one semiconductor chip, comprising:

a substrate of a first conductive type;

a pair of photothyristor sections each of which is provided on a surface of the substrate of the first conductive type and each of which includes a first diffusion layer of a second conductive type, a second diffusion layer of the second conductive type and a third diffusion layer of the first conductive type formed in the second diffusion layer, wherein one of the pair of the photothyristor sections is disposed on one side of the semiconductor chip while the other of the pair of the photothyristor sections is disposed on the other side of the semiconductor chip, the first diffusion layer constituting part of the one photothyristor section is opposed to the second diffusion layer and the third diffusion layer constituting part of the other photothyristor section, the first diffusion layer constituting part of the other photothyristor section is opposed to the second diffusion layer and the third diffusion layer constituting part of the one photothyristor section, two channels generated between the pair of the photothyristor sections do not intersect with each other but are parallel to each other, and a carrier movement suppression region for suppressing carriers from moving is formed between two of the second diffusion layers constituting part of the pair of the photothyristor sections on the substrate.

According to the structure, in a half cycle period of AC current to be applied, the carriers which generates in the substrate when one of a pair of the two channels is turned on by a light signal and which remain therein are suppressed from moving by the carrier movement suppression region formed in between two second diffusion layers constituting part of each of the two photothyristor sections. As a result, it is prevented in the next half cycle that the residual carriers in the substrate move to the second diffusion layer in the photothyristor section constituting part of the other channel by which the other channel is turned on despite the absence of light incidence. Therefore, malfunction due to the commutation failure can be reduced and the commutation characteristic can be enhanced.

The first conductive type or the second conductive type herein refer to an N type or a P type, and if the first conductive type is the N type, the second conductive type is the P type, whereas if the first conductive type is the P type, the second conductive type is the N type.

In one embodiment, the carrier movement suppression region includes an oxygen doped semi-insulating polycrystalline silicon film doped with phosphorus, and the oxygen doped semi-insulating polycrystalline silicon film doped with phosphorus is electrically connected to the substrate through an Al electrode.

According to the embodiment, in the case where the first conductive type is the N type, the second conductive type is the P type and the substrate is a silicon substrate, the silicon interface state (Qss) of the carrier movement suppression region on the surface of the N-type silicon substrate increases. As a result, the holes which are minority carriers in the N-type silicon substrate may be vanished in the region of the oxygen doped semi-insulating polycrystalline silicon film doped with phosphorus, and so the reduction in life time of the holes may be promoted. Therefore, the commutation characteristic can be enhanced as a result.

In one embodiment, the carrier movement suppression region further includes a carrier absorption diode formed on the surface of the substrate.

According to the embodiment, the holes which are minority carriers in the N-type silicon substrate are absorbed by the P-type diffusion region constituting part of the carrier absorption diode, and the lifetime of the holes are reduced. Therefore, in conjunction with the effect by the oxygen doped semi-insulating polycrystalline silicon film doped with phosphorus, the commutation characteristic may be enhanced more reliably.

In one embodiment, the carrier absorption diode has an outer diameter smaller than an outer diameter of the oxygen doped semi-insulating polycrystalline silicon film doped with phosphorus, and a side of the carrier absorption diode opposed from the substrate is electrically connected to the substrate through the Al electrode.

According to the embodiment, a region in which the silicon interface state Qss increases due to the presence of the oxygen doped semi-insulating polycrystalline silicon film doped with phosphorus can be formed on the surface of the N-type silicon substrate. This allows effective fulfillment of the effect by the carrier absorption diode and the effect by the oxygen doped semi-insulating polycrystalline silicon film doped with phosphorus.

In one embodiment, either one of intervals between a first electrode electrically connected to the first diffusion layer and the carrier movement suppression region and between a second electrode electrically connected to the third diffusion layer and the carrier movement suppression region, whichever is shorter, is at least 30 μm.

According to the embodiment, the structure of the carrier movement suppression region allows 400V or higher withstand voltages.

In one embodiment, the carrier movement suppression region is formed between the two channels in such a way as to avoid intersection with each channel.

According to the embodiment, with the carrier movement suppression region with a small region area, the residual carriers in the substrate may be suppressed from moving to the second diffusion layer in the photothyristor section constituting the off-side channel, by which the commutation characteristic may be enhanced.

In one embodiment, the carrier movement suppression region intersects with each of the two channels.

According to the embodiment, by the carrier movement suppression region, which is formed so as to intersect with each of the two channels and which includes the oxygen doped semi-insulating polycrystalline silicon film doped with phosphorus and the Al electrode, a displacement current is suppressed from flowing into the second diffusion region which is intended to receive a light signal when a voltage pulse with a steep rise is applied to between the first diffusion region and the third diffusion region. As a result, the photothyristor section is prevented from being turned on even without any light signals, and therefore the dv/dt characteristic may be enhanced.

In one embodiment, either one of intervals between a first electrode electrically connected to the first diffusion layer and the carrier movement suppression region and between a second electrode electrically connected to the third diffusion layer and the carrier movement suppression region, whichever is shorter, is at least 30 μm.

According to the embodiment, the structure of the carrier movement suppression region intersecting with each of the two channels allows 400V or higher withstand voltages.

In one embodiment, the carrier movement suppression region intersects with each of the two channels.

According to the embodiment, by the carrier movement suppression region, which is formed so as to intersect with each of the two channels and which includes the oxygen doped semi-insulating polycrystalline silicon film doped with phosphorus and the Al electrode, a displacement current is suppressed from flowing into the second diffusion region which is intended to receive a light signal when a voltage pulse with a steep rise is applied to between the first diffusion region and the third diffusion region. As a result, the photothyristor section is prevented from being turned on even without any light signals, and therefore the dv/dt characteristic may be enhanced.

In one embodiment, either one of intervals between a first electrode electrically connected to the first diffusion layer and the carrier movement suppression region and between a second electrode electrically connected to the third diffusion layer and the carrier movement suppression region, whichever is shorter, is at least 30 μm.

According to the embodiment, the structure of the carrier movement suppression region including the carrier absorption diode and intersecting with each of the two channels allows 400V or higher withstand voltages.

In one embodiment, the carrier absorption diode has an outer diameter smaller than an outer diameter of the oxygen doped semi-insulating polycrystalline silicon film doped with phosphorus, and a side of the carrier absorption diode opposed from the substrate is electrically connected to the substrate through the Al electrode.

According to the embodiment, a region in which the silicon interface state Qss increases due to the presence of the oxygen doped semi-insulating polycrystalline silicon film doped with phosphorus can be formed on the surface of the N-type silicon substrate. This allows effective fulfillment of the effect by the carrier absorption diode and the effect by the oxygen doped semi-insulating polycrystalline silicon film doped with phosphorus.

Moreover, the present invention provides a bidirectional photothyristor chip being one semiconductor chip, comprising:

a substrate of a first conductive type;

a pair of photothyristor sections each of which is provided on a surface of the substrate of the first conductive type and each of which includes a first diffusion layer of a second conductive type, a second diffusion layer of the second conductive type and a third diffusion layer of the first conductive type formed in the second diffusion layer, wherein one of the pair of the photothyristor sections is disposed on one side of the semiconductor chip while the other of the pair of the photothyristor sections is disposed on the other side of the semiconductor chip, the first diffusion layer constituting part of the one photothyristor section is opposed to the second diffusion layer and the third diffusion layer constituting part of the other photothyristor section, the first diffusion layer constituting part of the other photothyristor is opposed to the second diffusion layer and the third diffusion layer constituting part of the one photothyristor section, two channels generated between the pair of the photothyristor sections do not intersect with each other but are parallel to each other, and an oxygen doped semi-insulating polycrystalline silicon film doped with phosphorus for suppressing carriers from moving is formed on the substrate and in a vicinity of junctions between the two first diffusion layers constituting part of the pair of the photothyristor sections and the substrate and in a vicinity of junctions of the two second diffusion layers constituting part of the pair of the photothyristor sections and the substrate in such a way as to intersect with the channels.

According to the structure, the residual carriers in the substrate is suppressed from moving to the second diffusion layer of the channel which should turn on next by the oxygen doped semi-insulating polycrystalline silicon film doped with phosphorus formed in between the two second diffusion layers constituting part of the two photothyristor sections. As a result, the channel is prevented from being turned on even without any light signals in the next half cycle, and therefore the commutation characteristic may be enhanced.

Further, by the oxygen doped semi-insulating polycrystalline silicon film doped with phosphorus, which is formed so as to intersect with each of the two channels, a displacement current is suppressed from flowing into the second diffusion region when a voltage pulse with a steep rise is applied to between the first diffusion region and the third diffusion region. As a result, the photothyristor section is prevented from being turned on even without any light signals, and therefore the dv/dt characteristic may be enhanced.

A bidirectional photothyristor chip of one embodiment further comprises an Al guard ring which is formed from Al in between the pair of the two photothyristor sections in such a way as to intersect with each of the two channels and which is electrically connected to the substrate; wherein an interval between the oxygen doped semi-insulating polycrystalline silicon film doped with phosphorus and the Al guard ring is at least 30 µm.

According to the embodiment, the structure of the oxygen doped semi-insulating polycrystalline silicon film doped with phosphorus allows 400V or higher withstand voltages.

Moreover, the present invention provides a bidirectional photothyristor chip being one semiconductor chip, comprising:

a substrate of a first conductive type;

a pair of photothyristor sections each of which is provided on a surface of the substrate of the first conductive type and each of which includes a first diffusion layer of a second conductive type, a second diffusion layer of the second conductive type and a third diffusion layer of the first conductive type formed in the second diffusion layer, wherein one of the pair of the photothyristor sections is disposed on one side of the semiconductor chip while the other of the pair of the photothyristor sections is disposed on the other side of the semiconductor chip, the first diffusion layer constituting part of the one photothyristor section is opposed to the second diffusion layer and the third diffusion layer constituting part of the other photothyristor section, the first diffusion layer constituting part of the other photothyristor is opposed to the second diffusion layer and the third diffusion layer constituting part of the one photothyristor section, two channels generated between the pair of the photothyristor sections do not intersect with each other but are parallel to each other, and an oxygen doped semi-insulating polycrystalline silicon film doped with phosphorus for suppressing carriers from moving is formed on the substrate in between the two second diffusion layers constituting part of the pair of the photothyristor sections and in between the two channels in a vicinity of each junction between the two first diffusion layers and the substrate in such a way as not to intersect with each channel.

According to the structure, the residual carriers in the substrate is suppressed from moving to the second diffusion layer of the channel which should turn on next by the oxygen doped semi-insulating polycrystalline silicon film doped with phosphorus formed in between the two second diffusion layers constituting the two photothyristor sections. As a result, the channel is prevented from being turned on even without any light signals in the next half cycle, and therefore the commutation characteristic may be enhanced.

In one embodiment, either one of intervals between a first electrode electrically connected to the first diffusion layer and the oxygen doped semi-insulating polycrystalline silicon film doped with phosphorus and between a second electrode electrically connected to the third diffusion layer and the oxygen doped semi-insulating polycrystalline silicon film doped with phosphorus, whichever is shorter, is at least 30 µm, and an interval between the two oxygen doped semi-insulating polycrystalline silicon films doped with phosphorus is at least 30 µm.

According to the embodiment, the structure of the oxygen doped semi-insulating polycrystalline silicon film doped with phosphorus allows 400V or higher withstand voltages.

In one embodiment, a transparent guard ring comprised of an oxygen doped semi-insulating polycrystalline silicon film doped with phosphorus is formed in an annular region including a vicinity of a junction between the first diffusion layer and the substrate and a vicinity of a junction between the second diffusion layer and the substrate and surrounding the first diffusion layer and the second diffusion layer respectively in the pair of the photothyristor sections on the substrate.

According to the embodiment, the transparent guard ring is formed in the annular region surrounding the first diffusion layer and the second diffusion layer. This makes it possible to decrease a light shielding area of the region surrounding the first diffusion layer and the second diffusion layer, and thereby enhance luminous sensitivity.

One embodiment further comprises a Schottky barrier diode formed between the second diffusion layer constituting part of each of the photothyristor sections and the substrate.

According to the embodiment, injection of minority carriers (holes) from the second diffusion layer of the photothyristor section constituting the turned-on channel to the N-type substrate at the time of commutation is suppressed by the Schottky barrier diode. This reduces a residual carrier amount in the substrate and allows further enhancement of the commutation characteristic.

In one embodiment, the first conductive type is one out of N type and P type, the second conductive type is the other out of N type and P type, in each of the photothyristor sections, a gate resistance and a switching element are connected in parallel in between a base and an emitter electrode of an NPN transistor made up of the third diffusion region, the second diffusion region and the substrate, or the first diffusion region, the substrate and the second diffusion region, a control terminal of the switching element is connected to a base of the PNP transistor made up of the third diffusion region, the second diffusion region and the substrate, or the first diffusion region, the substrate and the second diffusion region.

According to the embodiment, in the vicinity of a zero crossover point of a supply voltage applied as a bias to between the emitter electrode of the PNP transistor and the emitter electrode of the NPN transistor, the switching element is turned off and a base-emitter voltage according to a value of resistance of the gate resistance is applied to the NPN transistor. In a time point away from the zero crossover point of the supply voltage, the switching element is turned on and so a base and an emitter of the NPN transistor is short-circuited, which disables the NPN transistor from being turned on by reception of a light signal.

Thus, a zero crossing function to turn on the photothyristor section only in the vicinity of the zero crossover point of the supply voltage is realized.

In one embodiment, the switching element is a metal-oxide semiconductor field-effect transistor, the metal-oxide semiconductor field-effect transistor is formed in a well of the second conductive type formed on the surface of the substrate, and a diffusion depth of the well is larger than a diffusion depth of the second diffusion layer.

According to the embodiment, a current amplification factor of a parasitic transistor, which is formed from a drain diffusion region of the metal-oxide semiconductor field-effect transistor, the well and the substrate, can be decreased lower than that in the case of the normal bidirectional thyristor chip with a zero crossing function having the well smaller in the diffusion depth than the second diffusion layer. Therefore, it becomes possible to suppress amplification of a displacement current transiently flowing into the parasitic transistor through a junction capacitance between the well and the substrate in the case where a pulsed noise voltage is applied to the photothyristor section.

More particularly, it becomes possible to suppress the displacement current which has conventionally been amplified by the parasitic transistor and functioned as a trigger current, and thereby it becomes possible to increase the pulse noise withstand level which is a maximum value of the pulsed noise voltage at which the photothyristor section can operate normally.

In one embodiment, the diffusion depth of the well is not less than one time and not more than 1.3 times as large as the diffusion depth of the second diffusion layer.

According to the embodiment, the diffusion depth of the well is not more than 1.3 times as large as the diffusion depth of the second diffusion layer. This eliminates the necessity of excessively increase the diffusion temperature or the diffusion time for forming the well, and thereby makes it possible to easily have an effect of suppressing the current amplification factor in the parasitic transistor.

In one embodiment, the switching element is a metal-oxide semiconductor field-effect transistor, the metal-oxide semiconductor field-effect transistor is formed in a well of the second conductive type formed on the surface of the substrate, and an area of a drain diffusion region formed in the well in the metal-oxide semiconductor field-effect transistor is smaller than an area of a source diffusion region formed in the well.

According to the embodiment, the emitter area of the parasitic transistor can be reduced so as to reduce a collector current of the parasitic transistor. Consequently, it becomes possible to increase a ratio of part of the displacement current split into the source diffusion region of the metal-oxide semiconductor field-effect transistor so that the displacement current can flow into the source diffusion region easily. More particularly, it becomes possible to decrease an influence of the current amplification factor of the parasitic transistor on the displacement current so as to increase the pulse noise withstand level.

In one embodiment, the drain diffusion region is formed in a surface side of the well, and the source diffusion region is formed in the surface side of the well in such a way as to surround the drain diffusion region.

According to the embodiment, the source diffusion region increases an area ratio to the drain diffusion region and is formed so as to surround the drain diffusion region. Therefore, a ratio of part of the displacement current split into the source diffusion region can be increased considerably. As a result, it becomes possible to decrease an effect of the current amplification factor of the parasitic transistor on the displacement current so as to increase the pulse noise withstand level.

In one embodiment, the switching element is a metal-oxide semiconductor field-effect transistor, at least a part of the metal-oxide semiconductor field-effect transistor is formed in a well of the second conductive type formed on the surface of the substrate, a heavily-doped compensation diffusion layer of the second conductive type coming into a close contact with the well and having a dopant diffusion concentration level heavier than a dopant diffusion concentration level in the well is formed around the well on the surface of the substrate, and a region of the metal-oxide semiconductor field-effect transistor, which is not formed in the well, is formed in the heavily-doped compensation diffusion layer.

According to the embodiment, the heavily-doped compensation diffusion layer is formed around the well in the state of being in a close contact with the well. Consequently, a resistance value of a series resistance connected to the base of the parasitic transistor can be decreased, and so a ratio of part of the displacement current divided to a route traveling through the well and the source diffusion region can be increased. As a result, an influence of the current amplification factor of the parasitic transistor on the displacement current can be reduced to increase the pulse noise withstand level.

In one embodiment, the dopant diffusion concentration level in the heavily-doped compensation diffusion layer is not less than $1 \times 10^{17}$ cm$^{-3}$.

According to the embodiment, the surface dopant level of the well can sufficiently be compensated in the case where the dopant level of the well is $5 \times 10^{16}$ cm$^{-3}$.

In one embodiment, the source diffusion region in the metal-oxide semiconductor field-effect transistor is formed in the well, and one side portion of the drain diffusion region in the metal-oxide semiconductor field-effect transistor opposed to the source diffusion region is formed in the well, whereas a remaining region thereof is formed in the heavily-doped compensation diffusion layer.

According to the embodiment, by narrowing the base region in the parasitic transistor formed from the drain diffusion region of the metal-oxide semiconductor field-effect transistor, the well and the substrate, the collector current of the parasitic transistor can be reduced. Therefore, an influence of the current amplification factor of the parasitic transistor on the displacement current can be reduced to increase the pulse noise withstand level.

In one embodiment, the drain diffusion region in the metal-oxide semiconductor field-effect transistor is formed in the well, and one side portion of the source diffusion region in the metal-oxide semiconductor field-effect transistor opposed to the drain diffusion region is formed in the well, whereas a remaining region thereof is formed in the heavily-doped compensation diffusion layer.

According to the embodiment, the heavily-doped compensation diffusion layer is formed around the well in the state of being in a close contact with the well. Further, a part of the source diffusion region is formed in the heavily-doped compensation diffusion layer. Consequently, a resistance value of the series resistance connected to the base of the parasitic transistor can be further decreased, and so a ratio of part of the displacement current divided to a route traveling through the well and the source diffusion region can be further increased.

In one embodiment, a channel-direction length of the one side portion of the drain diffusion region or the source diffusion region formed in the well is more than 0 μm and not more than 10 μm.

According to the embodiment, the width of the one side portion is set at not more than 10 μm, which makes it possible to have the effect of the heavily-doped compensation diffusion layer formed in the state of being in a close contact with the periphery of the well. Further, since the width of the one side portion is set at more than 0 μm, the channel dopant concentration level of the metal-oxide semiconductor field-effect transistor (i.e., a threshold voltage of the metal-oxide semiconductor field-effect transistor) is not influenced.

In one embodiment, a channel width in the metal-oxide semiconductor field-effect transistor is not less than 300 μm.

According to the embodiment, by lengthening the channel width of the metal-oxide semiconductor field-effect transistor, on-resistance may be decreased. Consequently, the metal-oxide semiconductor field-effect transistor becomes operable even when the pulsed noise voltage is applied to the photothyristor section, which allows further increase in the pulse noise withstand level.

In one embodiment, a carrier absorption diode is formed on the surface of the substrate in such a way as to intersect with the two channels.

According to the embodiment, in the case where the first conductive type is N type, the second conductive type is P type and the substrate is a silicon substrate, holes which are minority carriers in the N-type silicon substrate are absorbed in a P-type diffusion region constituting part of the carrier absorption diode, by which the lifetime of the holes is shortened. Consequently, the current amplification factor of the PNP transistor formed from the well, the N-type silicon substrate and the second diffusion layer can be reduced. As a result, increasing a resistance value of the gate resistance allows the current amplification factor of the NPN transistor, which is formed from the third diffusion layer, the second diffusion layer and the N-type silicon substrate and exerts the largest influence on the noise characteristic, to be set at a value which can offer a desired noise resistance, and allows luminous sensitivity and high-speed operation necessary for the bidirectional photothyristor with zero crossing function to be maintained.

A light-triggered coupler of the present invention comprises the bidirectional photothyristor chip and a light-emitting diode.

According to the constitution, a light-triggered coupler is structured with use of the bidirectional photothyristor chip capable of enhancing the commutation characteristic. Therefore, the light-triggered coupler with less malfunctions and without commutation failures can be provided. Particularly, when the light-triggered coupler is structured with use of the bidirectional photothyristor chip having the oxygen doped semi-insulating polycrystalline silicon film doped with phosphorus formed in the vicinity of junctions between the respective two first diffusion layers and the substrate and in the vicinity of junctions between the respective two second diffusion layers and the substrate in such a way as to intersect with the channels, the dv/dt characteristic can be further enhanced, thereby making it possible to provide the light-triggered coupler with less malfunctions.

A solid state relay of the present invention comprises the light-triggered coupler and a snubber circuit.

According to the constitution, as the light-triggered coupler which is free from commutation failures and has less malfunctions is used, a solid state relay with less malfunctions can be provided. Particularly, when the light-triggered coupler is structured with use of a bidirectional photothyristor chip having an oxygen doped semi-insulating polycrystalline silicon film doped with phosphorus formed in the vicinity of junctions between the two first diffusion layers and the substrate and in the vicinity of junctions between the two second diffusion layers and the substrate in such a way as to intersect with the channels, the dv/dt characteristic of the bidirectional photothyristor chip can be further enhanced, thereby making it possible to provide the solid state relay with further less malfunctions.

As is clear from the above description, the bidirectional photothyristor chip of the present invention has a carrier movement suppression region for suppressing carriers from moving, the region formed in between the two diffusion layers respectively constituting part of each of two photothyristor sections on the substrate, which makes it possible to suppress residual carriers in the substrate from moving to the second diffusion layer in the photothyristor section constituting a channel which should be turned on next. Therefore, it becomes possible to prevent the channel to be turned on without incidence of light, thereby allowing enhancement of the commutation characteristic.

Moreover, the bidirectional photothyristor chip of the present invention has an oxygen doped semi-insulating polycrystalline silicon film doped with phosphorus formed on the substrate in the vicinity of junctions between the two first diffusion layers constituting part of a pair of the photothyristor sections and the substrate and in the vicinity of junctions between the two second diffusion layers constituting part of a pair of the photothyristor sections and the substrate in such a way as to intersect with the channels, so that in the case where the first conductive type is N type, the second conductive type is P type, and the substrate is a silicon substrate, the silicon interface state Qss in the region of the oxygen doped semi-insulating polycrystalline silicon film doped with phosphorus on the surface of the N-type silicon substrate can be increased. Therefore, the minority carriers in the N-type silicon substrate are made disappeared to reduce the lifetime of the holes, by which the commutation characteristic can be enhanced.

Further, in the case where a voltage pulse is applied to between the first diffusion layer and the third diffusion region, a displacement current can be prevented from flowing into the second diffusion layer. Therefore, it becomes possible to prevent the photothyristor section to be turned on without incidence of light, thereby allowing enhancement of the dv/dt characteristic.

Moreover, the bidirectional photothyristor chip of the present invention has an oxygen doped semi-insulating polycrystalline silicon film doped with phosphorus formed on the substrate in between the two second diffusion layers constituting part of a pair of the photothyristor sections and in between the two channels in a vicinity of each junction between the two first diffusion layers and the substrate, so that in the case where the first conductive type is N type, the second conductive type is P type, and the substrate is a silicon substrate, the silicon interface state Qss in the region of the oxygen doped semi-insulating polycrystalline silicon film doped with phosphorus on the surface of the N-type silicon substrate can be increased. Therefore, the minority carriers in the N-type silicon substrate are made disappeared to reduce the lifetime of the holes, by which the commutation characteristic can be enhanced.

Further, if a transparent guard ring is formed in an annular region surrounding the first diffusion layer and the second diffusion layer in each of the photothyristor sections, it becomes possible to decrease a light shielding area of the region surrounding the first diffusion layer and the second diffusion layer, and thereby enhance luminous sensitivity.

Moreover, if in each of the photothyristor sections, a gate resistance and a switching element are connected in parallel in between a base and an emitter electrode of an NPN transistor made up of the third diffusion region, the second diffusion region and the substrate, or the first diffusion region, the substrate and the second diffusion region, the switching element is composed of a MOSFET formed in a well of the second conductive type, and the well diffusion depth is set larger than the diffusion depth of the second diffusion layer, it becomes possible to provide the bidirectional photothyristor having zero crossing function in which amplification of a displacement current due to a parasitic transistor formed in the MOSFET is suppressed and the pulse noise withstand level is increased.

Moreover, since the light-triggered coupler of the present invention is composed of the bidirectional photothyristor chip with enhanced commutation characteristic of the present invention and a light-emitting diode, it becomes possible to provide a light-triggered coupler free from commutation failures and having less malfunctions. Particularly, with use of the bidirectional photothyristor chip allowing enhancement of the dv/dt characteristic, it becomes possible to provide a light-triggered coupler with further less malfunctions.

Moreover, since the solid state relay of the present invention is composed of the light-triggered coupler with less commutation failures of the present invention and a snubber circuit, it becomes possible to provide a solid state relay with less malfunctions. Particularly, in the case of using the light-triggered coupler constituted of the bidirectional photothyristor chip allowing improvement of the dv/dt characteristic, it becomes possible to provide a solid state relay with further less malfunctions.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Hereinbelow, the present invention will be described in detail in conjunction with the embodiments with reference to the drawings.

First Embodiment

Figure 1:
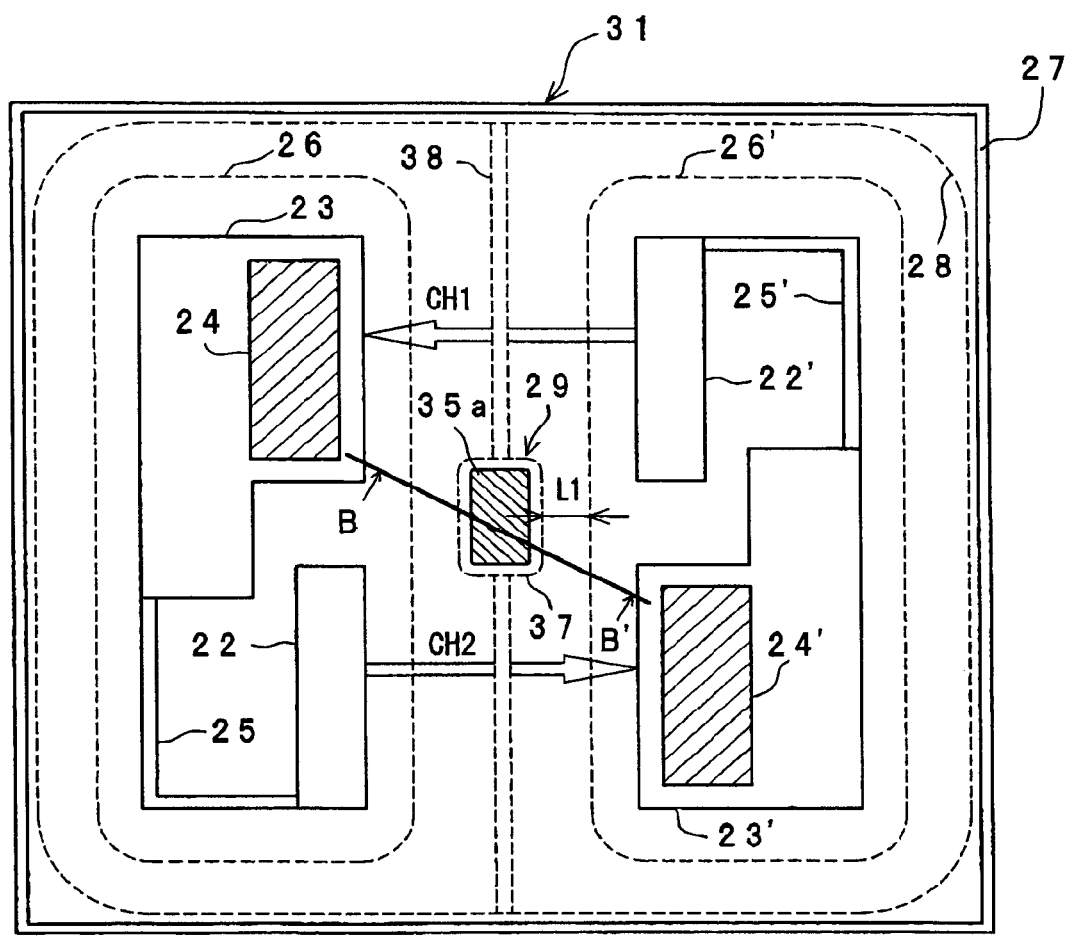
FIG. 1 is a pattern layout view showing a bidirectional photothyristor chip of the present invention.
Figure 2:
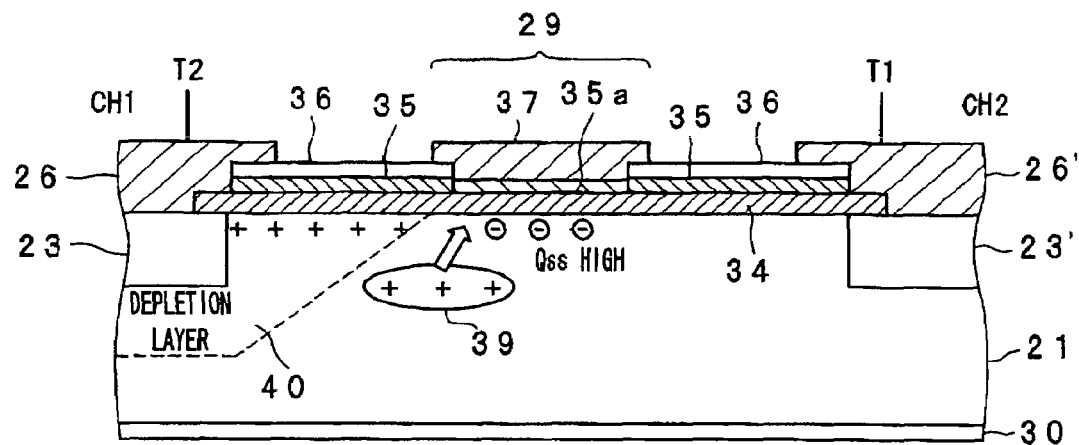
FIG. 2 is a cross sectional view taken along an arrow line B-B' in FIG. 1.
Figure 3:
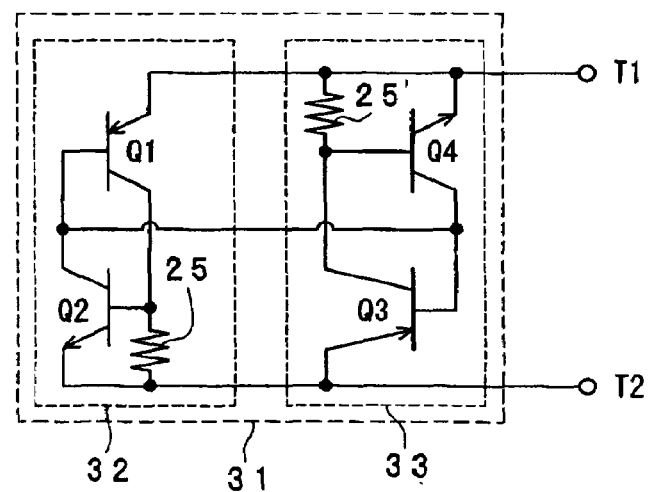
FIG. 3 is an equivalent circuit view showing the bidirectional photothyristor chip shown in FIG. 1.

FIG. 1 is a pattern layout view showing the schematic structure of a bidirectional photothyristor chip of the present embodiment. FIG. 2 is a cross sectional view taken along an arrow line B-B' in FIG. 1. FIG. 3 is an equivalent circuit view showing the bidirectional photothyristor chip of the present embodiment. It is to be noted that the equivalent circuit view is the same as that of a conventional bidirectional photothyristor chip shown in FIG. 36.

In the bidirectional photothyristor chip 31, two anode diffusion regions (P type) 22, 22' are disposed on the surface side of an N-type silicon substrate 21 at positions symmetric with respect to a point of the center of the bidirectional photothyristor chip 31 in such a way that the anode diffusion region 22 is positioned on the left-hand side and the anode diffusion region 22' is positioned on the right-hand side in FIG. 1. Moreover, two P-gate diffusion regions (P type) 23, 23' are disposed at positions symmetric with respect to the point of the center in such a way that the P-gate diffusion region 23 is positioned on the left-hand side and the P-gate diffusion region 23' is positioned on the right-hand side. The anode diffusion region 22 and the P-gate diffusion region 23' are arranged so as to face each other, while the anode diffusion region 22' and the P-gate diffusion region 23 are arranged so as to face each other. Cathode diffusion regions (N type) 24, 24' are provided on the side of the anode diffusion regions 22, 22' in the respective P-gate diffusion regions 23, 23'. Thus, from the anode diffusion region 22' on the right-hand side as viewed in the drawing toward the cathode diffusion region 24 on the left-hand side, a PNPN section constituting a CH1 photothyristor 32 in FIG. 3 is formed. Further, from the anode diffusion region 22 on the left-hand side as viewed in the drawing toward the cathode diffusion region 24' on the right-hand side, a PNPN section constituting a CH2 photothyristor 33 is formed. More particularly, two operation channels CH1 and CH2 are disposed away from each other so as not to intersect with each other. The anode diffusion region 22 and the P-gate diffusion region 23 are connected via a gate resistance 25, while the anode diffusion region 22' and the P-gate diffusion region 23' are connected via a gate resistance 25'.

The N-type dopant level in the N-type silicon substrate 21 is about $10^{14}$ cm$^{-3}$, the P-type dopant level in the P-gate diffusion regions 23, 23' is about $10^{16}$ cm$^{-3}$ to $10^{18}$ cm$^{-3}$, and the N-type dopant level in the cathode diffusion regions 24, 24' is about $10^{20}$ cm$^{-3}$ to $10^{21}$ cm$^{-3}$.

It is to be noted that an electrode T2 is formed immediately above an Al electrode 26 and is connected to the anode diffusion region 22 and the cathode diffusion region 24 via the Al electrode 26. An electrode T1 is formed immediately above an Al electrode 26' and is connected to the anode diffusion region 22' and the cathode diffusion region 24' via the Al electrode 26'. The anode diffusion region 22' on the right-hand side, the N-type silicon substrate 21 and the P-gate diffusion region 23 on the left-hand side constitute a CH1-side PNP transistor Q1, while the cathode diffusion region 24 on the left-hand side, the P-gate diffusion region 23 and the N-type silicon substrate 21 constitute a CH1-side NPN transistor Q2. On the other hand, the anode diffusion region 22 on the left-hand side, the N-type silicon substrate 21 and the P-gate diffusion region 23' on the right-hand side constitute a CH2-side PNP transistor Q3, while the cathode diffusion region 24' on the right-hand side, the P-gate diffusion region 23' and the N-type silicon substrate 21 constitute a CH2-side NPN transistor Q4.

An N-type diffusion region 27 as a channel stopper is formed along the periphery of the chip. On the surface of the N-type silicon substrate 21, an SiO$_2$ film (unshown) is formed to obtain isolation between the Al electrodes 26 and 26' where necessary. Moreover, an Al electrode 28 is formed on the SiO$_2$ film on the N-type silicon substrate 21 as shown by a broken line.

In the present embodiment, a channel isolation region 29 is formed on the N-type silicon substrate 21 in between the P-gate diffusion region 23 on the left-hand side and the P-gate diffusion region 23' on the right-hand side and in between the CH1 and the CH2. Holes or minority carriers in the N-type silicon substrate 21 are absorbed in the channel isolation region 29 at the time of commutation so as to restrict movement between the channels.

Moreover, phosphorus is heavily-doped and diffused on the back surface of the N-type silicon substrate 21 at the same time as cathode diffusion to form an N+ layer 30 as shown in FIG. 2. Thus, by forming the heavily-doped (e.g., about $10^{16}$ cm$^{-3}$) N+ layer 30 on the back surface of the N-type silicon substrate 21, reflection of carriers occurs in the N+ layer 30 and luminous sensitivity increases by the so-called BSF (Back Surface Field) effect such that an equivalent lifetime is increased. However, this phenomenon is disadvantageous for the commutation characteristic since a current amplification factor Hfe (pnp) of the PNP transistor increases and a holding current value IH decreases. It is to be noted that if, instead of this structure, the back surface of the N-type silicon substrate 21 is made to remain N− (left intact as the N-type substrate), then the carriers easily recombine in the back surface of the N-type silicon substrate 21, and therefore, the equivalent lifetime is reduced.

The latter is advantageous in terms of the commutation characteristic since the equivalent lifetime is small in the constant designing stage of the equivalent circuit of the photothyristor as shown in FIG. 3, whereas the current amplification factor Hfe (pnp) decreases and thereby the luminous sensitivity is degraded. In order to make compensation for this, it is required to increase the gate resistances 25, 25' and the current amplification factor Hfe (npn) of the NPN transistor in the constant designing stage of the circuit, and this degrades a critical rate of rise of off-state voltage dv/dt, posing a problem that the principal characteristic of the device is not satisfied. It is to be noted that the critical rate of rise of off-state voltage dv/dt characteristic also depends on the lifetime of the N-type silicon substrate 21, so that (i) in the case where the back surface is N−, the hole lifetime $\tau_p$ is small, and the diffusion capacitance of the anode diffusion regions 22, 22' is reduced, consequently increasing the operative response speed of the PNP transistor and reducing the critical rate of rise of off-state voltage dv/dt. (ii) In the case where the back surface is $N^+$, the hole lifetime $\tau_p$ is large, and the diffusion capacitance of the anode diffusion regions 22, 22' is increased, consequently reducing the operative response speed of the PNP transistor and increasing the critical rate of rise of off-state voltage dv/dt.

Accordingly, in order to satisfy the trade-off relation between this commutation characteristic and the critical rate of rise of off-state voltage dv/dt characteristic, it is required to optimize the phosphorus dopant level in the back surface of the N-type silicon substrate 21 to set the characteristic of the current amplification factor Hfe (pnp) of the PNP transistor to an arbitrary circuit constant.

FIG. 2 is a cross sectional view showing the vicinity of the channel isolation region 29 showing the passivation structure of the present embodiment. In FIG. 2, over the left-hand side (i.e., CH1 side) and the right-hand side (i.e., CH2 side) of the channel isolation region 29 on the N-type silicon substrate 21, a $SiO_2$ film 34 is formed over the P-gate diffusion region 23 on the CH1 side and the P-gate diffusion region 23' on the CH2 side. Further on the $SiO_2$ film 34, an oxygen doped semi-insulating polycrystalline silicon film 35 is formed, and a region 35a of the oxygen doped semi-insulating polycrystalline silicon film 35 in the vicinity of the channel isolation region 29 is doped with phosphorus. Thus, the silicon interface state (Qss) of the channel isolation region 29 on the surface of the N-type silicon substrate 21 increases.

Further, a SiN film 36 is formed, by chemical vapor deposition, on the region of the oxygen doped semi-insulating polycrystalline silicon film 35 doped with phosphorus. Then, on the CH1 side, an Al electrode 26 is formed over part of the SiN film 36 and the P-gate diffusion region 23, and is connected to the electrode T2. On the CH2 side, an Al electrode 26' is formed over part of the SiN film 36 and the P-gate diffusion region 23', and is connected to the electrode T1. Further, on the region 35a of the oxygen doped semi-insulating polycrystalline silicon film 35 doped with phosphorus, an Al electrode 37 is formed over the SiN film 36 on the CH1 side and the SiN film 36 on the CH2 side, and is connected to the N-type silicon substrate 21. Thus, both the ends and the center portion of the oxygen doped semi-insulating polycrystalline silicon film 35 are brought into contact with the Al electrodes 26, 26' and the Al electrode 37 to form a potential gradient between the Al electrodes 26, 26' and the Al electrode 37 for alleviating concentration of electric fields on the $Si\text{—}SiO_2$ interface. Thus, a field plate structure that is advantageously able to have high withstand voltages is provided. It is to be noted that in FIG. 1, both the ends of the Al electrode 37 extend across the CH1 and the CH2 along the entire width of the chip and constitutes an Al guard ring 38.

Thus, the structure of the channel isolation region 29 in the present embodiment is constituted of the oxygen doped semi-insulating polycrystalline silicon film doped with phosphorus 35a formed on the N-type silicon substrate 21. By doping phosphorus in the oxygen doped semi-insulating polycrystalline silicon film, the interface state in the oxygen doped semi-insulating polycrystalline silicon film increases and as a result, the silicon interface state (Qss) increases. Therefore, holes 39 or minority carriers in the N-type silicon substrate 21 are made to disappear in the channel isolation region 29, thereby making it possible to promote reduction in the lifetime of the holes 39. It is to be noted that reference numeral 40 denotes a depletion layer.

It is to be noted that in the present embodiment, a value of the interval L1 between the Al electrode 37 and the Al electrodes 26, 26' shown in FIG. 1 is set larger than 30 µm. The value of the interval L1 is the minimum necessary distance for obtaining desired withstand voltages of not less than 400 V with use of the field plate structure. In order to achieve larger withstand voltages, the value of the interval L1 should be increased in accordance with the desired withstand voltages.

Moreover, in the practical wafer process, the structure shown in FIG. 1 prior to the formation of the Al electrodes 26, 26' and the Al electrode 37 is manufactured first and then a part of the oxygen doped semi-insulating polycrystalline silicon film 35 is doped with phosphorus.

Second Embodiment

A bidirectional photothyristor chip in the present embodiment has a structure in which a short diode as the carrier absorption diode is additionally provided to the channel isolation region 29 in the bidirectional photothyristor chip 31 in the first embodiment.

Figure 4:
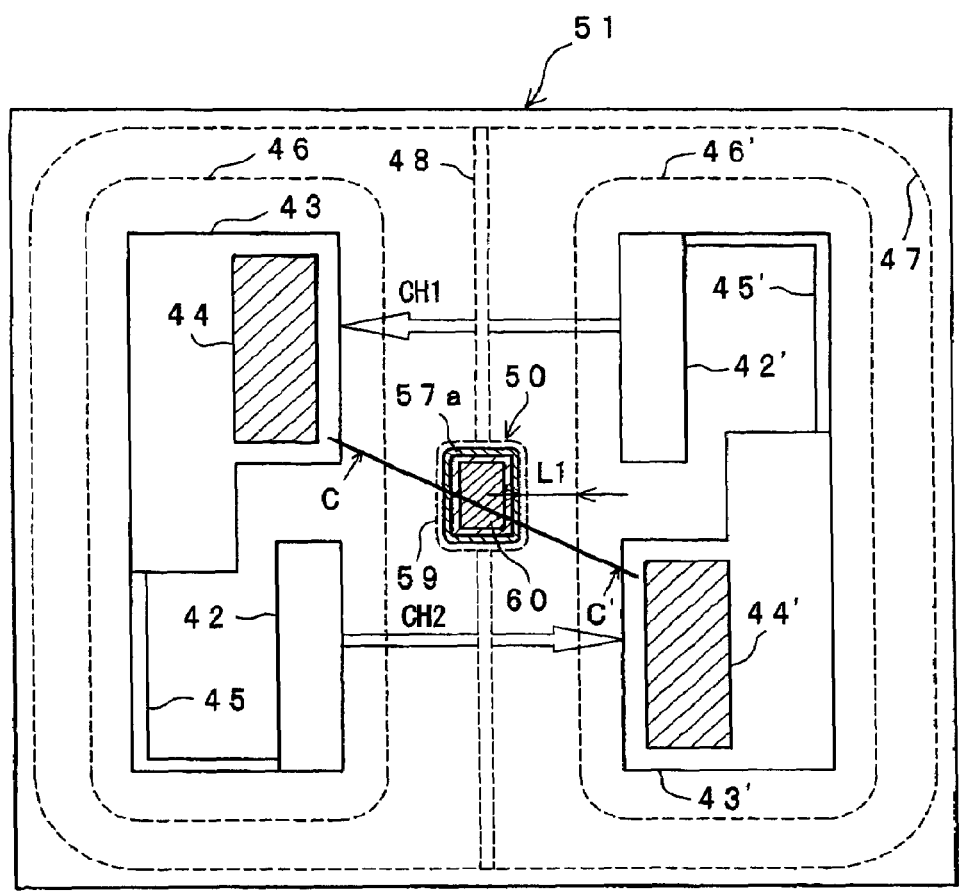
FIG. 4 is a pattern layout view showing a bidirectional photothyristor chip different from that of FIG. 1.
Figure 5:
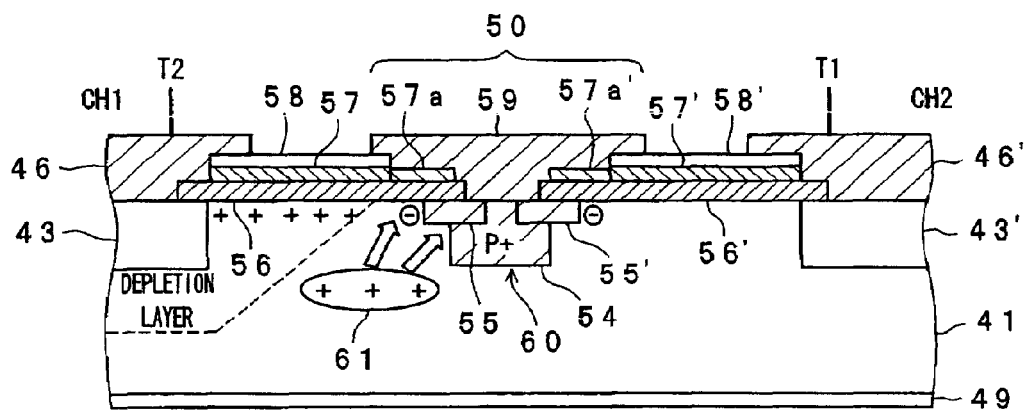
FIG. 5 is a cross sectional view taken along an arrow line C-C' in FIG. 4.
Figure 6:
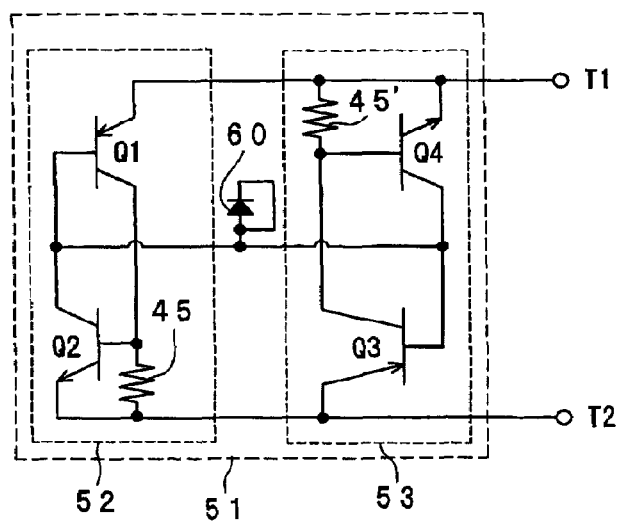
FIG. 6 is an equivalent circuit view showing the bidirectional photothyristor chip shown in FIG. 4.

FIG. 4 is a pattern layout view showing the schematic structure in the bidirectional photothyristor chip in the present embodiment. FIG. 5 is a cross sectional view taken along an arrow line C-C' in FIG. 4. FIG. 6 is an equivalent circuit view showing the bidirectional photothyristor chip of the present invention.

An N-type silicon substrate 41, anode diffusion regions 42, 42', P-gate diffusion regions 43, 43', cathode diffusion regions 44, 44', gate resistances 45, 45', Al electrodes 46, 46', an Al electrode 47, an Al guard ring 48, an N+ layer 49, a CH1 photothyristor 52 and a CH2 photothyristor 53 in the bidirectional photothyristor chip 51 of the present embodiment are same as the N-type silicon substrate 21, the anode diffusion regions 22, 22', the P-gate diffusion regions 23, 23', the cathode diffusion regions 24, 24', the gate resistances 25, 25', the Al electrodes 26, 26', the Al electrode 28, the Al guard ring 38, the N+ layer 30, the CH1 photothyristor 32 and the CH2 photothyristor 33 in the bidirectional photothyristor chip 31 of the first embodiment. In the present embodiment, however, the N-type diffusion region formed along the periphery of the chip as a channel stopper is omitted.

In the bidirectional photothyristor chip 51 of the present invention as with the case of the first embodiment, a channel isolation region 50 is formed in between the anode diffusion region 42 on the left-hand side and the anode diffusion region 42' on the right-hand side on the N-type silicon substrate 41 and in between the CH1 and the CH2. By the channel isolation region 50, holes or minority carriers in the N-type silicon substrate 41 are absorbed during the commutation, by which inter-channel movement is restricted.

FIG. 5 is a cross sectional view showing the N-type silicon substrate 41 in the vicinity of the channel isolation region 50 showing the passivation structure of the present embodiment. In FIG. 5, a P-type diffusion region 54 is formed in a region of the channel isolation region 50 on the surface of the N-type silicon substrate 41, and an N-type diffusion region 55 is formed as a channel stopper over the N-type silicon substrate 41 and the P-type diffusion region 54 at a position of the lateral side of the left-hand side (i.e., CH1 side) in the P-type diffusion region 54, and an N-type diffusion region 55' is also formed at a position of the lateral side of the right-hand side (i.e., CH2 side) in the P-type diffusion region 54 in the similar way.

In each of the CH1 side and the CH2 side, $SiO_2$ films 56, 56' are respectively formed over the P-gate diffusion regions 43, 43' and the N-type diffusion regions 55, 55'. Then, oxygen doped semi-insulating polycrystalline silicon films 57, 57' are respectively formed over the vicinity of the P-gate diffusion regions 43, 43' under SiO₂ films 56, 56' and the N-type diffusion regions 55, 55'. Further, regions 57a, 57a' of the oxygen doped semi-insulating polycrystalline silicon films 57, 57' on the side of the N-type diffusion regions 55, 55' are doped with phosphorus. Further, SiN films 58, 58' are formed, by chemical vapor deposition, on the regions of the oxygen doped semi-insulating polycrystalline silicon films 57, 57' not doped with phosphorus. Then, Al electrodes 46, 46' are formed over the surface of the P-gate diffusion regions 43, 43' and the surface of the SiN films 58, 58, and the Al electrode 46 is connected to an electrode T1 while the Al electrode 46' is connected to an electrode T2. Further, an Al electrode 59 is formed over the surface of the SiN film 58 on the CH1 side and the surface of the SiN film 58' on the CH2 side, and is connected to the N-type diffusion regions 55, 55' and the N-type silicon substrate 41. Thus, both the ends of the oxygen doped semi-insulating polycrystalline silicon films 57, 57' are brought into contact with the Al electrodes 46, 46' and the Al electrode 59 to form a potential gradient between the Al electrodes 46, 46' and the Al electrode 59 for alleviating concentration of electric fields on the Si—SiO₂ interface. Thus, also in the present embodiment, the field plate structure is formed. It is to be noted that in the case of the present embodiment, a value of the interval L1 between the Al electrode 59 and the Al electrodes 46, 46' is also set larger than 30 μm.

With the structure, in the channel isolation region 50 on the surface of the N-type silicon substrate 41, a short diode 60 in which the P-type diffusion region 54 and the N-type diffusion region 55 are short-circuited via the Al electrode 59 and the N-type silicon substrate 41 is formed. Consequently, holes 61 or minority carriers in the N-type silicon substrate 41 are absorbed in the P-type diffusion region 54 in the short diode 60, which reduces the lifetime of the holes 61. Moreover, regions 57a, 57a' of the oxygen doped semi-insulating polycrystalline silicon films 57, 57' on the side of the N-type diffusion regions 55, 55' are doped with phosphorus. Therefore, the silicon interface state Qss immediately below the oxygen doped semi-insulating polycrystalline silicon films 57a, 57a' doped with phosphorus on the surface of the N-type silicon substrate 41 increases. Therefore, the holes 61 are made to disappear also in the regions with the increased silicon interface state Qss, which, in conjunction with the effect of the short diode 60, makes it possible to promote reduction in the lifetime of the holes 61 more reliably.

It is to be noted that in the present embodiment, the outer diameter of the short diode 60 is set smaller than the outer diameter of the oxygen doped semi-insulating polycrystalline silicon film 57a doped with phosphorus as shown in FIG. 4. With such an arrangement, it becomes possible to provide a region on the surface of the N-type silicon substrate 41 where the silicon interface state Qss increases due to the oxygen doped semi-insulating polycrystalline silicon films 57a, 57a' doped with phosphorus as shown in FIG. 5, thereby allowing effective fulfillment of both the effect of the short diode 60 and the effect of the oxygen doped semi-insulating polycrystalline silicon films 57a, 57a' doped with phosphorus.

Third Embodiment

A bidirectional photothyristor chip in the present embodiment has a structure in which the channel isolation region 29 in the bidirectional photothyristor chip 31 of the first embodiment further extends and is formed across the CH1 and the CH2 along the entire width of the chip.

Figure 7:
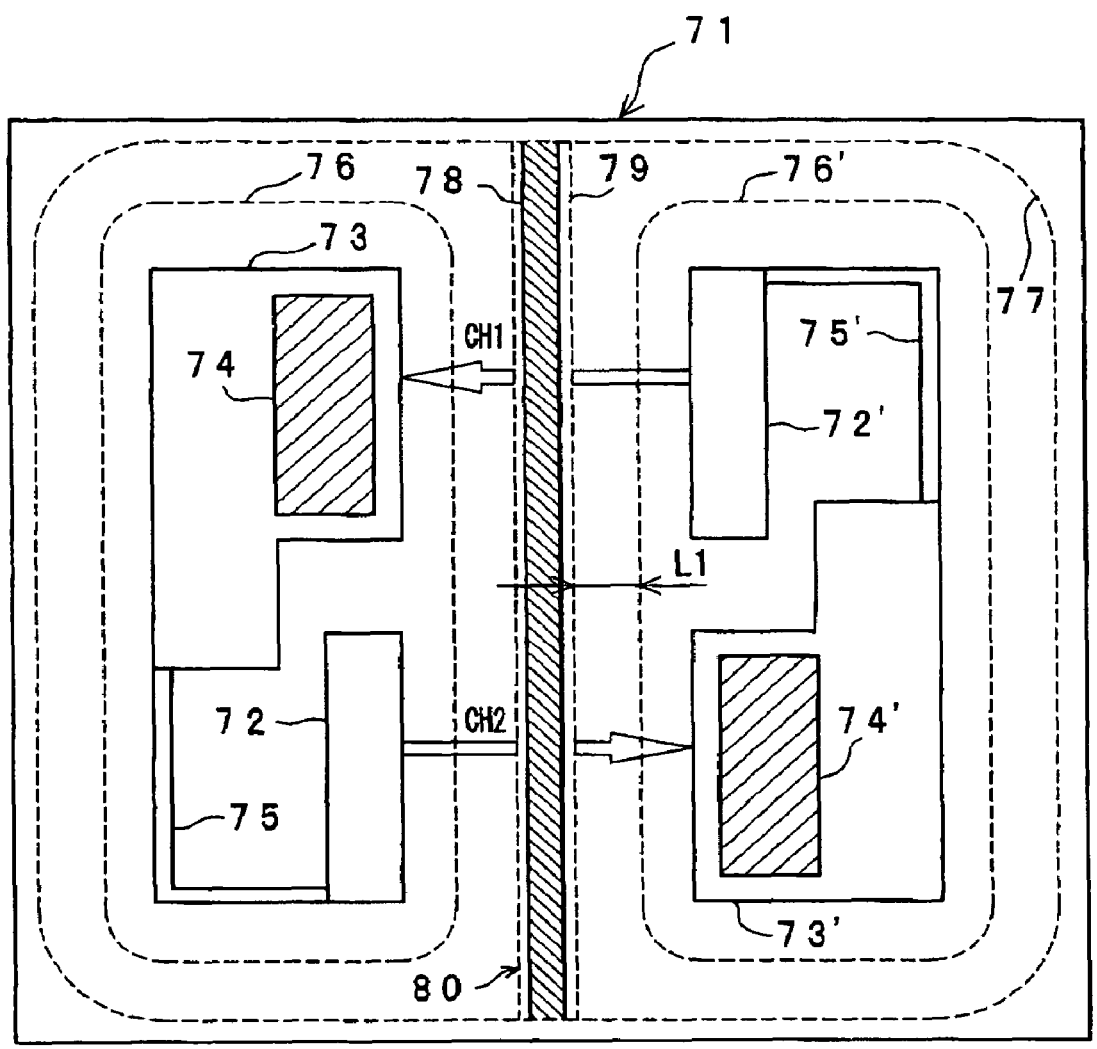
FIG. 7 is a pattern layout view showing a bidirectional photothyristor chip different from those of FIG. 1 and FIG. 4.

FIG. 7 is a pattern layout view showing the schematic structure of a bidirectional photothyristor chip 71 in the present embodiment. It is to be noted that the cross sectional view of a channel isolation region in the bidirectional photothyristor chip 71 is almost identical to that of FIG. 2. Also, its equivalent circuit is identical to that of FIG. 3.

Anode diffusion regions 72, 72', P-gate diffusion regions 73, 73' cathode diffusion regions 74, 74', gate resistances 75, 75', Al electrodes 76, 76' and an Al electrode 77 in the bidirectional photothyristor chip 71 of the present embodiment are same as the anode diffusion regions 22, 22', the P-gate diffusion regions 23, 23', the cathode diffusion regions 24, 24', the gate resistances 25, 25', the Al electrodes 26, 26' and the Al electrode 28 in the bidirectional photothyristor chip 31 of the first embodiment. In the present embodiment, however, the N-type diffusion region formed along the periphery of the chip as a channel stopper and the N+ layer formed on the back surface of the N-type silicon substrate for increasing he luminous sensitivity by the BSF effect are omitted.

A channel isolation region 80 in the bidirectional photothyristor chip 71 of the present embodiment is structured such that the passivation structure from the P-gate diffusion region 23 on the CH1 side to the P-gate diffusion region 23' on the CH2 side in the first embodiment extends across each of the CH1 and the CH2 over the entire width of the bidirectional photothyristor chip 71. Therefore, as shown in FIG. 7, an oxygen doped semi-insulating polycrystalline silicon film 78 doped with phosphorus and an Al electrode 79 are formed over the entire width of the bidirectional photothyristor chip 71 at a position corresponding to the position of the Al guard ring 38 in the bidirectional photothyristor chip 31 of the first embodiment. It is to be noted that in the present embodiment, a value of the interval L1 between the Al electrode 79 and the Al electrodes 76, 76' is also set larger than 30 μm.

One of the methods for enhancing the commutation characteristic is to increase the holding current IH. This IH characteristic represents a minimum operative current value at which the bidirectional thyristor can maintain ON-state, and is also refers to a maximum operative current at which the bidirectional thyristor can be turned off. As the IH value increases, the commutation characteristic is enhanced. This is because the IH value influences a period of time from a point of time when a half cycle operation on the CH1 side during AC operation is turned on to a point of time when a half cycle operation on the opposite CH2 side is turned on. As the period of time increases, the longer grace period can be gained, and therefore it becomes possible to effectively eliminate the carriers moving to the opposite channel within this period of time.

Parameters of the IH characteristic include circuit constants of (1) current amplification factor Hfe (pnp), (2) current amplification factor Hfe (npn) and (3) RGK (gate resistance). Decreasing the (1) current amplification factor Hfe (pnp) among the circuit constants is the most effective method for allowing enhancement of the IH characteristic without exerting much influence on the luminous sensitivity (IFT) which is in the trade-off relation with the IH characteristic. It is to be noted that the IH characteristic can also be enhanced by decreasing the circuit constants of the (2) current amplification factor Hfe (npn) and (3) RGK (gate resistance), though these methods have such a harmful effect that the luminous sensitivity characteristic (IFT) is considerably deteriorated.

In the present embodiment, an oxygen doped semi-insulating polycrystalline silicon film 78 locally doped with phosphorus is formed on an N-type silicon substrate constituting the base of PNP transistors Q1 and Q3. The oxygen doped semi-insulating polycrystalline silicon film 78 doped with phosphorus has an action of increasing the surface recombination for increasing the interface state Qss on the interface Si—SiO$_2$, which allows effective decrease in the current amplification factor Hfe (pnp).

Therefore, it becomes possible to gain a grace period till the occurrence of the commutation failure, thereby allowing effective elimination of the carriers moving to the opposite channel. It is to be noted that a higher dopant level of phosphorus in the oxygen doped semi-insulating polycrystalline silicon film increases the interface state Qss, and therefore is effective for reducing the current amplification factor Hfe (pnp), though too high a dopant level of phosphorus may harmfully affect the reliability.

Moreover, in the bidirectional photothyristor chip 71 in the present embodiment, the oxygen doped semi-insulating polycrystalline silicon film 78 doped with phosphorus is formed across the CH1 and the CH2 over the entire width of the chip. Therefore, when a voltage pulse with a steep rise is applied to between the anode diffusion regions 72, 72' and the cathode diffusion regions 74, 74', a displacement current is suppressed from flowing to the P-gate diffusion regions 73, 73'. As a result, such malfunction that the bidirectional photothyristor chip 71 is turned on without a light signal will not occur. More particularly, according to the present embodiment, the dv/dt characteristic can be enhanced.

Fourth Embodiment

A bidirectional photothyristor chip in the present embodiment has a structure in which the oxygen doped semi-insulating polycrystalline silicon film 57a doped with phosphorus and the Al electrode 59 in the channel isolation region 50 in the bidirectional photothyristor chip 51 of the second embodiment further extend and are formed across the CH1 and the CH2 over the entire width of the chip.

Figure 8:
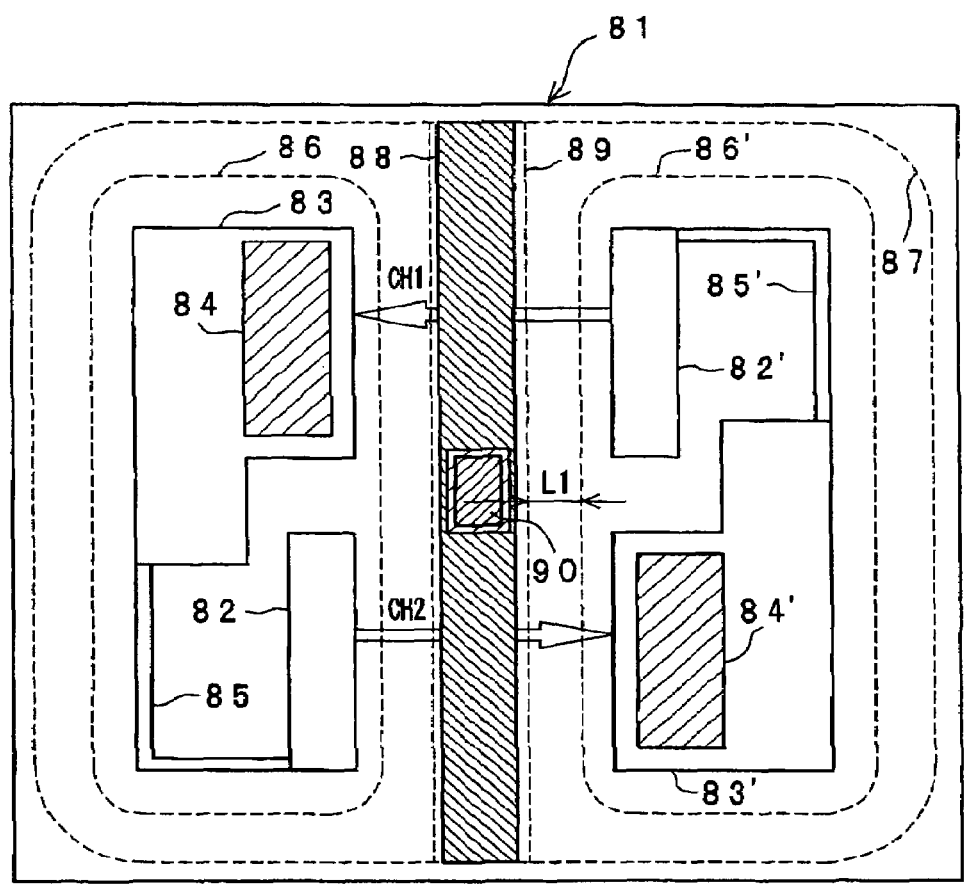
FIG. 8 is a pattern layout view showing a bidirectional photothyristor chip different from those of FIG. 1, FIG. 4 and FIG. 7.

FIG. 8 is a pattern layout view showing the schematic structure of a bidirectional photothyristor chip 81 in the present embodiment. It is to be noted that the cross sectional view of a channel isolation region in the center portion of the bidirectional photothyristor chip 81 is about identical to that of FIG. 5. Also, the equivalent circuit is identical to that of FIG. 6.

Anode diffusion regions 82, 82', P-gate diffusion regions 83, 83', cathode diffusion regions 84, 84', gate resistances 85, 85', Al electrodes 86, 86' and an Al electrode 87 in the bidirectional photothyristor chip 81 of the present embodiment are same as the anode diffusion regions 22, 22', the P-gate diffusion regions 23, 23', the cathode diffusion regions 24, 24', the gate resistances 25, 25', the Al electrodes 26, 26' and the Al electrode 28 in the bidirectional photothyristor chip 31 of the first embodiment. In the present embodiment, however, the N-type diffusion region formed along the periphery of the chip as a channel stopper and the N+ layer formed on the back surface of the N-type silicon substrate for increasing he luminous sensitivity by the BSF effect are omitted.

A channel isolation region in the bidirectional photothyristor chip 81 of the present embodiment is structured such that the oxygen doped semi-insulating polycrystalline silicon film 57a doped with phosphorus and the Al electrode 59 in the channel isolation region 50 shown in FIG. 4 and FIG. 5 in the second embodiment extend across each of the CH1 and the CH2 so as to be formed over the entire width of the bidirectional photothyristor chip 51. Therefore, as shown in FIG. 8, an oxygen doped semi-insulating polycrystalline silicon film 88 doped with phosphorus and an Al electrode 89 are formed over the entire width of the bidirectional photothyristor chip 81 at a position corresponding to the position of the Al guard ring 48 in the bidirectional photothyristor chip 51 of the second embodiment. It is to be noted that in the present embodiment, a value of the interval L1 between the Al electrode 89 and the Al electrode 86 or 86' is also set larger than 30 μm.

It is to be noted that as with the case of the short diode 60 in the bidirectional photothyristor chip 51 of the second embodiment, a short diode 90 is formed in between the anode diffusion region 82 on the left-hand side and the anode diffusion region 82' on the right-hand side on the N-type silicon substrate and in between the CH1 and the CH2.

Therefore, according to the present embodiment, as in the case of the bidirectional photothyristor chip 71 in the third embodiment, it becomes possible to decrease the current amplification factor Hfe (pnp) effectively and gain a grace period till the occurrence of the commutation failure, thereby allowing effective extinction of the carriers moving to the opposite channel by a region with the increased silicon interface state (Qss) on the surface of the N-type silicon substrate. In addition to this, holes or minority carriers in the N-type silicon substrate are absorbed in a P-type diffusion region in the short diode 90, by which the lifetime of the holes is reduced.

Moreover, in the bidirectional photothyristor chip 81 in the present embodiment, the oxygen doped semi-insulating polycrystalline silicon film 88 doped with phosphorus is formed across the CH1 and the CH2 over the entire width of the chip. Therefore, when a voltage pulse with a steep rise is applied to between the anode diffusion regions 82, 82' and the cathode diffusion regions 84, 84', a displacement current is suppressed from flowing to the P-gate diffusion regions 83, 83', and as a result, such malfunction that the bidirectional photothyristor chip 81 is turned on without a light signal can be prevented. More particularly, according to the present embodiment, the dv/dt characteristic can be enhanced.

Fifth Embodiment

A bidirectional photothyristor chip in the present embodiment has a structure in which the short diode 90 in the bidirectional photothyristor chip 81 of the fourth embodiment further extends and is formed across the CH1 and the CH2 over the entire width of the chip.

Figure 9:
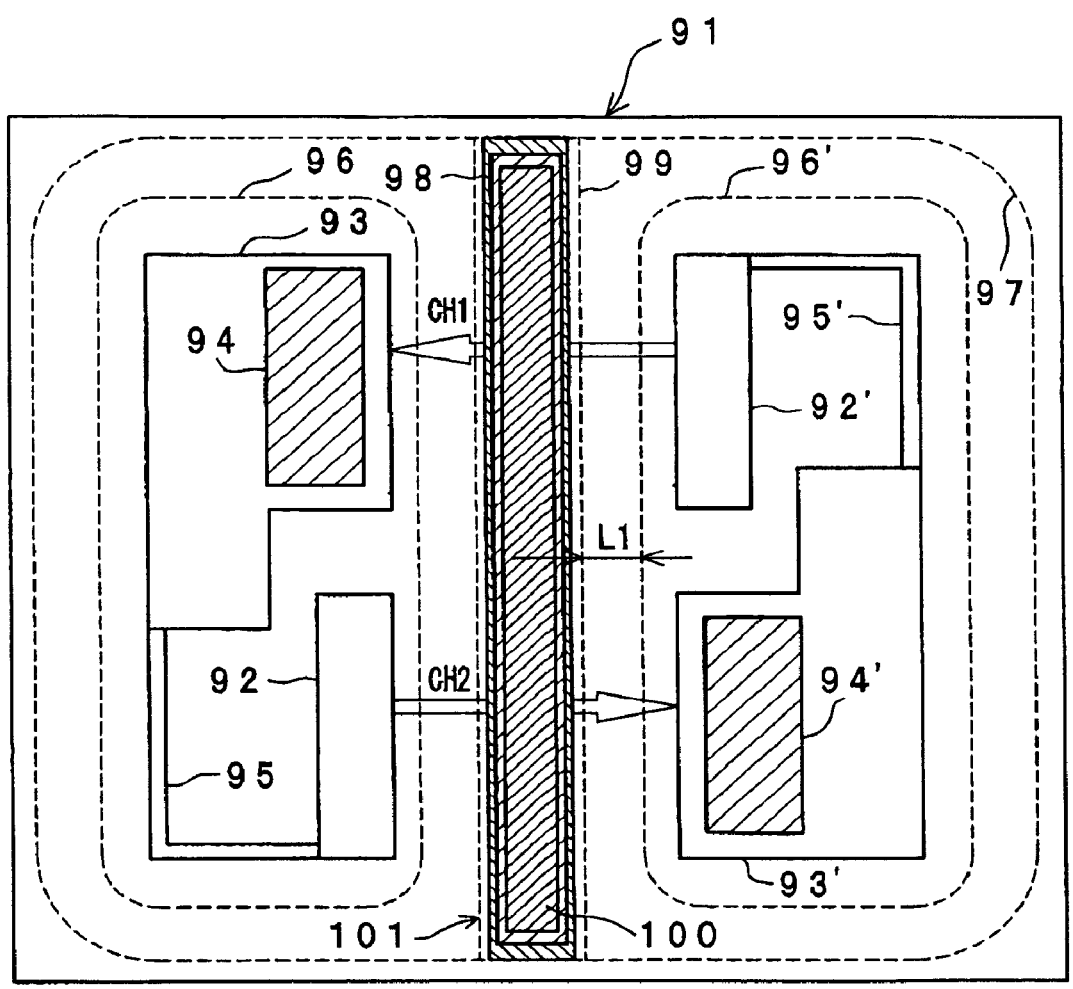
FIG. 9 is a pattern layout view showing a bidirectional photothyristor chip different from those of FIG. 1, FIG. 4, FIG. 7 and FIG. 8.

FIG. 9 is a pattern layout view showing the schematic structure of a bidirectional photothyristor chip 91 in the present embodiment. It is to be noted that the cross sectional view of a channel isolation region in the center portion of the bidirectional photothyristor chip 91 is approximately identical to that of FIG. 5. Also, the equivalent circuit is identical to that of FIG. 6.

Anode diffusion regions 92, 92', P-gate diffusion regions 93, 93' cathode diffusion regions 94, 94', gate resistances 95, 95', Al electrodes 96, 96' and an Al electrode 97 in the bidirectional photothyristor chip 91 of the present embodiment are same as the anode diffusion regions 22, 22', the P-gate diffusion regions 23, 23', the cathode diffusion regions 24, 24', the gate resistances 25, 25', the Al electrodes 26, 26' and the Al electrode 28 in the bidirectional photothyristor chip 31 of the first embodiment. In the present embodiment, however, the N-type diffusion region formed along the periphery of the chip as a channel stopper and the N+ layer formed on the back surface of the N-type silicon substrate for increasing he luminous sensitivity by the BSF effect are omitted.

A channel isolation region 101 in the bidirectional photothyristor chip 91 of the present embodiment is structured such that the channel isolation region 50 shown in FIG. 4 and FIG. 5 in the second embodiment extend across each of the CH1 and the CH2 so as to be formed over the entire width of the bidirectional photothyristor chip 91. Therefore, as shown in FIG. 9, an oxygen doped semi-insulating polycrystalline silicon film 98 doped with phosphorus, an Al electrode 99 and a short diode 100 are formed over the entire width of the bidirectional photothyristor chip 91. It is to be noted that in the present embodiment, a value of the interval L1 between the Al electrode 99 and the Al electrode 96 or 96' is also set larger than 30 μm.

Therefore, according to the present embodiment, holes or minority carriers in the N-type silicon substrate can be absorbed more effectively than the case of the bidirectional photothyristor chip 81 in the fourth embodiment, and so the lifetime of the holes can be reduced.

Moreover, in the bidirectional photothyristor chip 91 in the present embodiment, the oxygen doped semi-insulating polycrystalline silicon film 98 doped with phosphorus is formed across the CH1 and the CH2 over the entire width of the chip. Therefore, when a voltage pulse with a steep rise is applied to between the anode diffusion regions 92, 92' and the cathode diffusion regions 94, 94', a displacement current is suppressed from flowing into the P-gate diffusion regions 93, 93', and as a result, such malfunction that the bidirectional photothyristor chip 91 is turned on without a light signal can be prevented. More particularly, according to the present embodiment, the dv/dt characteristic can be enhanced.

Sixth Embodiment

Figure 10:
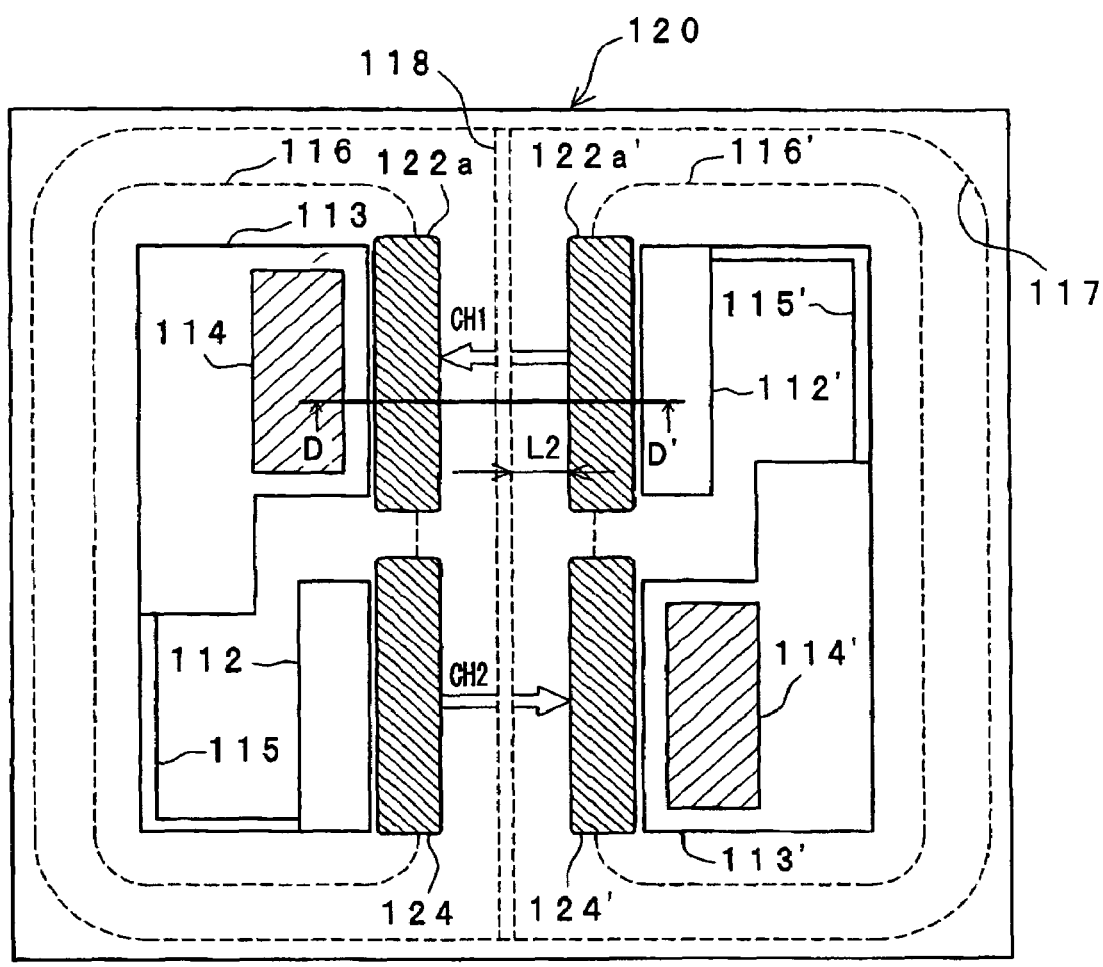
FIG. 10 is a pattern layout view showing a bidirectional photothyristor chip different from those of FIG. 1, FIG. 4, and FIGS. 7 to 9.
Figure 11:
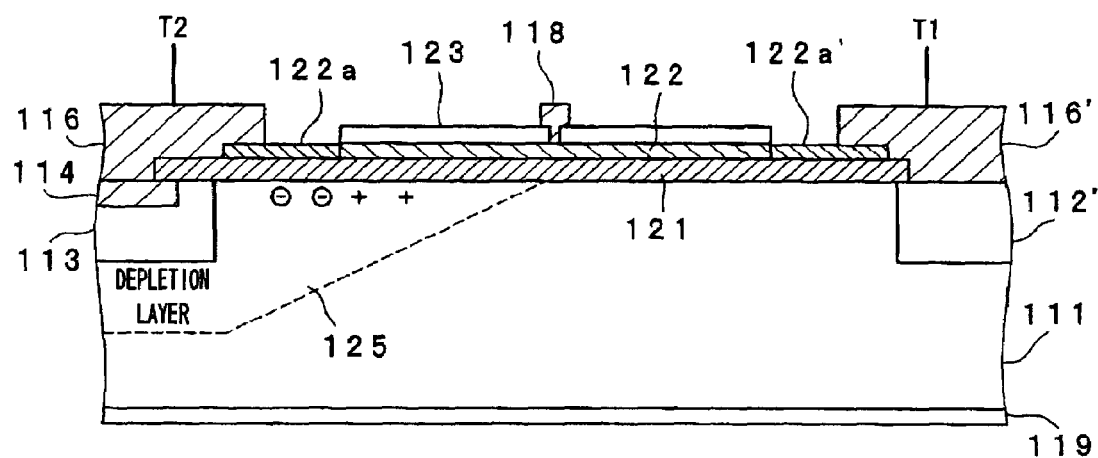
FIG. 11 is a cross sectional view taken along an arrow line D-D' in FIG. 10.

FIG. 10 is a pattern layout view showing the schematic structure of a bidirectional photothyristor chip in the present embodiment. FIG. 11 is a cross sectional view taken along an arrow line D-D' in FIG. 10. Also, the equivalent circuit is identical to that of FIG. 3.

An N-type silicon substrate 111, anode diffusion regions 112, 112', P-gate diffusion regions 113, 113' cathode diffusion regions 114, 114', gate resistances 115, 115', Al electrodes 116, 116', an Al electrode 117, an Al guard ring 118 and an N+ layer 119 in the bidirectional photothyristor chip 120 of the present embodiment are same as the N-type silicon substrate 21, the anode diffusion regions 22, 22', the P-gate diffusion regions 23, 23', the cathode diffusion regions 24, 24', the gate resistances 25, 25', the Al electrodes 26, 26', the Al electrode 28, the Al guard ring 38 and the N+ layer 30 in the bidirectional photothyristor chip 31 of the first embodiment. In the present embodiment, however, the N-type diffusion region formed along the periphery of the chip as a channel stopper is omitted.

In the bidirectional photothyristor chip 120 of the present embodiment, along the opposed sides of the P-gate diffusion region 113 and the anode diffusion region 112' which are opposed to each other and along the opposed sides of the anode diffusion region 112 and the P-gate diffusion region 113' which are opposed to each other, i.e., in the vicinity of junctions between the two anode diffusion regions 112, 112' and the N-type silicon substrate 111 and in the vicinity of junctions between the two P-gate diffusion regions 113, 113' and the N-type silicon substrate 111, oxygen doped semi-insulating polycrystalline silicon films 122a, 122a', 124, 124' doped with phosphorus are formed.

Description is now given of the opposed sides of the P-gate diffusion region 113 and the anode diffusion region 112' with reference to FIG. 11. In FIG. 11, an SiO₂ film 121 is formed over the cathode diffusion region 114 on the left-hand side from the Al guard ring 118 on the N-type silicon substrate 111 and the anode diffusion region 112' on the right-hand side. Further, an oxygen doped semi-insulating polycrystalline silicon film 122 is formed on the SiO₂ film 121 outside the P-gate diffusion region 113 and the anode diffusion region 112', and regions 122a, 122a' in the oxygen doped semi-insulating polycrystalline silicon film 122 on the sides close to the P-gate diffusion region 113 and the anode diffusion region 112' are doped with phosphorus. This increases the silicon interface state (Qss) immediately under the regions, i.e., oxygen doped semi-insulating polycrystalline silicon films 122a, 122a' doped with phosphorus on the surface of the N-type silicon substrate 21.

Further, an SiN film 123 is formed, by chemical vapor deposition, on the region of the oxygen doped semi-insulating polycrystalline silicon film 122 not doped with phosphorus. Then, on the left-hand side, an Al electrode 116 is formed over the oxygen doped semi-insulating polycrystalline silicon film 122a doped with phosphorus and the P-gate diffusion region 113, and is connected to the electrode T2. On the right-hand side, an Al electrode 116' is formed over the oxygen doped semi-insulating polycrystalline silicon film 122a' doped with phosphorus and the anode diffusion region 112', and is connected to the electrode T1. Further, an Al electrode is formed in such a way as to divide the SiN film 123 into two parts and is connected to the N-type silicon substrate 111 to form an Al guard ring 118. Thus, both the ends and the center portion of the oxygen-doped polycrystalline silicon film 122 are brought into contact with the Al electrodes 116, 116', and the Al electrode 118 to form a potential gradient between the Al electrodes 116, 116' and the Al electrode 118 for alleviating concentration of electric fields on the Si—SiO₂ interface. Thus, the field plate structure which advantageously offers high withstand voltages is provided.

As described above, in the bidirectional photothyristor chip 120, along the opposed sides of the P-gate diffusion region 113 and the anode diffusion region 112' which are opposed to each other, the oxygen doped semi-insulating polycrystalline silicon films 112a, 112a' doped with phosphorus are formed. Further, along the opposed sides of the anode diffusion region 112 and the P-gate diffusion region 113', the oxygen doped semi-insulating polycrystalline silicon films 124, 124' doped with phosphorus are formed. This makes it possible to increase the silicon interface state (Qss) in the vicinity of the opposed sides of the P-gate diffusion region 113 and the anode diffusion region 112' and in the vicinity of the opposed sides of the anode diffusion region 112 and the P-gate diffusion region 113' on the N-type silicon substrate 111.

More particularly, according to the present embodiment as in the case of the bidirectional photothyristor chip 71 in the third embodiment, it becomes possible to decrease the current amplification factor Hfe (pnp) effectively and gain a grace period till the occurrence of the commutation failure, thereby allowing effective extinction of the carriers moving to the opposite channel by the regions 122a, 122a', 124, 124' with the increased silicon interface state (Qss) on the surface of the N-type silicon substrate 111. It is to be noted that reference numeral 125 denotes a depletion layer.

Moreover, in the bidirectional photothyristor chip 120 in the preset embodiment, the oxygen doped semi-insulating polycrystalline silicon films 122a, 122a', 124, 124' doped with phosphorus are formed in such a way as to intersect with the CH1 and the CH2. Therefore, when a voltage pulse with a steep rise is applied to between the anode diffusion regions 112, 112' and the cathode diffusion regions 114, 114', a displacement current is suppressed from flowing into the P-gate diffusion regions 113, 113', and as a result, such malfunction that the bidirectional photothyristor chip 120 is turned on without a light signal is prevented. More particularly, according to the present embodiment, the dv/dt characteristic can be enhanced.

It is to be noted that in the present embodiment, a value of the interval L2 between the Al guard ring 118 and the oxygen doped semi-insulating polycrystalline silicon film 122a, 122a', 124 or 124' doped with phosphorus shown in FIG. 10 is set larger than 30 μm. The value of the interval L2 is the minimum necessary distance for obtaining desired withstand voltages of not less than 400 V with use of the field plate structure. In order to achieve larger withstand voltages, the value of the interval L2 should be increased in conformity with the desired withstand voltages.

Moreover, the oxygen doped semi-insulating polycrystalline silicon films 122a, 122a', 124, 124' doped with phosphorus are connected to the electrode T1 (anode electrode) and the electrode T2 (cathode electrode) to serve as transparent electrodes constituting a part of the field plate structure. Therefore, the oxygen doped semi-insulating polycrystalline silicon film doped with phosphorus can enhance the luminous sensitivity more than the case where the Al film is employed instead because the oxygen doped semi-insulating polycrystalline silicon film doped with phosphorus does not shield light.

Seventh Embodiment

Figure 12:
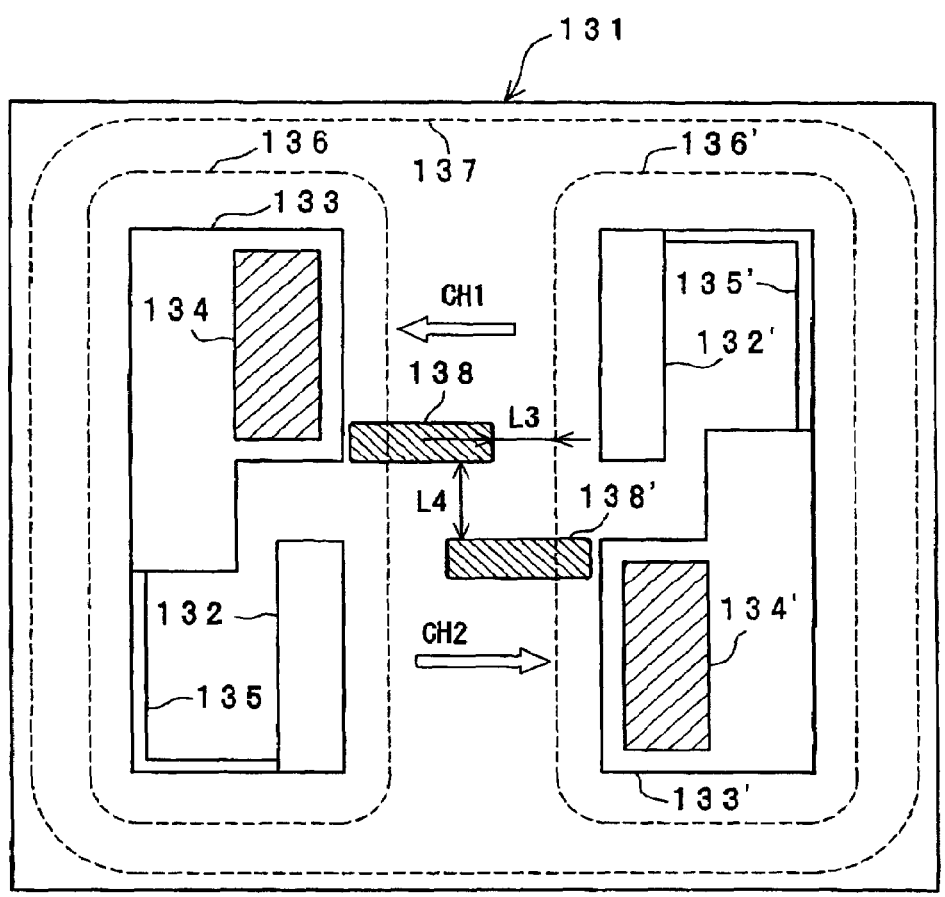
FIG. 12 is a pattern layout view showing a bidirectional photothyristor chip different from those of FIG. 1, FIG. 4, and FIGS. 7 to 10.

FIG. 12 is a pattern layout view showing the schematic structure of a bidirectional photothyristor chip in the present embodiment. Also, the equivalent circuit is identical to that of FIG. 3.

Anode diffusion regions 132, 132', P-gate diffusion regions 133, 133' cathode diffusion regions 134, 134', gate resistances 135, 135', Al electrodes 136, 136' and an Al electrode 137 in the bidirectional photothyristor chip 131 of the present embodiment are same as the anode diffusion regions 22, 22', the P-gate diffusion regions 23, 23', the cathode diffusion regions 24, 24', the gate resistances 25, 25', the Al electrodes 26, 26' and the Al electrode 28 in the bidirectional photothyristor chip 31 of the first embodiment. In the present embodiment, however, the N-type diffusion region formed along the periphery of the chip as a channel stopper and the N+ layer formed on the back surface of the N-type silicon substrate for increasing he luminous sensitivity by the BSF effect are omitted.

In the bidirectional photothyristor chip 131 of the present embodiment, oxygen doped semi-insulating polycrystalline silicon films 138, 138' doped with phosphorus are formed on the line connecting the P gate diffusion regions 133, 133' which are disposed at the positions symmetric with respect to a point of the center of the chip and at the positions isolating the CH1 and CH2 in a symmetric way with respect to a point of the center of the chip. This makes it possible to increase the silicon interface state (Qss) in the oxygen doped semi-insulating polycrystalline silicon films 138, 138' doped with phosphorus on the surface of the N-type silicon substrate.

Therefore, holes or minority carriers in the N-type silicon substrate are made to disappear in the region with the increased silicon interface state (Qss), thereby making it possible to reliably promote reduction in the lifetime of the holes.

It is to be noted that in the present invention, a value of the interval L3 between the oxygen doped semi-insulating polycrystalline silicon films 138, 138' doped with phosphorus and the Al electrodes 136, 136' as well as a value of the interval L4 between the two oxygen doped semi-insulating polycrystalline silicon films 138 and 138' doped with phosphorus shown in FIG. 12 are set larger than 30 μm. The values of the interval L3 and the interval L4 are the minimum necessary distances for obtaining desired withstand voltages of not less than 400 V with use of the field plate structure. In order to achieve larger withstand voltages, the values of the interval L3 and the interval L4 should be increased in conformity with the desired withstand voltages.

Eighth Embodiment

A bidirectional photothyristor chip in the present embodiment has a structure in which an oxygen doped semi-insulating polycrystalline silicon film doped with phosphorus is also formed around the Al electrodes 86, 86' in the bidirectional photothyristor chip 81 of the fourth embodiment.

Figure 13:
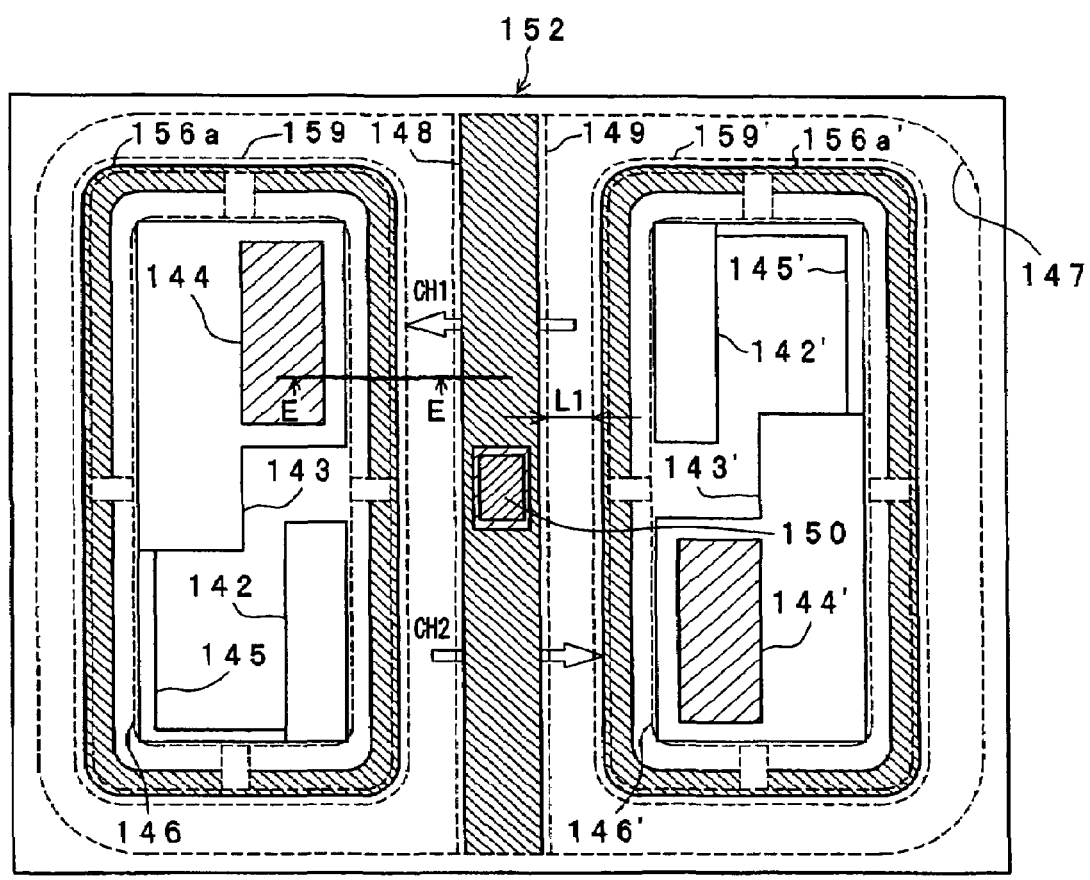
FIG. 13 is a pattern layout view showing a bidirectional photothyristor chip different from those of FIG. 1, FIG. 4, FIGS. 7 to 10 and FIG. 12.
Figure 14:
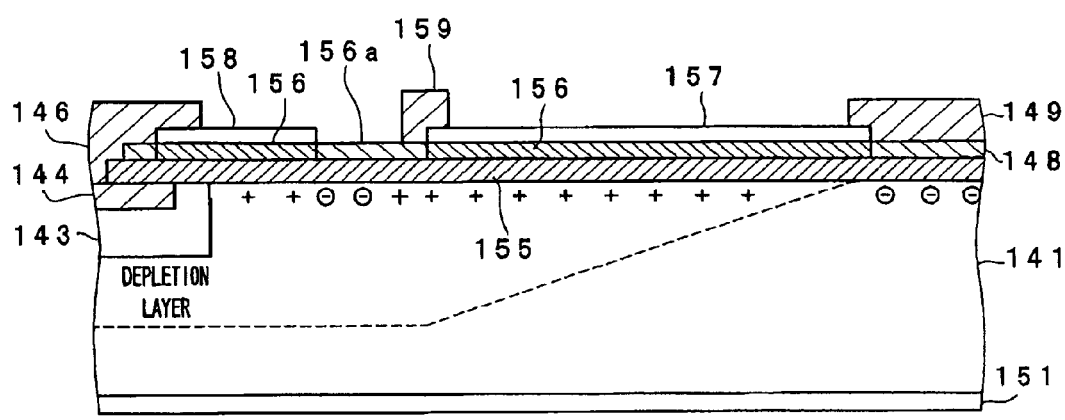
FIG. 14 is a cross sectional view taken along an arrow line E-E' in FIG. 13.

FIG. 13 is a pattern layout view showing the schematic structure of the bidirectional photothyristor chip 152 in the present embodiment. FIG. 14 is a cross sectional view taken along an arrow line E-E' in FIG. 14. Also, the equivalent circuit is identical to that of FIG. 6.

An N-type silicon substrate 141, anode diffusion regions 142, 142', P-gate diffusion regions 143, 143' cathode diffusion regions 144, 144', gate resistances 145, 145', an Al electrode 147 and an N+ layer 151 in the bidirectional photothyristor chip 152 of the present embodiment are same as the N-type silicon substrate 21, the anode diffusion regions 22, 22', the P-gate diffusion regions 23, 23', the cathode diffusion regions 24, 24', the gate resistances 25, 25', the Al electrode 28 and the N+ layer 30 in the bidirectional photothyristor chip 31 of the first embodiment. Moreover, an oxygen doped semi-insulating polycrystalline silicon film 148 doped with phosphorus, an Al electrode 149 and a short diode 150 are same as the oxygen doped semi-insulating polycrystalline silicon film 88 doped with phosphorus, the Al electrode 89 and the short diode 90 in the bidirectional photothyristor chip 81 of the fourth embodiment. In the present embodiment, however, the N-type diffusion region formed along the periphery of the chip as a channel stopper is omitted.

In the present embodiment, as shown in FIG. 13, Al electrodes 146, 146' are formed into a minimum rectangular shape capable of offering complete coverage to the P gate diffusion regions 143, 143', the gate resistances 145, 145' and the anode diffusion regions 142, 142'. More particularly, the Al electrode 146, 146' are formed smaller than the Al electrodes 26, 46, 76, 86, 96, 116, 136 in each of the forgoing embodiments. Then, as shown in FIG. 14, on an oxygen doped semi-insulating polycrystalline silicon film 156 which is formed on an $SiO_2$ film 155 formed on the surface of the N-type silicon substrate 141 and part of which is an oxygen doped semi-insulating polycrystalline silicon film 148 doped with phosphorus, a region 156a surrounding the Al electrode 146 and having a specified width is doped with phosphorus. Then, in the region on the oxygen doped semi-insulating polycrystalline silicon film 156 not doped with phosphorus, SiN films 157, 158 are formed by chemical vapor deposition. Further, an Al guard ring 159 is formed over the SiN film 157 and the oxygen doped semi-insulating polycrystalline silicon film 156a doped with phosphorus. It is to be noted that in the present embodiment, a value of the interval L1 between the Al electrode 149 and the Al guard rings 159, 159' is set larger than 30 μm.

Thus, in the bidirectional photothyristor chip 152 of the present embodiment, the oxygen doped semi-insulating polycrystalline silicon film 148 doped with phosphorus is formed across the CH1 and the CH2 over the entire width of the chip. Therefore, the commutation characteristic may be improved. Further, the Al electrode 146, 146' are formed into a minimum rectangular shape capable of offering complete coverage to the P gate diffusion regions 143, 143', the gate resistances 145, 145' and the anode diffusion regions 142, 142'. The transparent guard rings, which surround the Al electrode 146, 146' and are composed of the oxygen doped semi-insulating polycrystalline silicon films 156a, 156a' doped with phosphorus, and the Al guard rings 159, 159' are formed to constitute a double guard ring structure. This makes it possible to decrease a light shielding area of the junction regions between the P gate diffusion regions 143, 143' and the N-type silicon substrate 141, and thereby enhance the luminous sensitivity.

It is to be noted that in the present embodiment, the double guard ring structure composed of the oxygen doped semi-insulating polycrystalline silicon films 156a, 156a' doped with phosphorus and the Al guard rings 159, 159' and surrounding the Al electrode 146, 146' is applied to the bidirectional photothyristor chip 81 in the fourth embodiment. However, the double guard ring structure may be applied to other embodiments to enhance the luminous sensitivity without any problems.

Ninth Embodiment

A bidirectional photothyristor chip in the present embodiment has a structure in which a Schottky barrier diode is formed in the P-gate diffusion regions 83, 83' in the bidirectional photothyristor chip 81 of the fourth embodiment. It is to be understood that in the following description, component members identical to those in the bidirectional photothyristor chip 81 of the fourth embodiment are designated by reference numerals identical to those of the fourth embodiment and description thereof is omitted.

Figure 15:
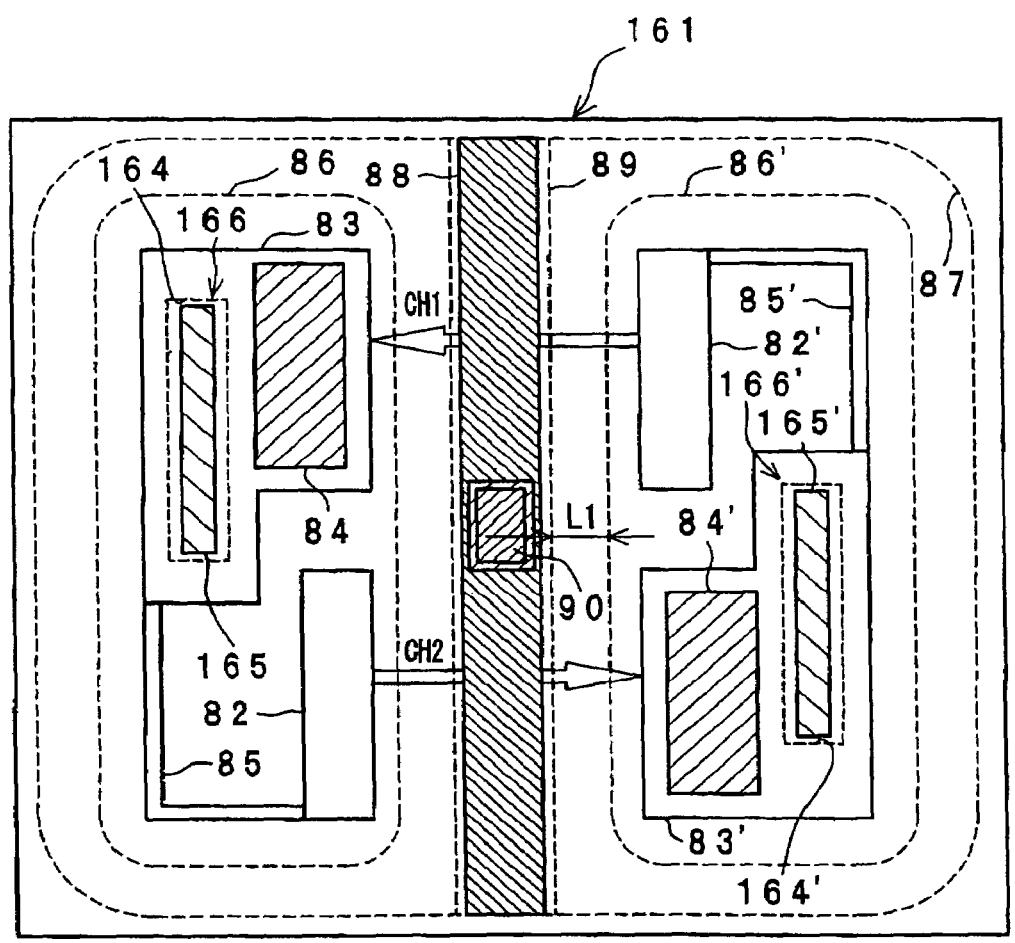
FIG. 15 is a pattern layout view showing a bidirectional photothyristor chip different from those of FIG. 1, FIG. 4, FIGS. 7 to 10, FIGS. 12 and 13.
Figure 16:
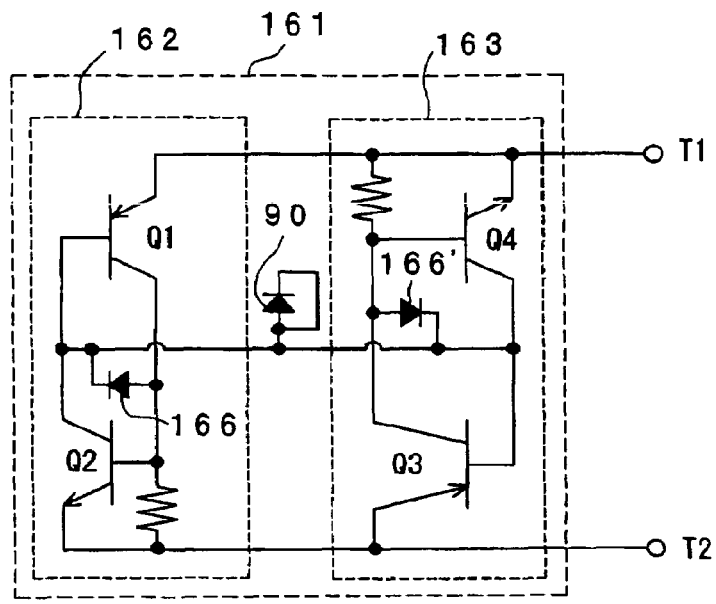
FIG. 16 is an equivalent circuit view showing the bidirectional photothyristor chip shown in FIG. 15.

FIG. 15 is a pattern layout view showing the schematic structure of the bidirectional photothyristor chip 161 in the present embodiment. Also, FIG. 16 shows an equivalent circuit thereof.

In the regions of the P-gate diffusion regions 83, 83' where the cathode diffusion regions 84, 84' are not formed, rectangular aperture sections (unshown) not doped with a P-type dopant are provided in parallel with the cathode diffusion regions 84, 84'. Moreover, in the $SiO_2$ film 56 (see FIG. 5) at the positions of the aperture sections of the P-gate diffusion regions 83, 83', apertures (unshown) surrounding the aperture sections are formed. Further, in the Al electrodes 86, 86' at the vicinity of the positions of the apertures of the $SiO_2$ film 56, aperture sections 164, 164' are formed so as to surround the apertures. Then, in the aperture sections 164, 164' of the Al electrodes 86, 86' and in the apertures of the $SiO_2$ film 56, rectangular Al electrodes 165, 165' are formed along the aperture sections 164, 164' of the Al electrodes 86, 86'. In this case, between the Al electrodes 86, 86' and the Al electrodes 165, 165', an electrically insulative space is formed.

As described above, the Al electrodes 165, 165' are in direct contact with the N-type silicon substrate (unshown) in the aperture sections of the P-gate diffusion regions 83, 83' via the apertures of the $SiO_2$ film 56. Thus, between the P-gate diffusion regions 83, 83' and the N-type silicon substrate, Schottky barrier diodes 166, 166' are formed. Herein, during commutation (the process in which a load current is attenuated corresponding to an AC voltage and the photothyristor is turned off in response to the holding current IH), the P-gate diffusion regions (base regions of NPN transistors Q2, Q4) 83, 83' are in the saturated state immediately before the photothyristor is turned off, and in this state, injection of minority carriers (holes) from the P-gate diffusion regions 83, 83' to the N-type silicon substrate is suppressed by the Schottky barrier diodes 166, 166'. Therefore, the residual carrier amount in the N-type silicon substrate decreases, which allows further enhancement of the commutation characteristic. However, there is such disadvantage that the luminous sensitivity is degraded since the light-receiving regions of the P-gate diffusion regions 83, 83' are decreased.

It is to be noted that in the foregoing description, Al is used as a metal material for producing the Schottky barrier diodes 166, 166'. However, it is acceptable to use metal materials such as Cr, Mo, Ti and Pt instead of Al.

Tenth Embodiment

A bidirectional photothyristor chip in the present embodiment has a structure in which a Schottky barrier diode is formed in the P-gate diffusion regions 143, 143' in the bidirectional photothyristor chip 152 of the eighth embodiment. It is to be understood that in the following description, component members identical to those in the bidirectional photothyristor chip 152 of the eighth embodiment are designated by reference numerals identical to those of the eighth embodiment and description thereof is omitted.

Figure 17:
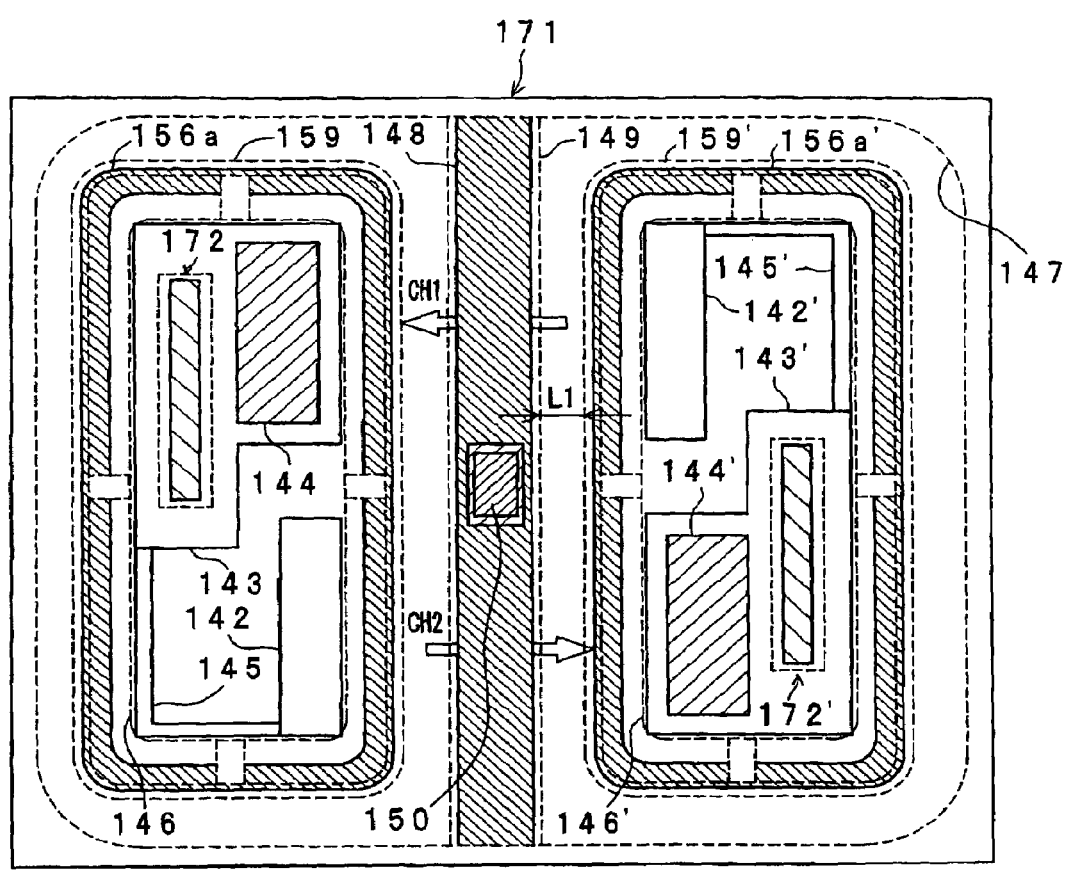
FIG. 17 is a pattern layout view showing a bidirectional photothyristor chip different from those of FIG. 1, FIG. 4, FIGS. 7 to 10, FIG. 12, FIG. 13 and FIG. 15.

FIG. 17 is a pattern layout view showing the schematic structure of the bidirectional photothyristor chip 171 in the present embodiment. Also, an equivalent circuit thereof is identical to that of FIG. 16.

In the present embodiment, as with the case of the bidirectional photothyristor chip 152 in the eighth embodiment, Al electrodes 146, 146' are formed into a minimum rectangular shape, and the Al electrodes 146, 146' are surrounded with transparent film guard rings formed from oxygen doped semi-insulating polycrystalline silicon films 156a, 156a' doped with phosphorus. This makes it possible to decrease a light shielding area of the junction regions between the P gate diffusion regions 143, 143' and the N-type silicon substrate 141, and thereby enhance the luminous sensitivity.

Further, in the regions of the P-gate diffusion regions 143, 143' where the cathode diffusion regions 144, 144' are not formed, Schottky barrier diodes 172, 172' having the same structure as that of the ninth embodiment are formed. Consequently, injection of minority carriers (holes) from the P-gate diffusion regions 143, 143' to the N-type silicon substrate is suppressed. As a result, the residual carrier amount in the N-type silicon substrate decreases, which allows further enhancement of the commutation characteristic.

Further, the oxygen doped semi-insulating polycrystalline silicon film 148 doped with phosphorus is formed across the CH1 and the CH2. This makes it possible to prevent such malfunction that the bidirectional photothyristor chip 171 is turned on without a light signal when a voltage pulse with a steep rise is applied to between the anode diffusion regions 142, 142' and the cathode diffusion regions 144, 144'. That is to say, according to the present embodiment, the dv/dt characteristic can be enhanced.

Therefore, according to the present embodiment, both the improvement of the commutation characteristic and the dv/dt characteristic and the enhancement of the luminous sensitivity may be fulfilled.

Eleventh Embodiment

Figure 18:
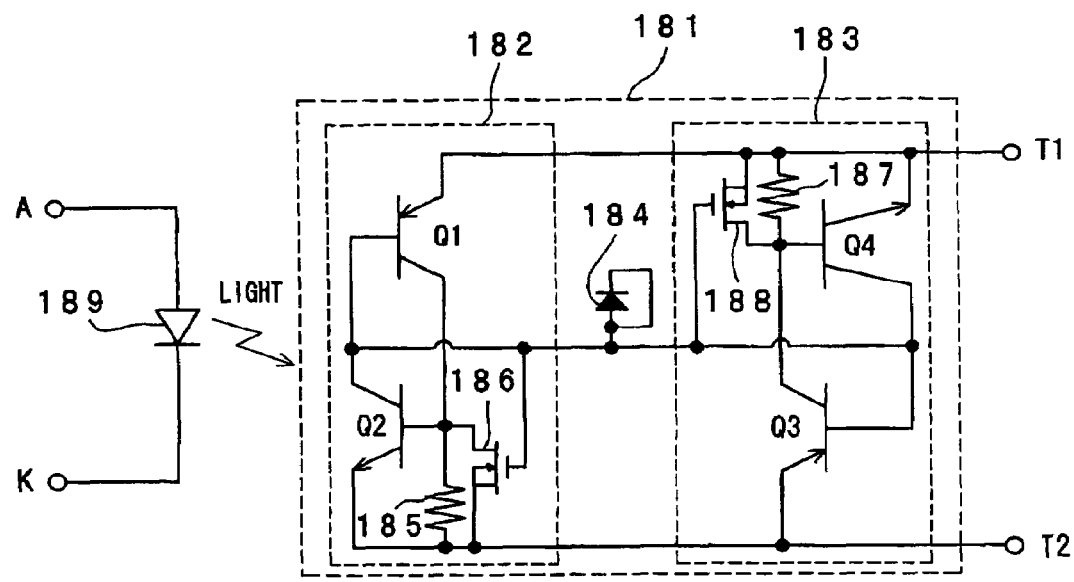
FIG. 18 is a equivalent circuit view showing a light-triggered coupler using a bidirectional photothyristor chip different from those of FIG. 1, FIG. 4, FIGS. 7 to 10, FIG. 12, FIG. 13, FIG. 15 and FIG. 17.

The present embodiment relates to a bidirectional photothyristor chip having zero crossing function. FIG. 18 is an equivalent circuit showing a light-triggered coupler using a bidirectional photothyristor chip of the present embodiment. As with the bidirectional photothyristor chip 51 in the second embodiment, the bidirectional photothyristor chip 181 of the present embodiment is composed of a CH1-side photothyristor 182 having a PNP transistor Q1 and a NPN transistor Q2 and a CH2-side photothyristor 183 having a PNP transistor Q3 and an NPN transistor Q4, wherein the bases of the PNP transistors Q1, Q3 are connected to a short diode 184.

An N-type FET (Field Effect Transistor) 186 is connected in parallel with a gate resistance 185 to between the base of the CH1-side NPN transistor Q2 and an electrode T2. Similarly, an N-type FET 188 is connected in parallel with a gate resistance 187 to between the base of the CH2-side NPN transistor Q4 and a electrode T1. While the gate of the N-type FET 186 is connected to the base of the PNP transistor Q1, the gate of the N-type FET 188 is connected to the base of the PNP transistor Q3. Reference numeral 189 denotes an LED.

Consequently, in the vicinity of a zero crossover point of a supply voltage applied as a bias to between the electrode T1 and the electrode T2, the N-type FETs 186, 188 are turned off and a base-emitter voltage according to a value of resistance of gate resistances 185, 187 is applied to the NPN transistors Q2, Q4. Upon reception of a light signal from the LED 189, the NPN transistors Q2, Q4 are turned on due to the contribution of photocurrent generated in the P-gate diffusion region. In a span of time away from the zero crossover point of the supply voltage, the N-type FETs 186, 188 are turned on and so base-emitter lines in the NPN transistors Qs, Q4 are short-circuited, which disables the NPN transistors Qs, Q4 from being turned on even though they receive a light signal.

Thus, a zero crossing function to turn on the photothyristors 182, 183 only in the vicinity of the zero crossover point of the supply voltage applied as a bias to between the electrode T1 and the electrode T2 is realized. Further, the bidirectional photothyristor chip 51 of the second embodiment which can enhance the commutation characteristic Icom to approx. 100 m Arms or more is used. This makes it possible to eliminate commutation failures of the light-triggered coupler and reduces malfunctions.

It is to be noted that it is also possible to form Schottky barrier diodes in between the base and the collector of each of the NPN transistors Q2 and Q4 in the structure of the bidirectional photothyristor chip 181 having zero crossing function shown in FIG. 18 so as to constitute a bidirectional photothyristor chip incorporating Schottky barrier diodes and having zero crossing function.

Moreover, the N-type FET 186, 188 may be replaced with other switching elements having control terminals without any problems.

Moreover, although the light-triggered coupler in the eleventh embodiment uses the bidirectional photothyristor chip 51 in the second embodiment, any one of the bidirectional photothyristor chips 31, 71, 81, 91, 120, 131, 152, 161, 171 in the first embodiment, and the third embodiment to the tenth embodiment may also be used.

Figure 19:
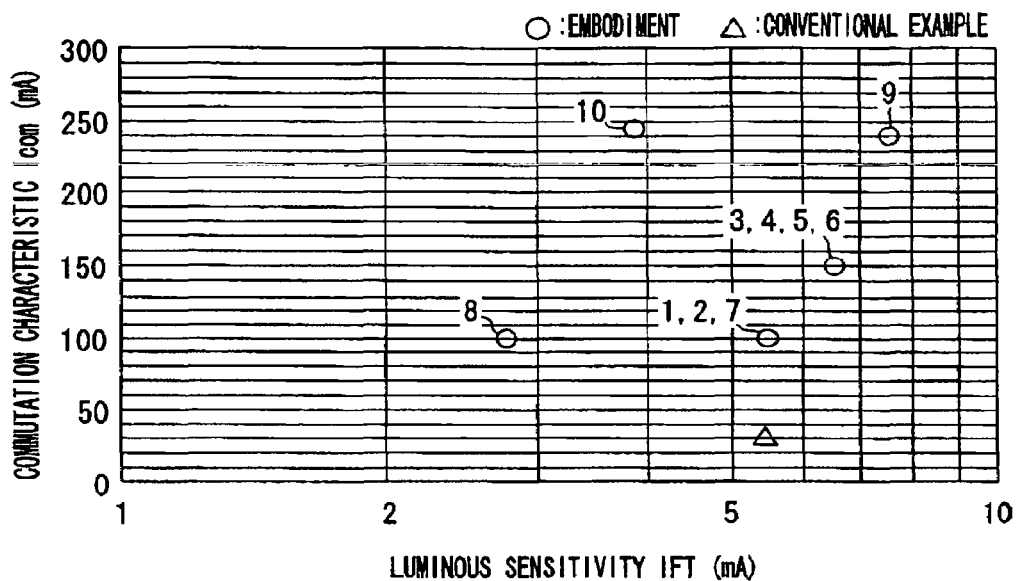
FIG. 19 is a view showing the relation between luminous sensitivity IFT and commutation characteristic Icom.
Figure 20:
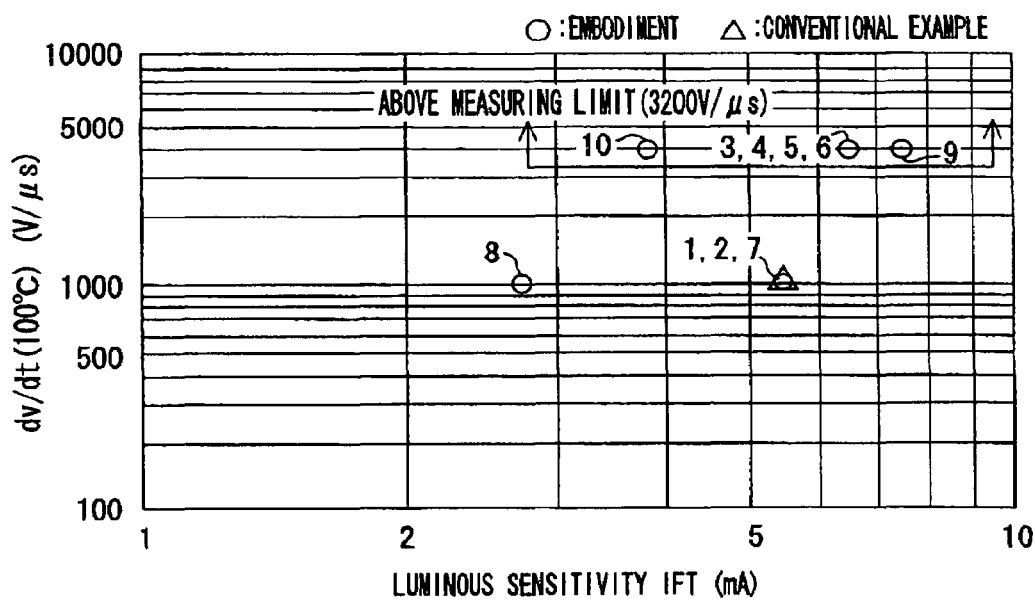
FIG. 20 is a view showing the relation between luminous sensitivity IFT and dv/dt characteristic.
Figure 21:
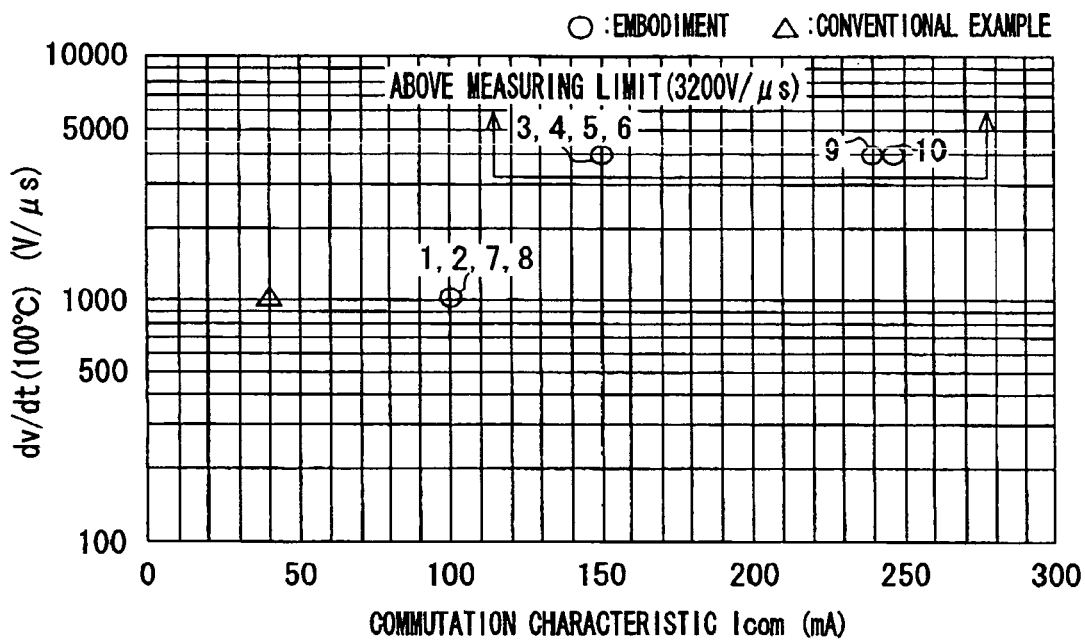
FIG. 21 is a view showing the relation between commutation characteristic Icom and dv/dt characteristic.
Figure 35:
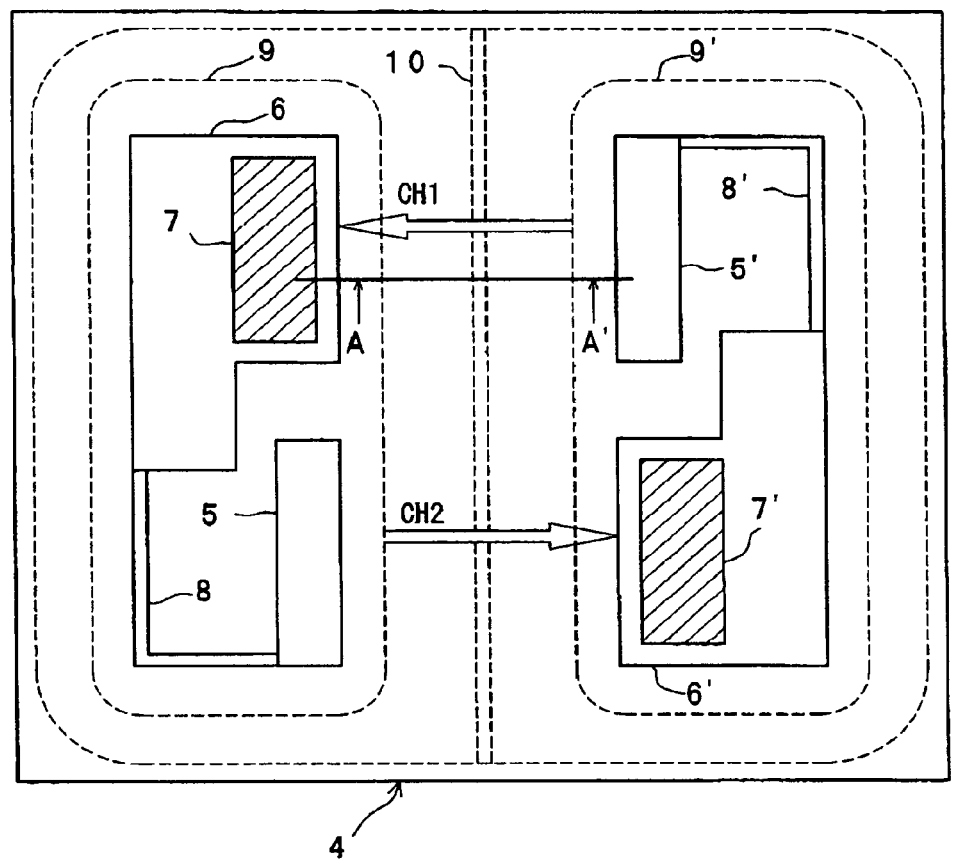
FIG. 35 is a pattern layout view showing a conventional bidirectional photothyristor chip.
Figure 36:
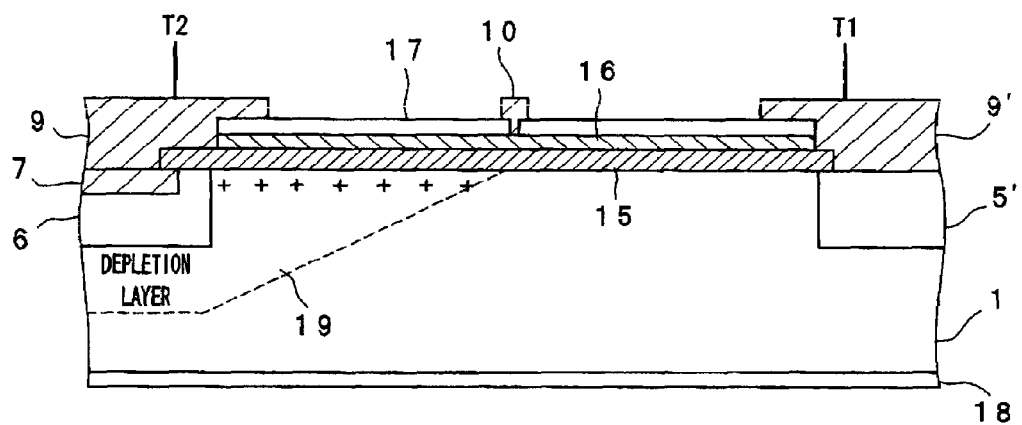
FIG. 36 is a cross sectional view taken along an arrow line A-A' in FIG. 35.
Figure 37:
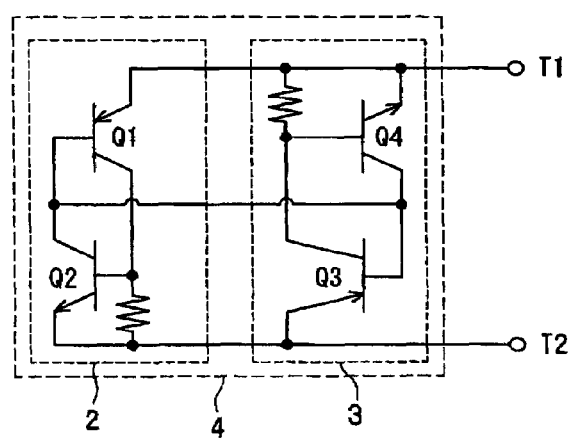
FIG. 37 is an equivalent circuit view showing the bidirectional photothyristor chip shown in FIG. 35.
Figure 38:
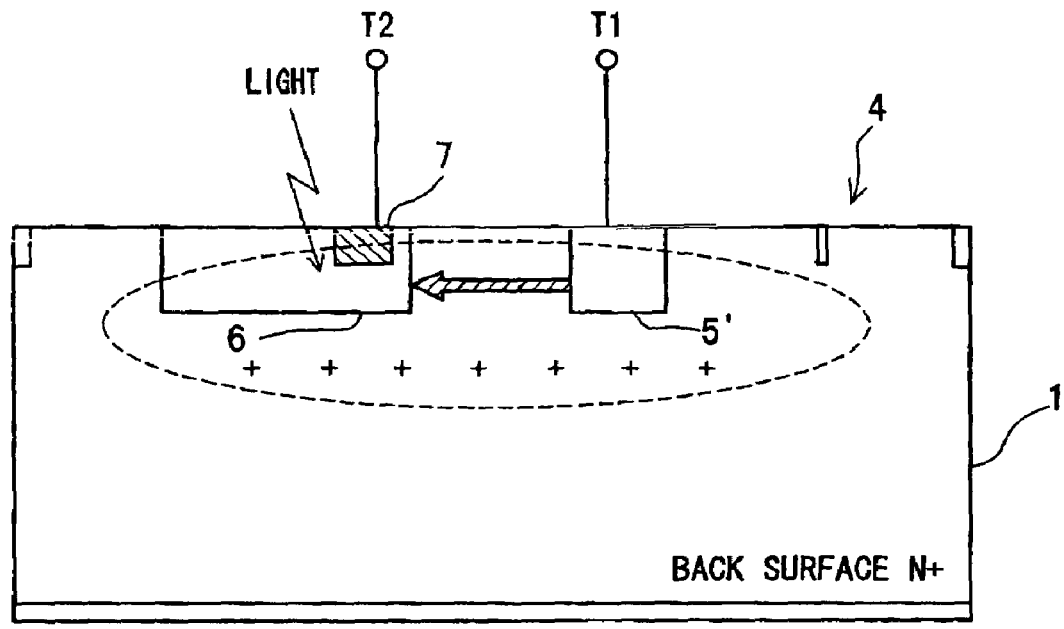
FIG. 38 is a cross sectional view showing the state that CH1 is turned on by input of light.
Figure 39:
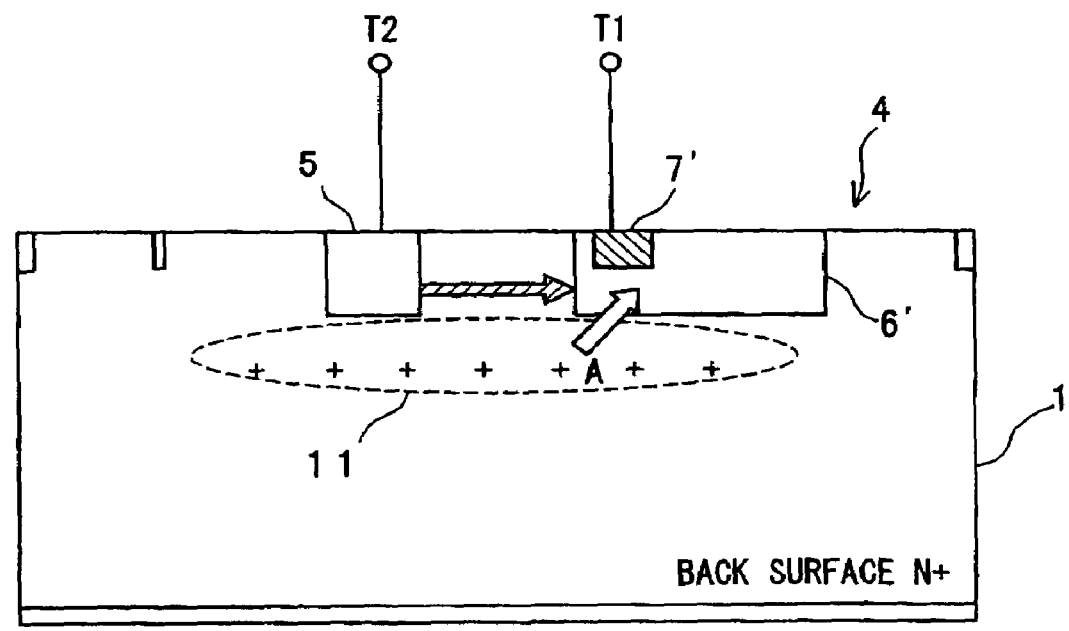
FIG. 39 is a cross sectional view showing the state that CH2 is turned on (commutation failure) without input of light.

FIG. 19 to FIG. 21 show the comparison between the commutation characteristic Icom, the dv/dt characteristic and the luminous sensitivity IFT with respect to the bidirectional photothyristor chips 31, 51, 71, 81, 91, 120, 131, 152, 161, 171 in the first embodiment to the tenth embodiment and the conventional bidirectional photothyristor chip 4 shown in FIG. 35 and FIG. 36.

FIG. 19 is a view showing the relation between the luminous sensitivity IFT and the commutation characteristic Icom. It is to be noted that number in the drawing represents embodiment number, i.e., the number "1" represents "first embodiment". Moreover, the conventional bidirectional photothyristor chip 4 is expressed as ∆. Table 1 shows values of the luminous sensitivity IFT (mA), the commutation characteristic Icom (mA) and the dv/dt (V/μm) characteristic with respect to the respective embodiments and the conventional bidirectional photothyristor chip 4. It is to be noted that the measuring limit of dv/dt is 3200V/μm, and those above the measuring limit are expressed as appropriate values of not less than 3200V/μm for easy understanding of the graphs in FIG. 20 and FIG. 21.

TABLE 1

|  |  | IFT | Icom | dv/dt (100° C.) |
|---|---|---|---|---|
| 1, 2, 7 | First, Second, Seventh Embodiments | 5.5 | 100 | 1000 |
| 3, 4, 5, 6 | Third, Fourth, Fifth, Sixth Embodiment | 6.5 | 150 | 3200 or more |
| 8 | Eighth Embodiment | 2.75 | 100 | 1000 |
| 9 | Ninth Embodiment | 7.5 | 240 | 3200 or more |
| 10 | Tenth Embodiment | 3.8 | 245 | 3200 or more |
| Conventional example |  | 5.5 | 40 | 1000 |

As is clear from FIG. 19, the commutation characteristic Icom in all the embodiments is larger than that in the conventional bidirectional photothyristor chip 4. This is because in all the embodiments, the oxygen doped semi-insulating polycrystalline silicon films 35a, 57a, 78, 88, 98, 122a, 124, 138, 138', 148, 156a, 156a' doped with phosphorus are formed in between the CH1-side P-gate diffusion regions 23, 43, 73, 83, 93, 113, 133, 143 and the CH2-side P-gate diffusion regions 23', 43', 73', 83', 93', 113', 143'. Consequently, the silicon interface state (Qss) between the CH1-side P-gate diffusion region and the CH2-side P-gate diffusion region on the N-type silicon substrate increases, which allows disappearance of holes or minority carriers in the N-type silicon substrate in the region of the oxygen doped semi-insulating polycrystalline silicon film doped with phosphorus, and allows promotion of reduction in the lifetime of the holes. Therefore, the commutation characteristic is enhanced as a result.

Moreover, in the eighth and tenth embodiments, the luminous sensitivity value IFT decreases. This is because the Al electrode 146, 146' are formed into a minimum rectangular shape capable of offering complete coverage to the P gate diffusion regions, the gate resistances and the anode diffusion regions, and the Al electrodes 146, 146' are surrounded with transparent film guard rings formed from oxygen doped semi-insulating polycrystalline silicon films 156a, 156a' doped with phosphorus. This makes it possible to decrease a light shielding area around the Al electrodes 146, 146' and to enhance the luminous sensitivity as a result.

FIG. 20 is a view showing the relation between the luminous sensitivity IFT and the dv/dt characteristic. It is to be noted that number in the drawing represents embodiment number. As shown in FIG. 20, the dv/dt characteristic increases in the third, fourth, fifth, sixth, ninth and tenth embodiments. This is because in the third, fourth, fifth, sixth, ninth and tenth embodiments, the oxygen doped semi-insulating polycrystalline silicon films 78, 88, 98, 122a, 122a', 124, 124', 148, 156a, 156a' doped with phosphorus are formed across the CH1 and the CH2 on the N-type silicon substrate. Therefore, when a voltage pulse with a steep rise is applied to between the anode diffusion regions and the cathode diffusion regions, a displacement current is suppressed from flowing to the P-gate diffusion regions which are intended to receive a light signal. As a result, such malfunction that the bidirectional photothyristors 71, 81, 91, 120, 161, 171 are turned on without a light signal will not occur, and so the dv/dt characteristic can be enhanced.

FIG. 21 is a view showing the relation between the commutation characteristic Icom and the dv/dt characteristic. It is to be noted that number in the drawing represents embodiment number. As shown in FIG. 21, the commutation characteristic value Icom increases in all the embodiments, and the dv/dt characteristic value increases in the third, fourth, fifth, sixth, ninth and tenth embodiments.

Twelfth Embodiment

The present embodiment relates to an SSR using a light-triggered coupler composed of the bidirectional photothyristor chip in the first to the eleventh embodiment and an LED.

Figure 22:
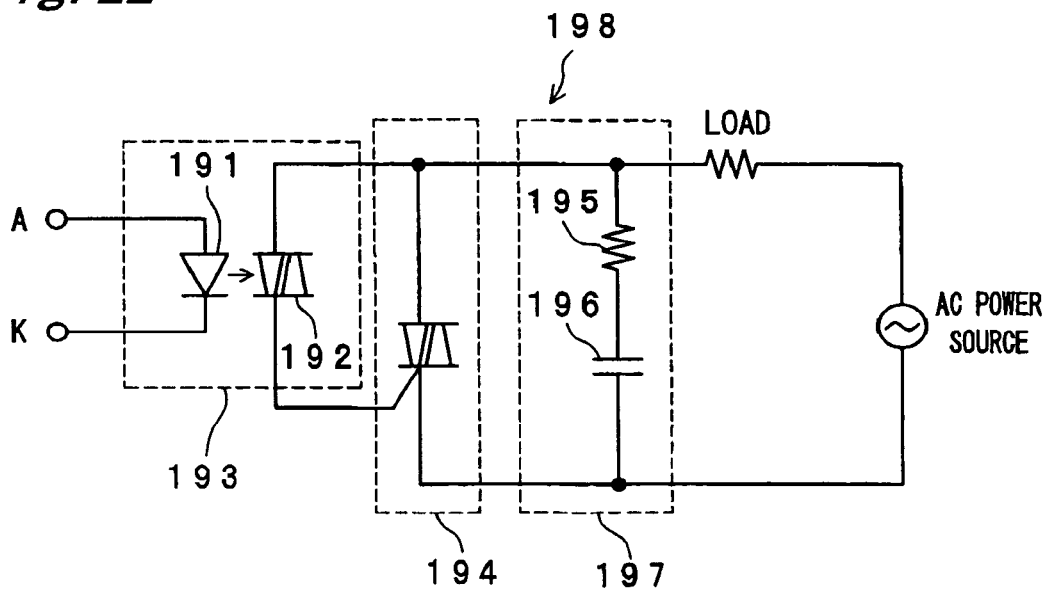
FIG. 22 is an equivalent circuit view showing a SSR (Solid State Relay)

FIG. 22 shows an equivalent circuit of the SSR. The SSR 198 is composed of a light-triggered coupler 193 made up of a light-emitting element 191 such as LEDs and a bidirectional photothyristor 192 for triggering, a bidirectional thyristor (main thyristor) 194 for actual control of a load, and a snubber circuit 197 made up of a resistor 195 and a capacitance 196, for example. As a bidirectional photothyristor 192 for triggering, the bidirectional photothyristor chips 31, 51, 71, 81, 91, 120, 131, 152, 161, 171, 181 in the first to eleventh embodiments are used. In the circuit constitution, the main thyristor 194 exercises actual control over a load current, while the bidirectional photothyristor 192 is used to light-trigger the main thyristor 194.

In the present embodiment, as the bidirectional photothyristor 192 for triggering, the bidirectional photothyristor chips 31, 51, 71, 81, 91, 120, 131, 152, 161, 171, 181 in the first to eleventh embodiments which can enhance the commutation characteristic Icom to approx. 100 mArms or more are used. This makes it possible to obtain the SSR 198 using the light-triggered coupler 193 free from commutation failures and having less malfunctions.

Further, if bidirectional photothyristor chips 71, 81, 91, 120, 161, 171 with the increased dv/dt characteristic in the third to sixth embodiments, the ninth embodiment and the tenth embodiment are used as the bidirectional photothyristor 192 for triggering, the SSR 198 having further less malfunctions can be obtained. Further, if the bidirectional photothyristor chips 152, 171 with the enhanced commutation characteristic and the increased luminous sensitivity in the eighth embodiment and the tenth embodiment are used as the bidirectional photothyristor 192 for triggering, the SSR 198 with higher luminous sensitivity can be obtained.

Thirteenth Embodiment

The bidirectional photothyristor having zero crossing function as shown in the eleventh embodiment has two more peculiar issues in addition to the aforementioned issues for the general non-zero crossing type bidirectional thyristors.

First, in the equivalent circuit shown in FIG. 18, it is necessary to increase the current amplification factor Hfe (npn) of the NPN transistors Q2, Q4 about five to ten times larger than that of the non-zero crossing type bidirectional thyristor. The reason is as follows. Due to such time restriction that the circuit is triggered only at voltages not more than the vicinity of a zero crossover point, high-speed performance response is necessary. Particularly, in the case where an inductive load exists in the AC circuit that is subjected to switching when the thyristor is used as a photothyristor constituting the SSR, operation delay may be caused by phase shift, which may disable the circuit from being turned on. However, the noise withstand level has a strong correlation with the current amplification factor Hfe (npn), which causes a problem that the higher current amplification factor Hfe (npn) decreases the noise resistance.

Secondly, in the case where the N-type FET 186, 188 are constituted of MOS (Metal-Oxide Semiconductor) FETs, it is necessary to suppress the operation of a transistor parasitic on the MOSFETs so as to ensure complete operation of the MOSFETs even when a short pulsed noise voltage is applied.

As described above, the zero crossing function is to add N-channel enhancement MOSFETs 186, 188 to between the P gate and the cathode of the photothyristors 182, 183 and promote short-circuit between the P gate and the cathode so as to disable the photothyristors 182, 183 from operating at the AC voltages of about 30V or above. This places such limitation that the triggering occurs only at low voltages, and this in turns limits the level of an operative current which flows upon triggering. Therefore, having the zero crossing function has a merit of offering safety in the step of designing control circuits.

Further, in addition to having the zero crossing function, the MOSFETs 186, 188 also function as overvoltage protection circuits for preventing malfunctions by short-circuiting the line between the P gate and the cathode of the photothyristors 182, 183 even in the case where a noise voltage whose dv/dt is as high as 1 KV/μsec. and which tends to be generated at power-on of the device is accidentally applied. However, even if the MOSFETs 186, 188 are incorporated, the malfunction is sometimes hard to prevent when a pulsed noise voltage is applied.

The pulsed noise voltage herein refers to a pulsed noise voltage which is superposed on the AC line and has a steep and short rise. It is to be noted that the conditions of the state of being pulsed are: the pulse width of 0.1 μsec. to 1.0 μsec.; and the voltage of about 4 KV or less. Therefore, in the case where such a short pulsed voltage is accidentally applied, the MOSFETs 186, 188 fail to fully function as overvoltage protections, and during this time, the thyristors 182, 183 malfunction, causing deterioration of the noise withstand level.

In the state that a voltage with a steep rise is applied, a displacement current also flows into a route of a parasitic transistor composed of an N-type substrate, a P-type well and an N-type drain diffusion of the MOSFETs 186, 188. The displacement current is amplified by the parasitic transistor and flows into the P gates of the thyristors 182, 183 through an interconnection. The current acts as a trigger current of the thyristors 182, 183, by which the malfunction of the bidirectional photothyristor is caused.

The thirteenth to eighteenth embodiments are presented for solving the issues peculiar to the bidirectional photothyristor having zero crossing function, the issues including: the current amplification factor Hfe (npn) of the NPN transistors Q2, Q4 increased for gaining high-speed performance response degrades the noise resistance; and a displacement current flowing into the parasitic transistor formed in the MOSFETs 186, 188 causes malfunctions.

Figure 23:
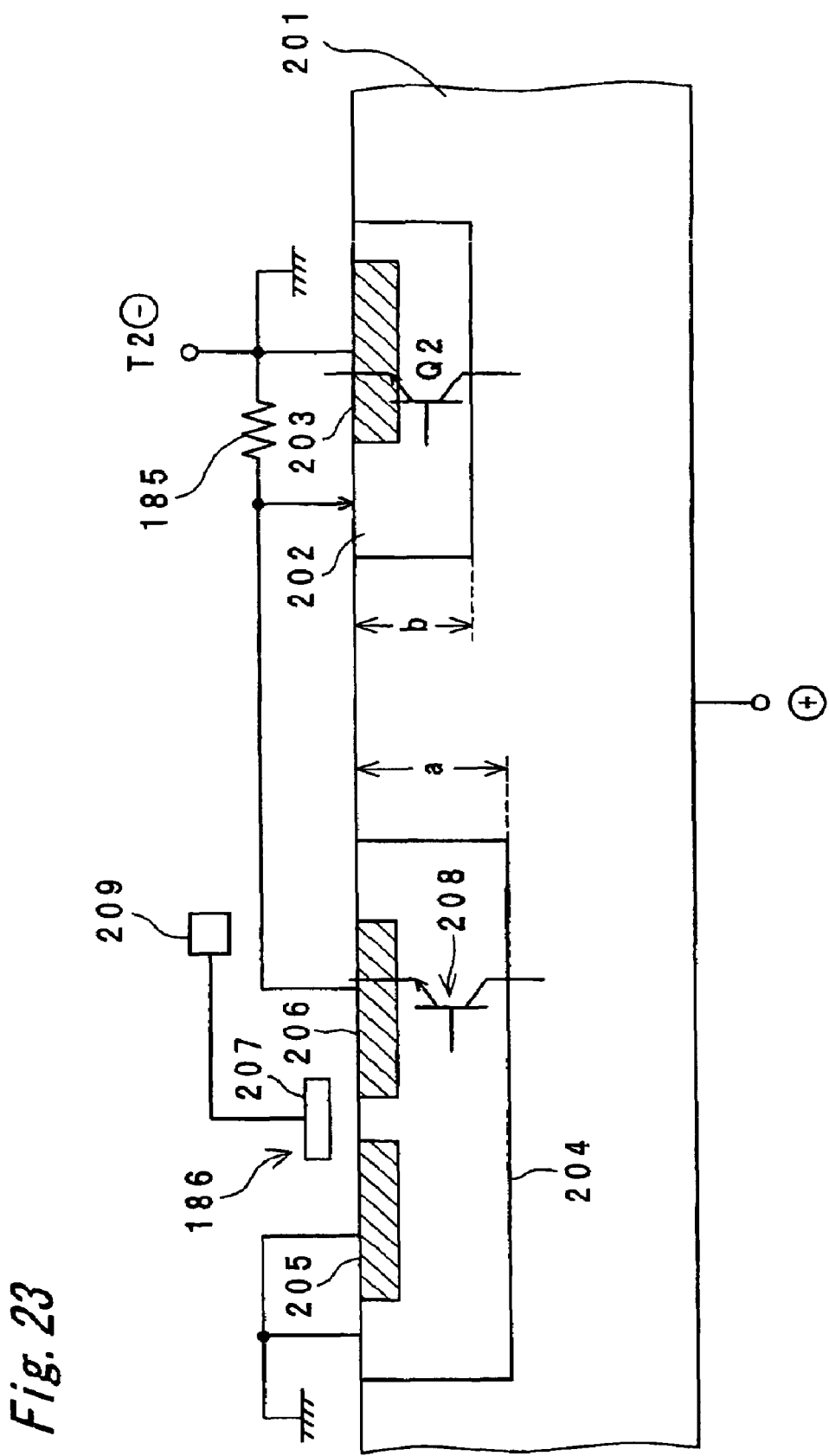
FIG. 23 is a cross sectional view showing a portion of N-type MOSFET in the bidirectional photothyristor chip having zero crossing function shown in FIG. 18.

FIG. 23 is a cross sectional view showing a portion which includes the NPN transistor Q2 and the N-type MOSFET 186 which fulfills the zero crossing function in the photothyristor 182 in the bidirectional photothyristor chip 181 having zero crossing function shown in FIG. 18. A P-gate diffusion region 202 formed on the surface of an N-type silicon substrate 201, a cathode diffusion region (N type) 203 formed on the surface of the P-gate diffusion region 202 and the N-type silicon substrate 201 constitute an NPN transistor Q2. Further, on the surface of the N-type silicon substrate 201, a P-well diffusion region 204 is formed, and on the surface of the P-well diffusion region 204, a source diffusion region (N type) 205 and a drain diffusion region (N type) 206 of the N-type MOSFET 186 are formed. It is to be noted that a gate region 207 connected to a VP (Voltage Probe) circuit 209 for controlling gate voltage is described in a simplified manner.

As described in the eleventh embodiment, the cathode diffusion region 203 is connected to one end of the gate resistance 185 and to the electrode T2 and is also grounded. Also, the P-well diffusion region 204 and the source diffusion region 205 are grounded. Moreover, the other end of the gate resistance 185 is connected to the P-gate diffusion region 202 and the drain diffusion region 206.

In the present embodiment, the depth a of the P-well diffusion region 204 is formed deeper than the depth b of the P-gate diffusion region 202, for example, 1.3 times as large as the depth b of the P-gate diffusion region 202. Thus, the current amplification factor Hfe of the parasitic transistor 208, which is formed from the drain diffusion region 206 of the N-type MOSFET 186, the P-well diffusion region 204 and the N-type silicon substrate 201, may be decreased lower than that of the normal bidirectional photothyristor chip having zero crossing function whose depth of the P-well diffusion region is smaller than the depth of the P-gate diffusion region.

Therefore, when a short pulsed inverse noise voltage with a pulse width of 0.1 μsec. to 1.0 μsec. and a voltage of about 4 KV or less is applied to between the P-well diffusion region 204 and the N-type silicon substrate 201, the displacement current which transiently flows into the parasitic transistor 208 via a junction capacitance between the P-well diffusion region 204 and the N-type silicon substrate 201 is suppressed from being amplified. More particularly, accordingly to the present embodiment, it becomes possible to suppress the displacement current which conventionally flows into the P-gate diffusion region 202 and acts as a trigger current and thereby it becomes possible to increase pulse noise withstand level which is a maximum value of the pulsed noise voltage at which the photothyristor 182 can operate normally.

In the meantime, if the depth a of the P-well diffusion region 204 becomes larger than 1.3 times the depth b of the P-gate diffusion region 202, then it becomes necessary to increase the diffusion temperature and to prolong the diffusion time in the step of forming the P-well diffusion region 204, and this is not desirable. Therefore, the depth a of the P-well diffusion region 204 is preferably not less than 1 time and not more than 1.3 times as large as the depth b of the P-gate diffusion region 202.

Fourteenth Embodiment

Figure 24A:
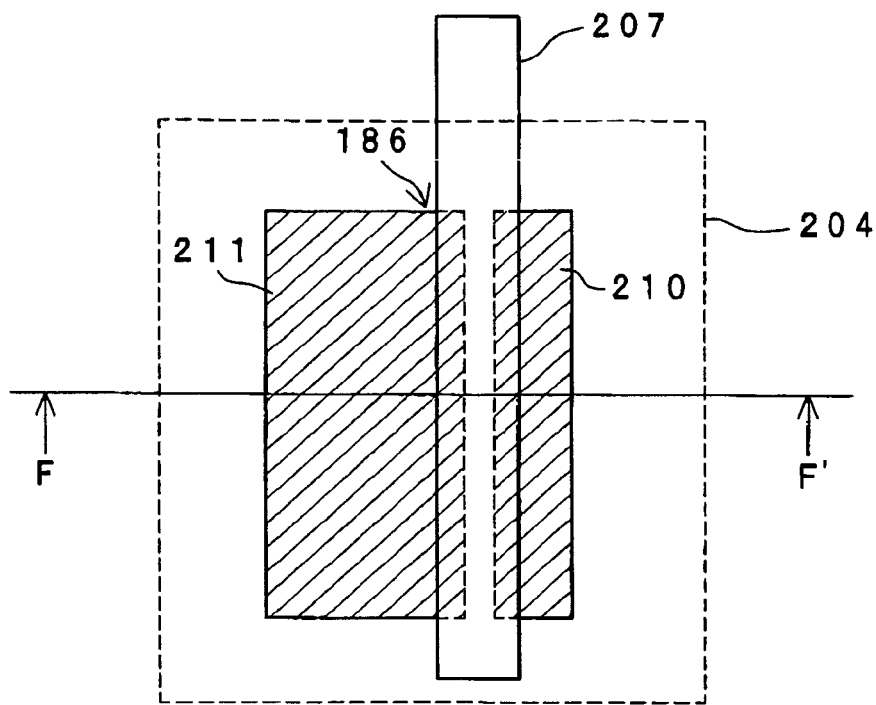
FIGS. 24A and 24B are a cross sectional view and a plane view showing an N-type MOSFET different from that of FIG. 23.
Figure 24B:
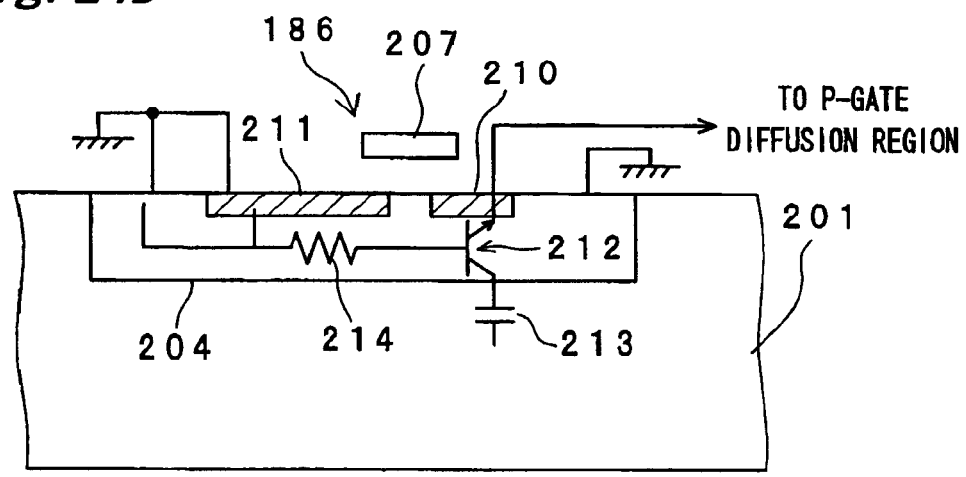

FIG. 24A is a plane view showing another N-type MOSFET 186 which fulfills the zero crossing function in the photothyristor 182 of the bidirectional photothyristor chip 181 having zero crossing function shown in FIG. 18. FIG. 24B is a cross sectional view taken along an arrow line F-F' in FIG. 24A. Component members identical to those in the thirteenth embodiment are designated by identical reference numerals. In the present embodiment, an area of a drain diffusion region (N type) 210 formed on the surface of the P-well diffusion region 204 in the N-type MOSFET 186 is made smaller than an area of a source diffusion region (N type) 211.

It is to be noted that the drain diffusion region 210, the P-well diffusion region 204 and the N-type silicon substrate 201 form a parasitic transistor 212, and a capacitance component of the N-type silicon substrate 201 forms a parasitic capacitance 213 connected to the collector of the parasitic transistor 212, while a resistance component of the P-well diffusion region 204 forms a parasitic resistance (series resistance) 214 connected to the base of the parasitic transistor 212. The parasitic capacitance 213 is to determine the value of the displacement current which tends to flow into the parasitic transistor 212, and since the smaller capacitance value decreases a value of the displacement current, the capacitance value as small as possible is preferable. Moreover, the series resistance 214 is to determine a ratio of splitting the displacement current flowing into the parasitic transistor 212 with routes connected to the GND (a route via the P-well diffusion region 204 and a route via the P-well diffusion region 204 and the source diffusion region 211), and the resistance value as small as possible (the dopant level of the P-well diffusion region 204 is high, and the distance to the GND is short) is preferable.

The displacement current which is generated in the junction capacitance between the N-type silicon substrate 201 and the P-well diffusion region 204 and flows into the parasitic transistor 212 is split into three routes as shown below:

(a) a route connected to the GND via the P-well diffusion region 204

(b) a route connected to the GND via the P-well diffusion region 204 and the source diffusion region 211

(c) a route to the P-gate diffusion region via the drain diffusion region 210

A ratio of splitting the displacement current into the routes is determined by an area ratio among the P-well diffusion region 204, the source diffusion region 211 and the drain diffusion region 210, and by a resistance value of the series resistance 214.

In the present embodiment, the emitter area of the parasitic transistor 212 is reduced so as to reduce the collector current of the parasitic transistor 212. With this arrangement, as described above, a ratio of part of the displacement current split into the source diffusion region 211 (GND potential) increases, which enables the displacement current to flow easily into the source diffusion region 211. As a result, an influence of the current amplification factor Hfe of the parasitic transistor 212 on the displacement current can be reduced so as to increase the pulse noise withstand level.

Fifteenth Embodiment

Figure 25A:
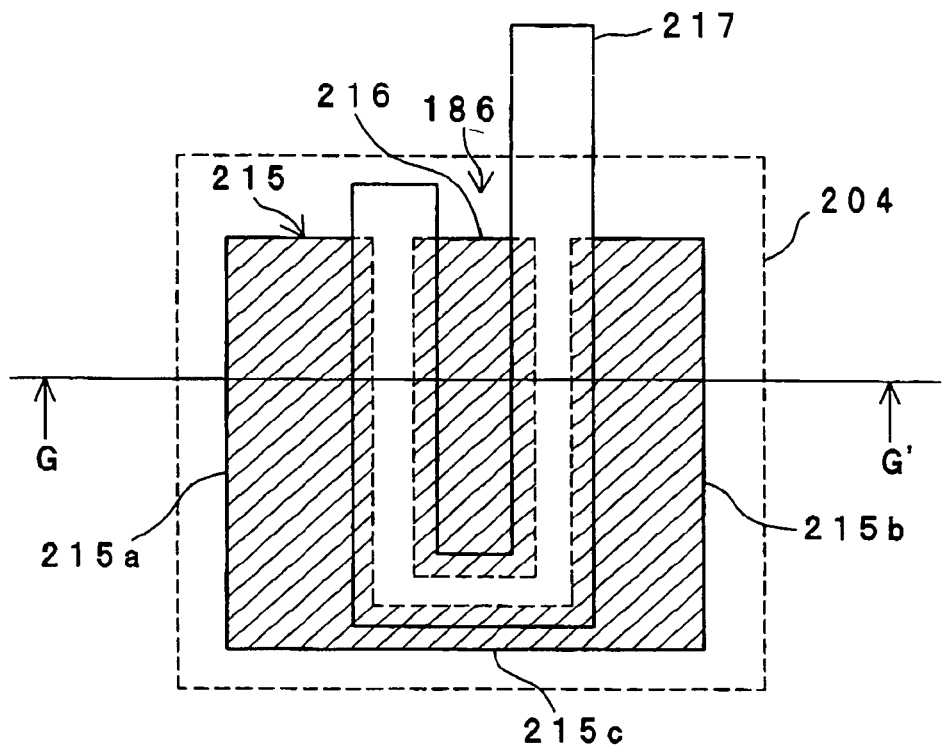
FIGS. 25A and 25B are a plane view and a cross sectional view showing an N-type MOSFET different from those of FIG. 23 and FIGS. 24A and 24B.
Figure 25B:
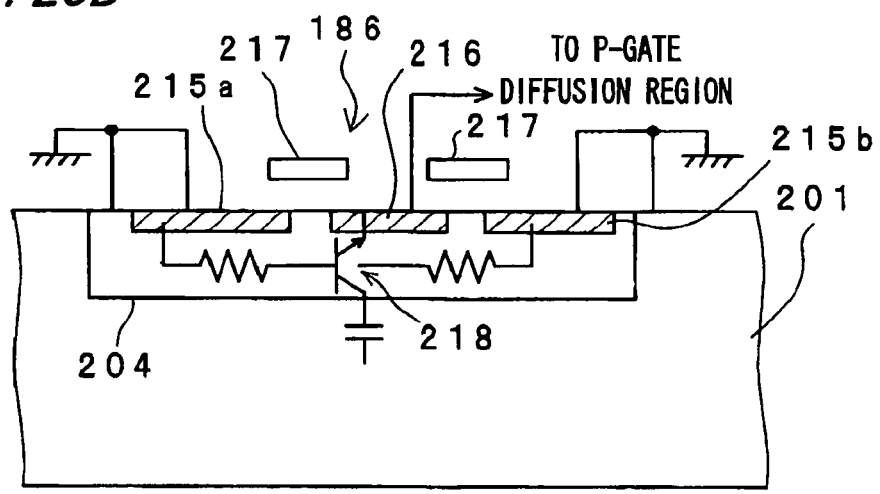

FIG. 25A is a plane view showing another N-type MOSFET 186 which fulfills the zero crossing function in the photothyristor 182 of the bidirectional photothyristor chip 181 having zero crossing function shown in FIG. 18. FIG. 25B is a cross sectional view taken along an arrow line G-G' in FIG. 25A. Component members identical to those in the thirteenth embodiment are designated by identical reference numerals.

In the present embodiment, as shown in FIGS. 25A and 25B, ends of two diffusion regions 215a, 215b arrayed in parallel on the surface of the P-well diffusion region 204 are connected to each other by a connected diffusion region 215 to form a plane U-shaped source diffusion region (N type) 215, and one drain diffusion region (N type) 216 is formed in between the two diffusion regions 215a, 215b of the source diffusion region 215 so as to be in parallel with the diffusion regions 215a, 215b. Thus, a structure of surrounding the drain diffusion region 216 with the source diffusion region 215 is formed. Each of gate regions 217 is formed from Al on an interval between the drain diffusion region 216 and the source diffusion region 215 in such a way that edge portions of each of the gate regions 217 overlap with edge portions of the drain diffusion region 216 and the source diffusion region 215. In the present embodiment as with the case of the fourteenth embodiment, an area of the drain diffusion region 216 is made smaller than an area of each of the diffusion regions 215a, 215b of the source diffusion region 215.

According to the present embodiment, as with the case of the fourteenth embodiment, the emitter area of the parasitic transistor 218 in the N-type MOSFET 186 can be reduced so as to reduce the collector current of the parasitic transistor 218. Further, an area ratio of the source diffusion region 215 to the drain diffusion region 216 is made larger than that in the case of the fourteenth embodiment, and the source diffusion region 215 is formed so as to surround the drain diffusion region 216. Consequently, a ratio of part of the displacement current split into the source diffusion region 215 (GND potential) can be increased considerably as compared to the case of the fourteenth embodiment. As a result, an influence of the current amplification factor Hfe of the parasitic transistor 218 on the displacement current can be reduced further so as to increase the pulse noise withstand level. Moreover, if the length in the extending direction of the gate region 217 on the P-well diffusion region 204 is, for example, set to be identical to that in the fourteenth embodiment, the length of the gate regions 217 and the length of the source diffusion region 215 can be almost doubled, respectively. Therefore, if the length of the gate regions 217 and the length of the source diffusion region 215 is set to be equal to that in the fourteenth embodiment, miniaturization of the bidirectional photothyristor chip 181 can be achieved.

Sixteenth Embodiment

Figure 26A:
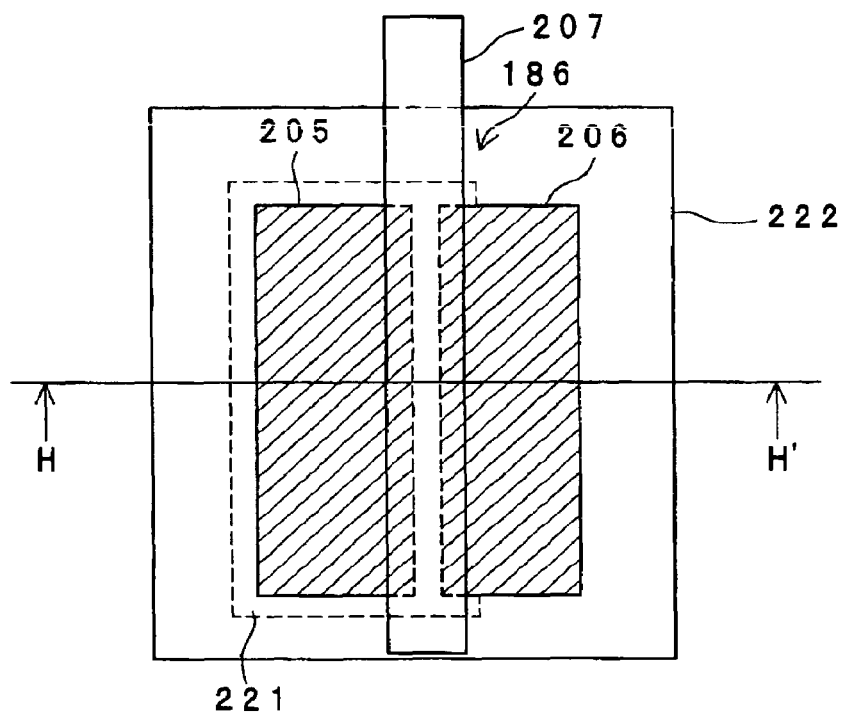
FIGS. 26A and 26B are a plane view and a cross sectional view showing an N-type MOSFET different from those of FIGS. 23 to 25B.
Figure 26B:
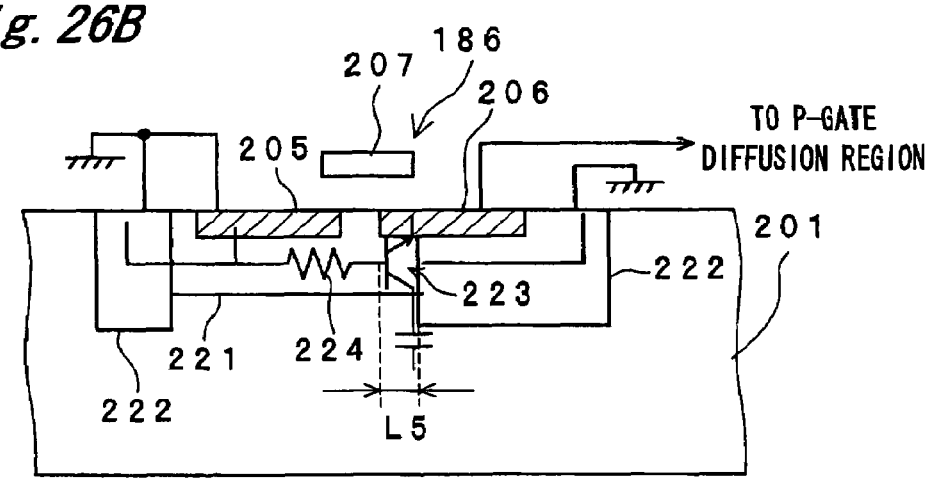

FIG. 26A is a plane view showing another N-type MOSFET 186 which fulfills the zero crossing function in the photothyristor 182 of the bidirectional photothyristor chip 181 having zero crossing function shown in FIG. 18. FIG. 26B is a cross sectional view taken along an arrow line H-H' in FIG. 26A. Component members identical to those in the thirteenth embodiment are designated by identical reference numerals.

In the present embodiment, as shown in FIGS. 26A and 26B, the surroundings of the P-well diffusion region 204 in the thirteenth embodiment are replaced with a P+ compensation diffusion region 222. More particularly, in FIGS. 26A and 26B, the source diffusion region 205 of the N-type MOSFET 186 is formed in the surface of a P-well diffusion region 221, whereas the drain diffusion region 206 is formed such that only a width L5 thereof is positioned in the P-well diffusion region 221. Around the P-well diffusion region 221 on the surface of the N-type silicon substrate 201, the P+ compensation diffusion region 222 connected to the GND is formed. Thus, a region of the drain diffusion region 206 which does not overlap with the P-well diffusion region 221 is surrounded with the P+ compensation diffusion region 222. Herein, the overlap length L5 of the drain diffusion region 206 with the P-well diffusion region 221 is 10 µm. Moreover, the P-type dopant level in the P+ compensation diffusion region 222 is $1\times10^{19}$ cm$^{-3}$. It is to be noted that the P-type dopant level in the P-well diffusion region 221 is $5\times10^{16}$ cm$^{-3}$. Moreover, the gate region 217 is formed from Al.

As is described, in the present embodiment, the P+ compensation diffusion region 222 is formed so as to be connected to the periphery of the P-well diffusion region 221 in the N-type MOSFET 186, and the source diffusion region 205 is formed inside the P-well diffusion region 221, while the drain diffusion region 206 is formed so that a part thereof is in contact with the P+ compensation diffusion region 222. Therefore, the overlap length of the drain diffusion region 206 with the P-well diffusion region 221, i.e., the length L5 from the channel end of the N-type MOSFET 186 to the P+ compensation diffusion region 222, can be set at as small as about 10 µm so that the base region constituting a parasitic transistor 223 can be narrowed. As a result, considerable reduction in the collector current of the parasitic transistor 223 can be achieved.

Moreover, around the P-well diffusion region 221, the P+ compensation diffusion region 222 connected to the P-well diffusion region 221 is formed and is connected to the GND. Therefore, a resistance value of the series resistance 224 connected to the base of the parasitic transistor 223 can be decreased.

Consequently, a ratio of part of the displacement current split into the route connected to the GND can be considerably increased as compared to the case of the fourteenth embodiment. As a result, an influence of the current amplification factor Hfe of the parasitic transistor 223 on the displacement current can be reduced further to increase the pulse noise withstand level.

It is to be noted that since the higher P-type dopant level in the P+ compensation diffusion region 222 decreases a resistance value of the series resistance 224, the higher level is effective. It is to be noted that the P+ compensation diffusion region 222 compensates the surface concentration level of the P-well diffusion region 221 having the P-type dopant level of $5\times10^{16}$ cm$^{-3}$, and so the P-type dopant level needs to be not less than $1\times10^{17}$ cm$^{-3}$. Moreover, in consideration of practical manufacturing methods, the preferable P-type dopant level is considered to be about $1\times10^{19}$ cm$^{-3}$.

If the overlap length, i.e., the distance L5 from the channel end of the N-type MOSFET 186 to the P+ compensation diffusion region 222, exceeds 10 µm, it becomes impossible to narrow the base region constituting the parasitic transistor 223, and so the effects of the present embodiment cannot be achieved. Moreover, if it falls short of 0 µm, then the channel level of the N-type MOSFET 186 (i.e., the threshold voltage of the N-type MOSFET 186) is affected. Therefore, the overlap length L1 needs to be 0 µm or more and not more than 10 µm.

Seventeenth Embodiment

Figure 27A:
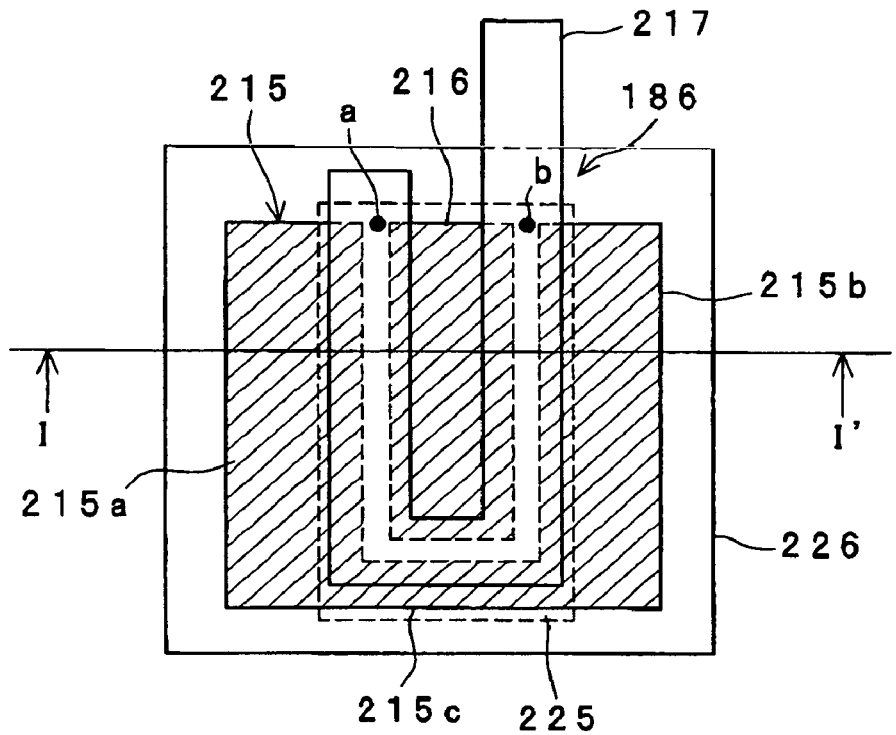
FIGS. 27A and 27B are a plane view and a cross sectional view showing an N-type MOSFET different from those of FIGS. 23 to 26B.
Figure 27B:
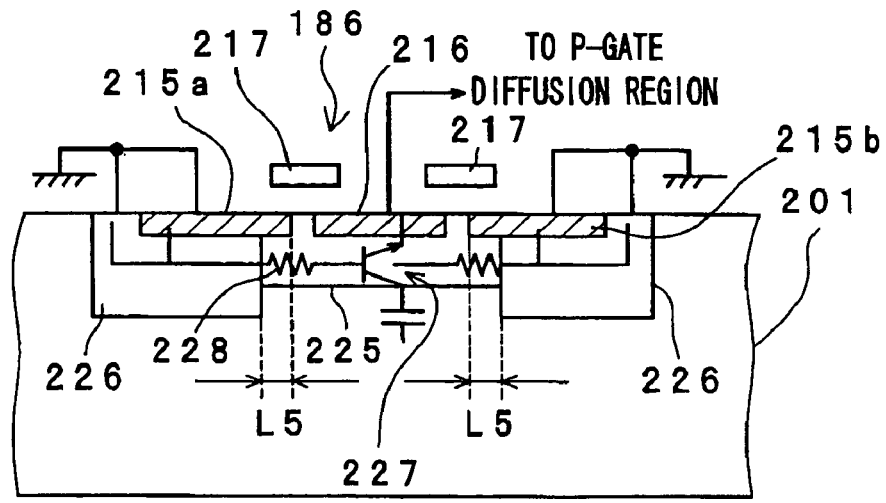

FIG. 27A is a plane view showing another N-type MOSFET 186 which fulfills the zero crossing function in the photothyristor 182 of the bidirectional photothyristor chip 181 having zero crossing function shown in FIG. 18. FIG. 27B is a cross sectional view taken along an arrow line I-I' in FIG. 27A. Component members identical to those in the thirteenth embodiment are designated by identical reference numerals.

The N-type MOSFET 186 in the present embodiment has a structure employing both the fifteenth embodiment and the sixteenth embodiment. More particularly, in FIGS. 27A and 27B, the drain diffusion region 216 is formed on the surface of a P-well diffusion region 225. Moreover, the source diffusion region 215 is formed such that one side portion of the diffusion region 215a overlaps with one side portion of the P-well diffusion region 225 by a width L5, while one side portion of the diffusion region 215b overlaps with the other side portion of the P-well diffusion region 225 by the width L5, and a connected diffusion region 215c is formed in the surface of the P-well diffusion region 225. Around the P-well diffusion region 225 on the surface of the N-type silicon substrate 201, a P+ compensation diffusion region 226 connected to the GND is formed. Thus, a region of the source diffusion region 215 which does not overlap with the P-well diffusion region 225 is surrounded with the P+ compensation diffusion region 226 and is in contact with the P+ compensation diffusion region 226.

Herein, a channel region of the N-type MOSFET 186 between the source diffusion region 215 and the drain diffusion region 216 in FIG. 27A is formed along a route running around the drain diffusion region 216 from a point a to a point b, and its length is 600 μm. Moreover, the overlap length L5 of the source diffusion region 215 with the P-well diffusion region 225 is 10 μm. Moreover, the P-type dopant level in the P+ compensation diffusion region 226 is $1 \times 10^{19}$ cm$^{-3}$. It is to be noted that the P-type dopant level in the P-well diffusion region 225 is $5 \times 10^{16}$ cm$^{-3}$. Also, the gate region 217 is formed from Al.

As is described, according to the present embodiment, as with the case of the fifteenth embodiment, the emitter area of a parasitic transistor 227 can be reduced so as to reduce the collector current of the parasitic transistor 227. Further, the source diffusion region 215 has a larger area ratio than that of the drain diffusion region 216 and is formed so as to surround the drain diffusion region 216. Consequently, a ratio of part of the displacement current split into the route to the source diffusion region 215 (GND potential) can be considerably increased as compared to the case of the fourteenth embodiment. Moreover, as with the case of the sixteenth embodiment, around the P-well diffusion region 225, the P+ compensation diffusion region 226 connected to the P-well diffusion region 225 is formed and is connected to the GND. Therefore, a resistance value of a series resistance 228 connected to the base of the parasitic transistor 227 can be decreased. As a result, an influence of the current amplification factor Hfe of the parasitic transistor 227 on the displacement current can be reduced further to increase the pulse noise withstand level.

Further, the source diffusion region 215 of the N-type MOSFET 186 is formed into the "U" shape so as to surround the drain diffusion region 216, which secures 600 μm width of the channel region. Therefore, as compared to the case where the source diffusion region 211 is formed into the rectangular shape as in the case of the fourteenth embodiment, the ON-resistance can be reduced by increasing the width of the channel region with respect to the area of the N-type MOSFET 186. As a result, even when the pulsed noise voltage is applied to between the N-type silicon substrate 201 and the electrodes T1, T2, the N-type MOSFET 186 is operable, which allows further increase of the pulse noise withstand level. The ON-resistance of the N-type MOSFET 186 can be reduced by, for example, monotonically expanding the pattern size as shown in FIG. 24A. In that case, however, there are such demerits that the chip size is also increased and that the size of the drain diffusion region increases, which increases the current amplification factor Hfe of the parasitic transistor. Consequently, the structure of the N-type MOSFET 186 in the present embodiment is considered to be extremely effective.

Further, in the present embodiment, the channel region width of the N-type MOSFET 186 is set at 600 μm, though the effect of reducing the ON-resistance can be gained with the width of not less than 300 μm. The upper limit is not particularly set, but the width is limited by the chip size of a desired bidirectional photothyristor chip.

Eighteenth Embodiment

As described before, in addition to the issue that a displacement current flowing into the parasitic transistor formed on the MOSFETs 186, 188 causes malfunctions, the issues peculiar to the bidirectional photothyristor chip having zero crossing function include the issue that increasing the current amplification factor Hfe (npn) in the NPN transistors Q2, Q4 for achieving high-speed performance response deteriorates the noiseproof property. The present embodiment relates to a bidirectional photothyristor chip having zero crossing function which is capable of solving the two issues.

Figure 28:
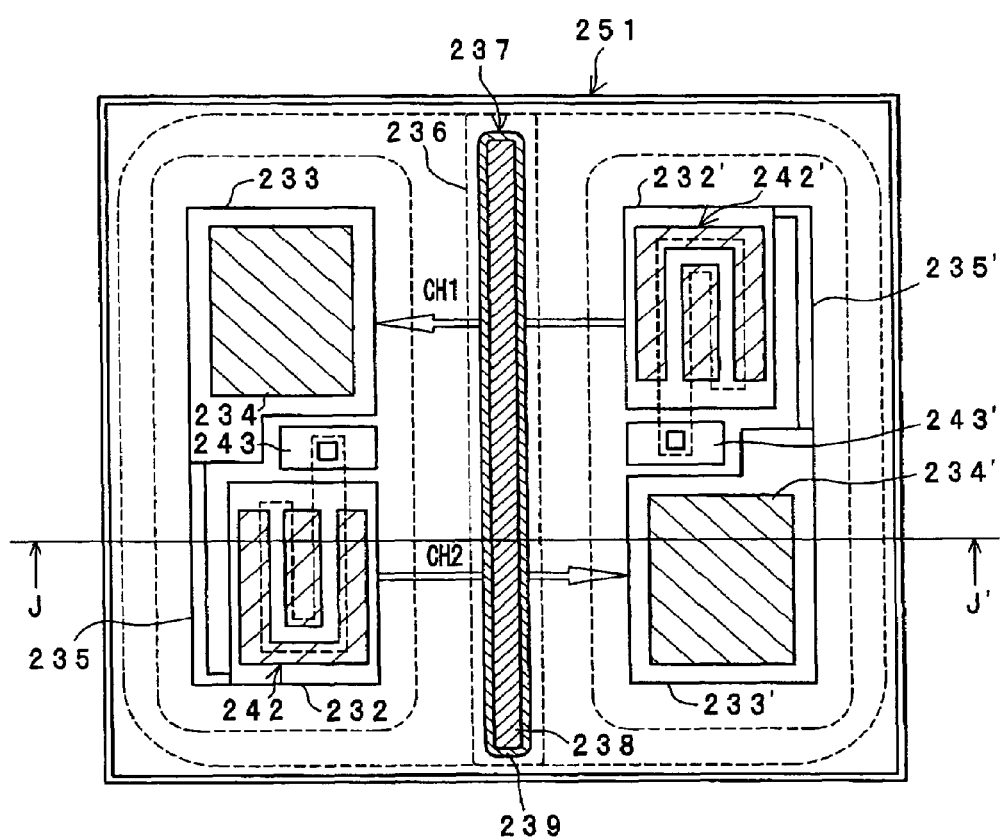
FIG. 28 is a pattern layout view showing a bidirectional photothyristor chip having zero crossing function with use of the N-type MOSFET shown in FIGS. 27A and 27B.
Figure 29:
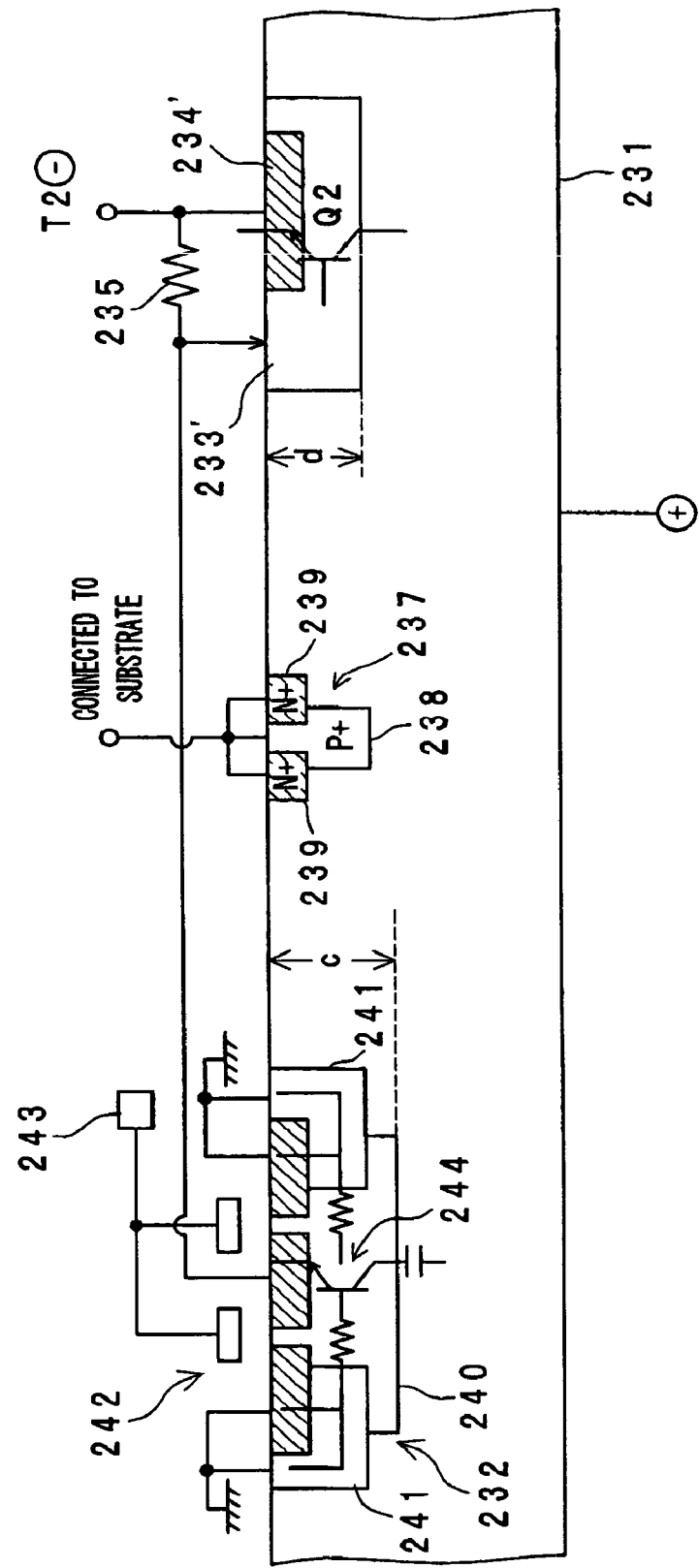
FIG. 29 is a cross sectional view taken along an arrow line J-J' in FIG. 28.
Figure 30:
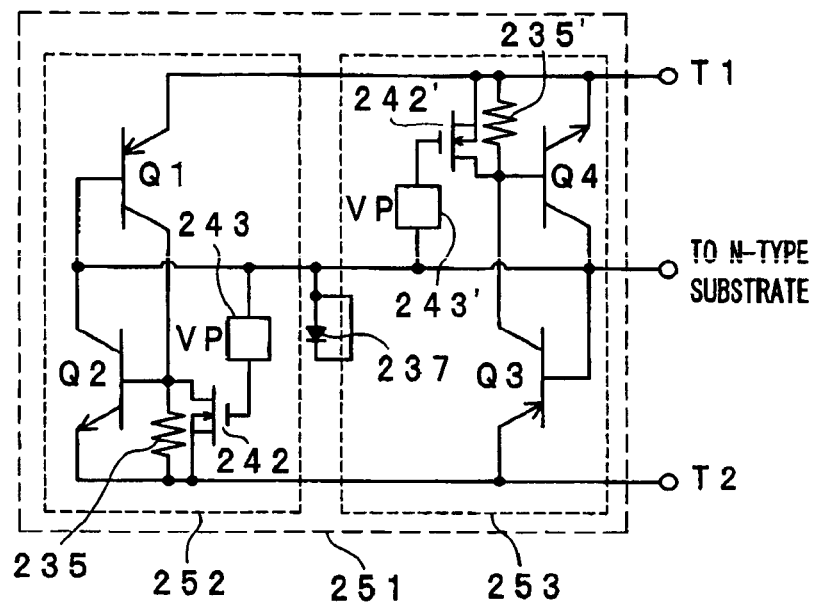
FIG. 30 is an equivalent circuit view showing the bidirectional photothyristor chip having zero crossing function shown in FIG. 28.

FIG. 28 is a pattern layout view showing the schematic structure of a bidirectional photothyristor chip of the present embodiment. FIG. 29 is a cross sectional view taken along an arrow line J-J' in FIG. 28. FIG. 30 is an equivalent circuit view showing the bidirectional photothyristor chip of the present embodiment.

An N-type silicon substrate 231, P-gate diffusion regions 233, 233' cathode diffusion regions 234, 234' and gate resistances 235, 235' in the bidirectional photothyristor chip 251 of the present embodiment are different in shape from but identical in function to the N-type silicon substrate 21, the P-gate diffusion regions 23, 23', the cathode diffusion regions 24, 24' and the gate resistances 25, 25' in the bidirectional photothyristor chip 31 in the first embodiment.

Moreover, a channel isolation region 236 is structured such that the passivation structure from the P-gate diffusion region 43 on the CH1 side to the P-gate diffusion region 43' on the CH2 side in the second embodiment shown in FIG. 4 extends across a photothyristor 252 of the CH1 and a photothyristor 253 of the CH2 over the entire width of the bidirectional photothyristor chip 251. Therefore, an oxygen doped semi-insulating polycrystalline silicon film doped with phosphorus and an Al electrode are formed over the entire width of the bidirectional photothyristor chip 251. Further, on the lower side of the channel isolation region 236 on the surface of the N-type silicon substrate 231, a short diode 237 in which a P-type diffusion region 238 and an N-type diffusion region 239 are short-circuited via an Al electrode (unshown) and the N-type silicon substrate 231 is formed. It is to be noted that in the cross sectional view of FIG. 29, the passivation structure including the channel isolation region 236 is omitted.

The anode diffusion regions 232, 232' are, as shown in FIG. 29, as with the case of the N-type MOSFET 186 in the seventeenth embodiment, composed of a P-well diffusion region 240 and a P+ compensation diffusion region 241. In this case, as with the case of the thirteenth embodiment, the depth c of the P-well diffusion region 240 is made 1.3 times as large as the depth d of the p-gate diffusion region 233' On the surface of the anode diffusion regions 232, 232', N-type MOSFETs 242, 242' for zero crossing which have the same structure as that of the N-type MOSFET 186 in the seventeenth embodiment are formed. Therefore, an influence of the current amplification factor Hfe in a parasitic transistor 244 generated in the N-type MOSFET 242 on the displacement current can be reduced, while the width of the channel regions in the N-type MOSFETs 242, 242' can be lengthened to decrease the ON-resistance, thereby making it possible to increase the pulse noise withstand level. It is to be noted that reference numerals 243, 243' denote VP circuits connected to the gate regions of the N-type MOSFETs 242, 242'.

In the meanwhile, as described before, achieving high-speed performance response by increasing the current amplification factor Hfe (npn) of the NPN transistors Q2, Q4 (i.e., increasing the luminous sensitivity) degrades the noise resistance property, as the noise resistance property is in the trade-off relation with the luminous sensitivity. Accordingly, for optimizing the noise resistance property and the luminous sensitivity (to increase the noise resistance property without degrading the luminous sensitivity), it is effective to fix the current amplification factor Hfe (npn) of the NPN transistors Q2, Q4 which exerts the largest influence on the noise resistance property at an appropriate value while decreasing the current amplification factor Hfe (pnp) of the PNP transistor Q1, Q3 and increasing the resistance value of the gate resistances 235, 235'.

Accordingly, in the present embodiment, the current amplification factor Hfe (pnp) of the PNP transistor Q1, Q3 is decreased as shown below. That is, in the present embodiment, the short diode 237 is formed over the entire width of the bidirectional photothyristor chip 251. Consequently, holes or minority carriers in the N-type silicon substrate 231 are absorbed in the P-type diffusion region 238 constituting the short diode 237 so that the lifetime of the holes is reduced. As a result, it becomes possible to reduce the current amplification factor Hfe (pnp) of the PNP transistor Q1, Q3 formed from the anode diffusion regions 232, 232', the N-type silicon substrate 231 and the P-gate diffusion regions 233, 233'.

More particularly, according to the present embodiment, a value of the current amplification factor Hfe (npn) of the NPN transistors Q2, Q4 which exerts the largest influence on the noise resistance property can be so set as to offer the desired noise resistance property, while the luminous sensitivity and the high-speed performance necessary for the bidirectional photothyristor having zero crossing function can be maintained. Further, an influence of the current amplification factor Hfe of the parasitic transistor 244 generated in the N-type MOSFET 242 on the displacement current can be reduced, while the ON-resistance of the N-type MOSFET 242 can be decreased so as to increase the pulse noise withstand level.

The solutions for the issues peculiar to the bidirectional photothyristor having zero crossing function in the thirteenth to eighteenth embodiment may be executed independently or may be executed in appropriate combination.

Figure 31:
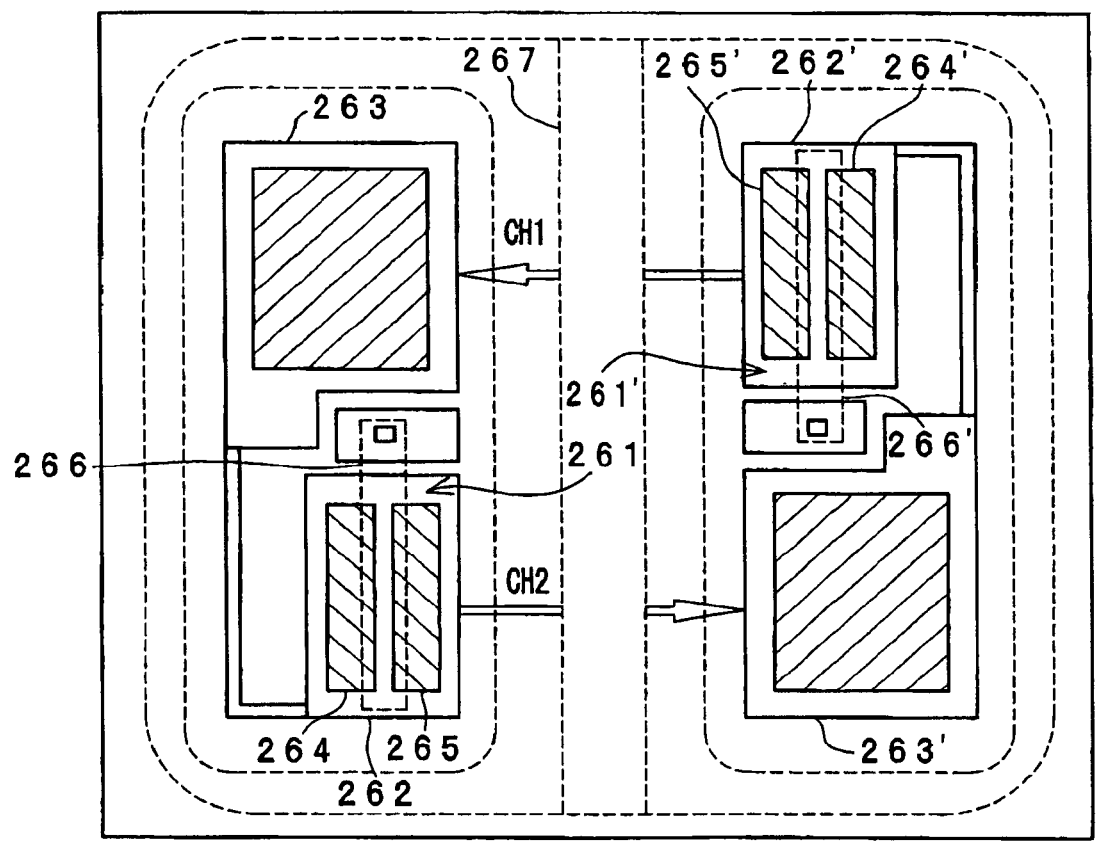
FIG. 31 is a pattern layout view showing a bidirectional photothyristor chip having zero crossing function with use of a normal N-type MOSFET.
Figure 32:
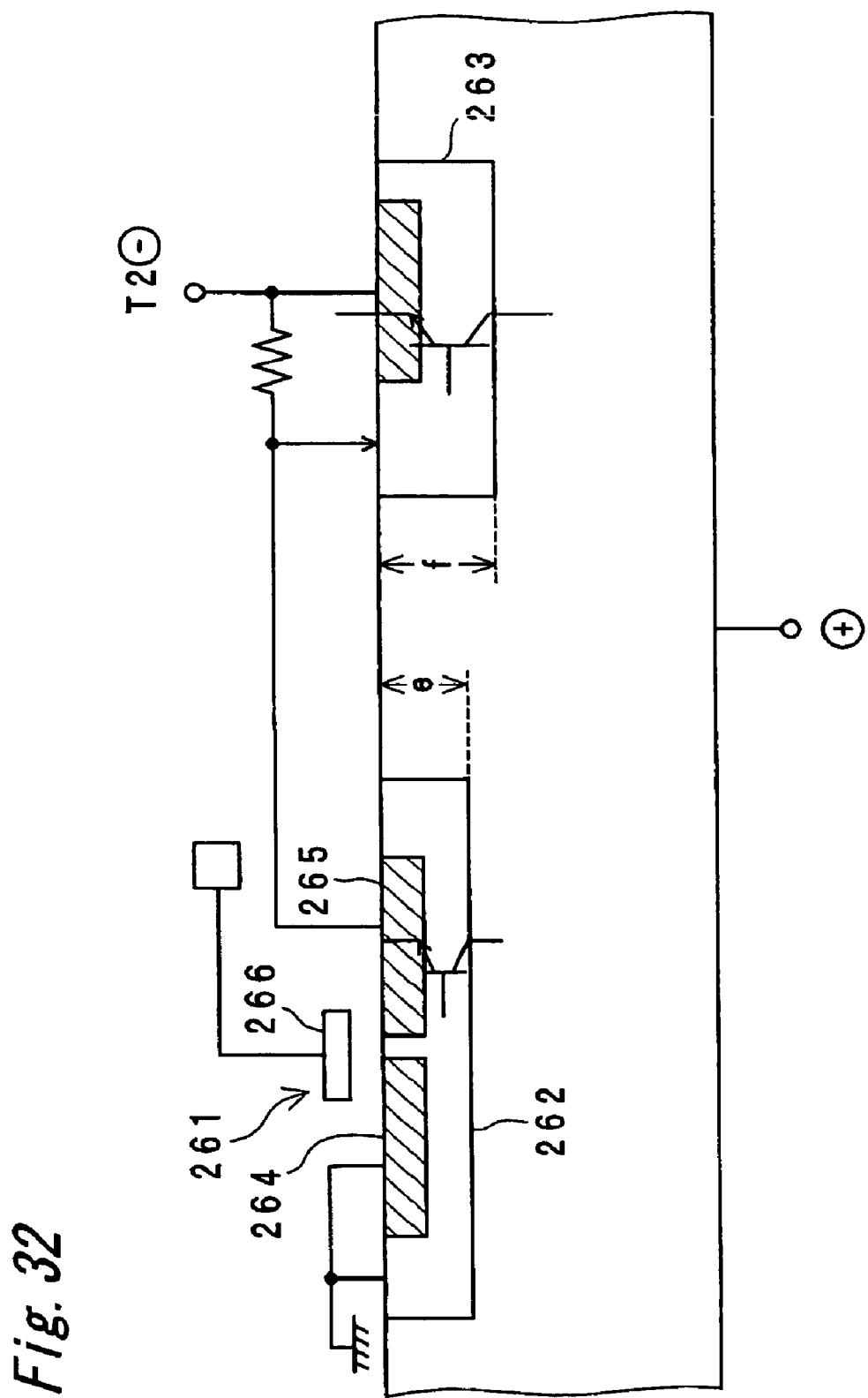
FIG. 32 is a cross sectional view of FIG. 31.

It is to be noted that in the thirteenth to eighteenth embodiments, description is given of the N-type MOSFET 186 different in structure from the normal N-type MOSFET. The "normal N-type MOSFET" herein refers to a N-type MOSFET 261, as its pattern layout is shown in FIG. 31 and as its cross section is shown in FIG. 32, in which the depth e of a P-well diffusion region 262 is smaller than the depth f of a P-gate diffusion region 263, an area of a source diffusion region 264 is almost equal to an area of a drain diffusion region 265, the source diffusion region 264 and a gate region 266 are linear-shaped, and a P+ compensation diffusion region is not formed around the P-well diffusion region 262. However, it should be understood that if a channel isolation region 267 having the structure as shown in the first embodiment to the twelfth embodiment is included in the normal N-type MOSFET, then use of the normal N-type MOSFET as shown in FIG. 31 and FIG. 32 falls within the scope of the bidirectional photothyristor chip 181 having zero crossing function shown in FIG. 18.

Figure 33:
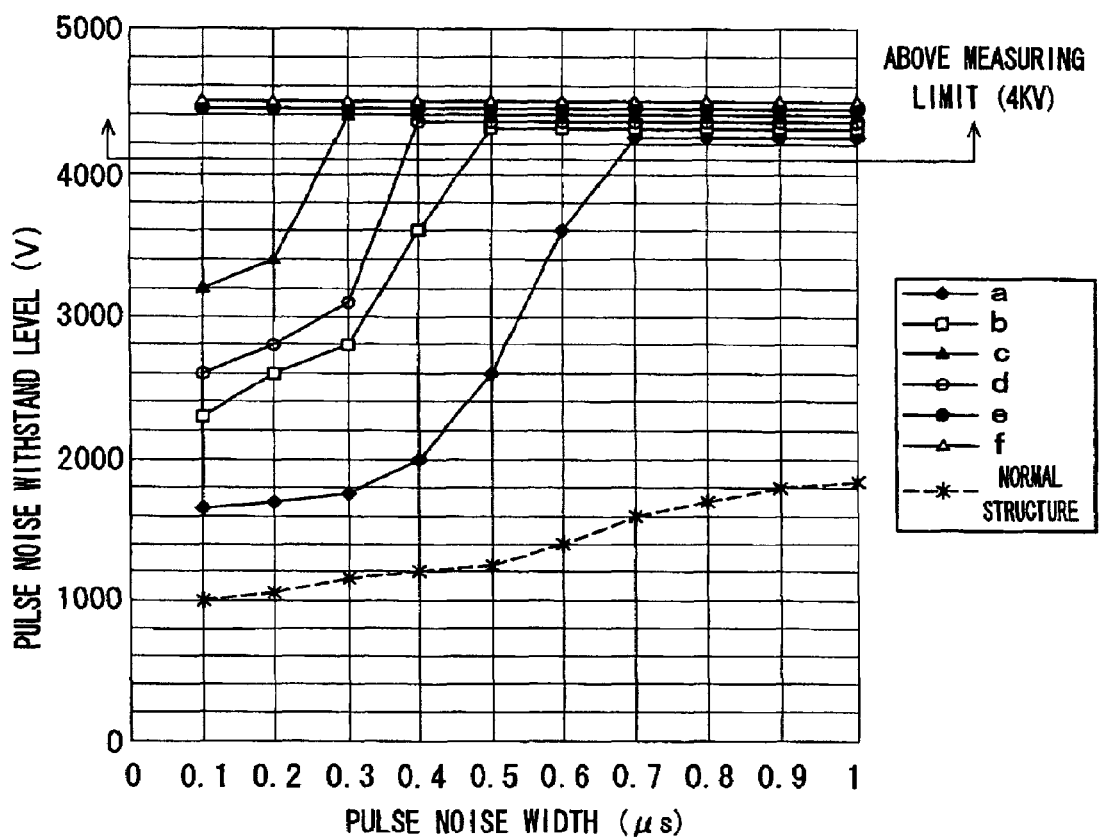
FIG. 33 is a view showing the relation between a pulse width of applied pulse noise and pulse noise withstand level.
Figure 34:
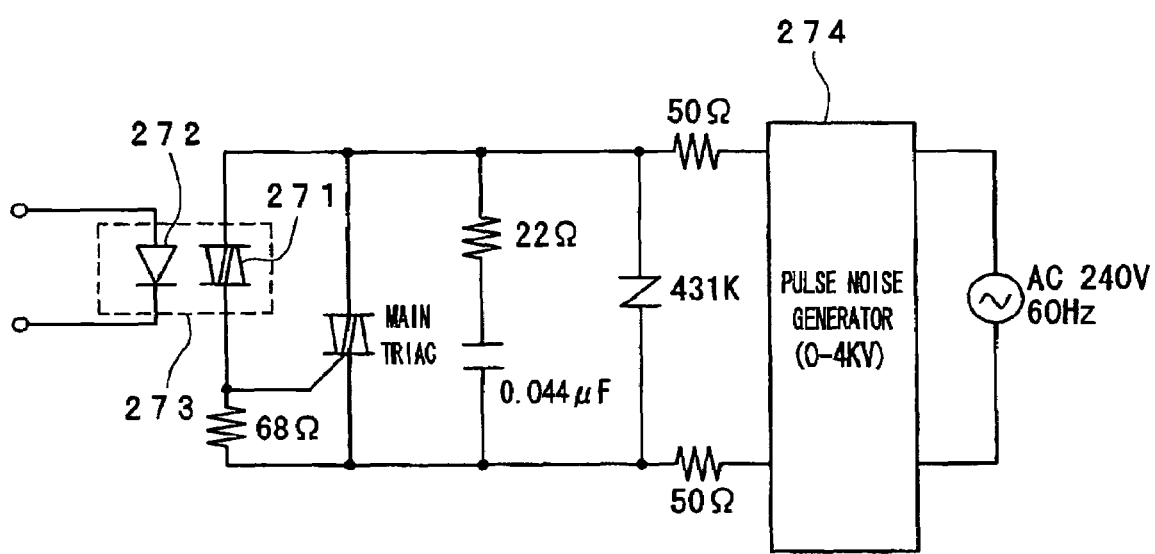
FIG. 34 is a view showing a pulse noise test circuit.

Description is now given of the pulse noise evaluation regarding SSRs employing the bidirectional photothyristor chip 181 having zero crossing function with use of the N-type MOSFET 186 having the structure shown in the thirteenth embodiment to the eighteenth embodiment, and a standard bidirectional photothyristor chip having zero crossing function with use of a normal N-type MOSFET having the structure shown in FIG. 31 and FIG. 32 (without the channel isolation region). FIG. 33 shows the pulse width and the withstand level (withstand voltage) of applied pulse noises. The evaluation was conducted with use of a pulse noise test circuit shown in FIG. 34. In FIG. 34, reference numeral 271 denotes any one of the bidirectional photothyristor chips employing total seven kinds of N-type MOSFET including the N-type MOSFET 186 having the structure shown in the thirteenth embodiment to the eighteenth embodiment and the normal N-type MOSFET. The bidirectional photothyristor chip 271 and an LED 272 were assembled into a light-triggered coupler 272, to which pulse noises having 10 states of the noise widths from 0.1 μsec. to 1 μsec. were applied with its voltage being changed from 0V to 4 KV, by which the maximum voltage value allowing normal operation was obtained. It is to be noted that the alphabetic characters in FIG. 33 represent embodiments, as the alphabetic characters "a to f" correspond to "Thirteenth Embodiment to Eighteenth Embodiment".

Table 2 shows the pulse noise withstand level (V) per noise width (μmsec.) regarding the bidirectional photothyristor chips having zero crossing function with use of the N-type MOSFET in each of the embodiments and the normal N-type MOSFET. It is to be noted that the measuring limit of the pulse noise voltage is 4 KV, and those above the measuring limit are expressed as appropriate values of not less than 4 KV for easy understanding of the graph in FIG. 33.

TABLE 2

| Pulse Width | a | b | c | d | e | f | Normal |
|---|---|---|---|---|---|---|---|
| 0.1 | 1650 | 2300 | 3200 | 2600 | 4000 or above | 4000 or above | 1000 |
| 0.2 | 1700 | 2600 | 3400 | 2800 | 4000 or above | 4000 or above | 1050 |
| 0.3 | 1750 | 2800 | 4000 or above | 3100 | 4000 or above | 4000 or above | 1150 |
| 0.4 | 2000 | 3600 | 4000 or above | 4000 or above | 4000 or above | 4000 or above | 1200 |
| 0.5 | 2600 | 4000 or above | 4000 or above | 4000 or above | 4000 or above | 4000 or above | 1200 |
| 0.6 | 3600 | 4000 or above | 4000 or above | 4000 or above | 4000 or above | 4000 or above | 1400 |
| 0.7 | 4000 or above | 4000 or above | 4000 or above | 4000 or above | 4000 or above | 4000 or above | 1600 |
| 0.8 | 4000 or above | 4000 or above | 4000 or above | 4000 or above | 4000 or above | 4000 or above | 1700 |
| 0.9 | 4000 or above | 4000 or above | 4000 or above | 4000 or above | 4000 or above | 4000 or above | 1800 |
| 1.0 | 4000 or above | 4000 or above | 4000 or above | 4000 or above | 4000 or above | 4000 or above | 1850 |

According to FIG. 33 and Table 2, when the pulse width is short, the pulse noise withstand level is low as a whole, whereas as the pulse width becomes longer, the pulse noise withstand level becomes higher. This is because the width of a gate voltage for driving the N-type MOSFET is short when the pulse width is short, resulting in insufficient operation response of the N-type MOSFET functioning as the overvoltage protection circuit (failure in correspondence to the pulse noise), whereas as the pulse width becomes longer, the operation response of the N-type MOSFET is improved.

Moreover, in the case of the bidirectional photothyristor chip having zero crossing function with use of the normal N-type MOSFET, the pulse noise withstand level is low in all the noise widths, and it is 1850V at the largest. In contrast with this, in the case of the bidirectional photothyristor chips having zero crossing function with use of the N-type MOSFETs 186 having the structure shown in the thirteenth embodiment to the eighteenth embodiment, the pulse withstand level is improved as a whole in response to the level of the effects based on the different in structure of the N-type MOSFETs. Even when the pulse width is short, the pulse noise withstand level higher than that in the case of using the normal N-type MOSFET is presented. Among these, in the case of the seventeenth embodiment and the eighteenth embodiment, the N-type MOSFET having the structure of the thirteenth embodiment to the sixteenth embodiment combined is used, and therefore the improvement of the effect is significant.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A bidirectional photothyristor chip being one semiconductor chip, comprising:
   a substrate of a first conductive type;
   a pair of photothyristor sections each of which is provided on a surface of the substrate of the first conductive type and each of which includes a first diffusion layer of a second conductive type, a second diffusion layer of the second conductive type and a third diffusion layer of the first conductive type formed in the second diffusion layer,
   wherein one of the pair of the photothyristor sections is disposed on one side of the semiconductor chip while the other of the pair of the photothyristor sections is disposed on the other side of the semiconductor chip;
   the first diffusion layer constituting part of the one photothyristor section is opposed to the second diffusion layer and the third diffusion layer constituting part of the other photothyristor section;
   the first diffusion layer constituting part of the other photothyristor section is opposed to the second diffusion layer and the third diffusion layer constituting part of the one photothyristor section;
   two separate carrier channels are provided between the first diffusion layers and the second diffusion layers of the photothyristor sections respectively; and
   a carrier movement suppression region for suppressing carriers from moving is formed between two of the second diffusion layers, and
   wherein the first conductive type is one out of N type and P type;
   the second conductive type is the other out of N type and P type;
   in each of the photothyristor sections, a gate resistance and a switching element are connected in parallel in between a base and an emitter electrode of an NPN transistor made up of the third diffusion layer, the second diffusion layer and the substrate, or the first diffusion layer, the substrate and the second diffusion layer; and
   a control terminal of the switching element is connected to a base of the PNP transistor made up of the third diffusion layer, the second diffusion layer and the substrate, or the first diffusion layer, the substrate and the second diffusion layer.

2. The bidirectional photothyristor chip as defined in claim 1, wherein the switching element is a metal-oxide semiconductor field-effect transistor,
   the metal-oxide semiconductor field-effect transistor is formed in a well of the second conductive type formed on the surface of the substrate, and
   a diffusion depth of the well is larger than a diffusion depth of the second diffusion layer.

3. The bidirectional photothyristor chip as defined in claim 2, wherein the diffusion depth of the well is not less than one time and not more than 1.3 times as large as the diffusion depth of the second diffusion layer.

4. The bidirectional photothyristor chip as defined in claim 2, wherein a channel width in the metal-oxide semiconductor field-effect transistor in a direction perpendicular to current flow is not less than 300 μm.

5. The bidirectional photothyristor chip as defined in claim 2, wherein
   a carrier absorption diode is formed on the surface of the substrate in such a way as to intersect with the two channels.

6. The bidirectional photothyristor chip as defined in claim 1, wherein the switching element is a metal-oxide semiconductor field-effect transistor,
   the metal-oxide semiconductor field-effect transistor is formed in a well of the second conductive type formed on the surface of the substrate, and
   an area of a drain diffusion region formed in the well in the metal-oxide semiconductor field-effect transistor is smaller than an area of a source diffusion region formed in the well.

7. The bidirectional photothyristor chip as defined in claim 6, wherein
   the drain diffusion region is formed in a surface side of the well, and
   the source diffusion region is formed in the surface side of the well in such a way as to surround the drain diffusion region.

8. The bidirectional photothyristor chip as defined in claim 6, wherein a channel width in the metal-oxide semiconductor field-effect transistor in a direction perpendicular to current flow is not less than 300 μm.

9. The bidirectional photothyristor chip as defined in claim 6, wherein
   a carrier absorption diode is formed on the surface of the substrate in such a way as to intersect with the two channels.

10. The bidirectional photothyristor chip as defined in claim 1, wherein
    the switching element is a metal-oxide semiconductor field-effect transistor,
    at least a part of the metal-oxide semiconductor field-effect transistor is formed in a well of the second conductive type formed on the surface of the substrate,
    a heavily-doped compensation diffusion layer of the second conductive type coming into a close contact with the well and having a dopant diffusion concentration level heavier than a dopant diffusion concentration level in the well is formed around the well on the surface of the substrate, and a region of the metal-oxide semiconductor field-effect transistor, which is not formed in the well, is formed in the heavily-doped compensation diffusion layer.

11. The bidirectional photothyristor chip as defined in claim 10, wherein the dopant diffusion concentration level in the heavily-doped compensation diffusion layer is not less than $1 \times 10^{17}$ cm$^{-3}$.

12. The bidirectional photothyristor chip as defined in claim 10, wherein the source diffusion region in the metal-oxide semiconductor field-effect transistor is formed in the well, and one side portion of the drain diffusion region in the metal-oxide semiconductor field-effect transistor opposed to the source diffusion region is formed in the well, whereas a remaining region thereof is formed in the heavily-doped compensation diffusion layer.

13. The bidirectional photothyristor chip as defined in claim 12, wherein a channel-direction length of the one side portion of the drain diffusion region or the source diffusion region formed in the well is more than 0 μm and not more than 10 μm.

14. The bidirectional photothyristor chip as defined in claim 10, wherein the drain diffusion region in the metal-oxide semiconductor field-effect transistor is formed in the well, and one side portion of the source diffusion region in the metal-oxide semiconductor field-effect transistor opposed to the drain diffusion region is formed in the well, whereas a remaining region thereof is formed in the heavily-doped compensation diffusion layer.

15. The bidirectional photothyristor chip as defined in claim 14, wherein a channel-direction length of the one side portion of the drain diffusion region or the source diffusion region formed in the well is more than 0 μm and not more than 10 μm.

16. The bidirectional photothyristor chip as defined in claim 10, wherein a channel width in the metal-oxide semiconductor field-effect transistor in a direction perpendicular to current flow is not less than 300 μm.

17. The bidirectional photothyristor chip as defined in claim 10, wherein a carrier absorption diode is formed on the surface of the substrate in such a way as to intersect with the two channels.

18. A bidirectional photothyristor chip being one semiconductor chip, comprising:

a substrate of a first conductive type;

pair of photothyristor sections each of which is provided on a surface of the substrate of the first conductive type and each of which includes a first diffusion layer of a second conductive type, a second diffusion layer of the second conductive type and a third diffusion layer of the first conductive type formed in the second diffusion layer, wherein one of the pair of the photothyristor sections is disposed on one side of the semiconductor chip while the other of the pair of the photothyristor sections is disposed on the other side of the semiconductor chip;

the first diffusion layer constituting part of the one photothyristor section is opposed to the second diffusion layer and the third diffusion layer constituting part of the other photothyristor section;

the first diffusion layer constituting part of the other photothyristor is opposed to the second diffusion layer and the third diffusion layer constituting part of the one photothyristor section;

two separate carrier channels are provided between the first diffusion layers and the second diffusion layers of the photothyristor sections respectively; and an oxygen doped semi-insulating polycrystalline silicon film doped with phosphorus for suppressing carriers from moving is formed on the substrate and in a vicinity of junctions between the two first diffusion layers and the substrate and in a vicinity of junctions of the two second diffusion layers constituting part of the pair of the photothyristor sections and the substrate in such a way as to intersect with the channels, and wherein the first conductive type is one out of N type and P type;

the second conductive type is the other out of N type and P type;

in each of the photothyristor sections, a gate resistance and a switching element are connected in parallel in between a base and an emitter electrode of an NPN transistor made up of the third diffusion region, the second diffusion region and the substrate, or the first diffusion region, the substrate and the second diffusion region; and a control terminal of the switching element is connected to a base of the PNP transistor made up of the third diffusion region, the second diffusion region and the substrate, or the first diffusion region, the substrate and the second diffusion region.

19. The bidirectional photothyristor chip as defined in claim 18, wherein the switching element is a metal-oxide semiconductor field-effect transistor, the metal-oxide semiconductor field-effect transistor is formed in a well of the second conductive type formed on the surface of the substrate, and a diffusion depth of the well is larger than a diffusion depth of the second diffusion layer.

20. The bidirectional photothyristor chip as defined in claim 19, wherein the diffusion depth of the well is not less than one time and not more than 1.3 times as large as the diffusion depth of the second diffusion layer.

21. The bidirectional photothyristor chip as defined in claim 19, wherein a channel width in the metal-oxide semiconductor field-effect transistor is not less than 300 μm.

22. The bidirectional photothyristor chip as defined in claim 19, wherein a carrier absorption diode is formed on the surface of the substrate in such a way as to intersect with the two channels.

23. The bidirectional photothyristor chip as defined in claim 18, wherein the switching element is a metal-oxide semiconductor field-effect transistor, the metal-oxide semiconductor field-effect transistor is formed in a well of the second conductive type formed on the surface of the substrate, and an area of a drain diffusion region formed in the well in the metal-oxide semiconductor field-effect transistor is smaller than an area of a source diffusion region formed in the well.

24. The bidirectional photothyristor chip as defined in claim 23, wherein
the drain diffusion region is formed in a surface side of the well, and
the source diffusion region is formed in the surface side of the well in such a way as to surround the drain diffusion region.

25. The bidirectional photothyristor chip as defined in claim 24, wherein
a channel width in the metal-oxide semiconductor field-effect transistor is not less than 300 μm.

26. The bidirectional photothyristor chip as defined in claim 23, wherein
a channel width in the metal-oxide semiconductor field-effect transistor is not less than 300 μm.

27. The bidirectional photothyristor chip as defined in claim 23, wherein
a carrier absorption diode is formed on the surface of the substrate in such a way as to intersect with the two channels.

28. The bidirectional photothyristor chip as defined in claim 18, wherein
the switching element is a metal-oxide semiconductor field-effect transistor,
at least a part of the metal-oxide semiconductor field-effect transistor is formed in a well of the second conductive type formed on the surface of the substrate,
a heavily-doped compensation diffusion layer of the second conductive type coming into a close contact with the well and having a dopant diffusion concentration level heavier than a dopant diffusion concentration level in the well is formed around the well on the surface of the substrate, and
a region of the metal-oxide semiconductor field-effect transistor, which is not formed in the well, is formed in the heavily-doped compensation diffusion layer.

29. The bidirectional photothyristor chip as defined in claim 28, wherein
the dopant diffusion concentration level in the heavily-doped compensation diffusion layer is not less than $1 \times 10^{17}$ cm$^{-3}$.

30. The bidirectional photothyristor chip as defined in claim 28, wherein
the source diffusion region in the metal-oxide semiconductor field-effect transistor is formed in the well, and
one side portion of the drain diffusion region in the metal-oxide semiconductor field-effect transistor opposed to the source diffusion region is formed in the well, whereas a remaining region thereof is formed in the heavily-doped compensation diffusion layer.

31. The bidirectional photothyristor chip as defined in claim 30, wherein
a channel-direction length of the one side portion of the drain diffusion region or the source diffusion region formed in the well is more than 0 μm and not more than 10 μm.

32. The bidirectional photothyristor chip as defined in claim 28, wherein
the drain diffusion region in the metal-oxide semiconductor field-effect transistor is formed in the well, and
one side portion of the source diffusion region in the metal-oxide semiconductor field-effect transistor opposed to the drain diffusion region is formed in the well, whereas a remaining region thereof is formed in the heavily-doped compensation diffusion layer.

33. The bidirectional photothyristor chip as defined in claim 32, wherein
a channel-direction length of the one side portion of the drain diffusion region or the source diffusion region formed in the well is more than 0 μm and not more than 10 μm.

34. The bidirectional photothyristor chip as defined in claim 28, wherein
a carrier absorption diode is formed on the surface of the substrate in such a way as to intersect with the two channels.

* * * * *